United States Patent [19]

Noble

[11] Patent Number: 5,392,222

[45] Date of Patent: Feb. 21, 1995

[54] LOCATING A FIELD OF VIEW IN WHICH SELECTED IC CONDUCTORS ARE UNOBSCURED

[75] Inventor: Alan C. Noble, Santa Cruz, Calif.

[73] Assignee: Schlumberger Technologies Inc., San Jose, Calif.

[21] Appl. No.: 816,639

[22] Filed: Dec. 30, 1991

[51] Int. Cl.$^6$ .................. G01R 31/28; H01J 37/26
[52] U.S. Cl. .................... 364/490; 364/489; 364/491
[58] Field of Search ............ 364/488, 489, 490, 491; 250/492.1, 492.2, 492.3; 324/158 F, 158 R

[56] References Cited

U.S. PATENT DOCUMENTS

| | | | |
|---|---|---|---|
| 4,618,938 | 10/1986 | Sandland et al. | 364/552 |
| 4,706,019 | 11/1987 | Richardson | 324/158 R |
| 4,721,909 | 1/1988 | Richardson | 324/158 R |
| 4,837,447 | 6/1989 | Pierce et al. | 250/492.2 |
| 4,895,780 | 1/1990 | Nissan-Cohen et al. | 364/474.24 |
| 5,065,092 | 11/1991 | Sigler . | |
| 5,198,986 | 3/1993 | Ikeda et al. | 364/489 |
| 5,251,140 | 10/1993 | Chung et al. | 364/474.02 |

OTHER PUBLICATIONS

S. Concina et al., *Software Integration in a Workstation Based E-Beam Tester*, International Test Conference Proceedings (1986).

N. Richardson, *E-Beam Probing for VLSI Circuit Debug*, VLSI Systems Design (1987).

S. Concina et al., *IDS 5000: an Integrated Diagnosis System for VLSI*, 7 Microelectronic Engineering (1987). IDS 5000 Integrated Diagnostic System, brochure of Schlumberger Technologies, Inc. (1988).

A. Noble, *A Diagnostic Assistant for Integrated Circuit Diagnosis*, Microelectronic Engineering, vol. 16, pp. 95–102 (1992), Third European Conference on Electron Beam Testing of Integrated Circuits, Como, Italy, 9–11 Sep. 1991.

P. Garino et al., *Automatic Selection of Optimal Probing Points for E-Beam Measurements*, Microelectronic Engineering, vol. 16, pp. 111–120 (1992), Third European Conference on Electron Beam Testing of Integrated Circuits, Como, Italy, 9–11 Sep. 1991.

F. Stentiford et al., *Automatic Registration of Scanning Electron Microscope Images*, Microelectronic Engineering, vol. 7, pp. 215–221 (1987), First European Conference on Electron Beam Testing of Integrated Circuits, Grenoble, France, 9–11 Dec. 1987.

A. Hu et al., *New Approach to Integrate LSI Design Databases with E-Beam Tester*, Proceedings International Test Conference 1990, Washington, D.C., USA, 10–14 Sep. 1990, pp. 1040–1048.

D. Kuan et al., *Natural Decomposition of Free Space for Path Planning*, IEEE International Conference on Robotics and Automation, St. Louis, Mo., USA, 25–28 Mar. 1985, pp. 168–173.

*Primary Examiner*—Kevin J. Teska
*Assistant Examiner*—Stephen J. Walder, Jr.
*Attorney, Agent, or Firm*—Kenneth Olsen; Keith G. W. Smith; Bruce D. Riter

[57] ABSTRACT

Methods and apparatus are disclosed for positioning the field of view in a system for IC probing or repair, where the system comprises means for supporting an IC device having multiple physical layers and multiple internal nets, and controllable positioning means for positioning the field of view relative to the device. A data set is prepared which describes each physical layer of the device as a plurality of reduced polygons. Each of the reduced polygons is associated with a physical layer of the device and with at least one net of the device. For each of a plurality of selected nets, polygons associated with the net are dilated to define the periphery of a region encompassed by the field of view when a point within the field of view is traced around the periphery of a reduced polygon. A bit plane of the dilated polygons is mapped for each net, and regions of overlap the mapped bit planes are identified. The positioning means is controlled to position the field of view relative to the device at a location which corresponds to at least one overlap region.

39 Claims, 22 Drawing Sheets

|  | 1910<br>0 | 1912<br>4(B) | 1914<br>0 |
|---|---|---|---|
|  | 1916<br>8(A) | 1918<br>12(A+B) | 1920<br>8(A) |
|  | 10(A+C) | 1922 14(A+B+C) 1924 | |
|  | 2(C) | 1926 1928<br>6(B+C) | 1930<br>4(B) |
|  | | 1932 7(B+C+D) 1934 | 1936<br>5(B+D) |
|  | 1938<br>1(D) | 3(C+D) | 1940<br>1(D) |
|  | 1942<br>0 | 1944<br>2(C) | 1946<br>0 |

FIG. 19

| Decimal Value of Binary "Word" (Ordered Strategy) | Binary "Word" | Number of Nets (Unordered Strategy) |
|---|---|---|
| 0 | 0000 | 0 |
| 1 | 0001 | 1 |
| 2 | 0010 | 1 |
| 3 | 0011 | 2 |
| 4 | 0100 | 1 |
| 5 | 0101 | 2 |
| 6 | 0110 | 2 |
| 7 | 0111 | 3 |
| 8 | 1000 | 1 |
| 9 | 1001 | 2 |
| 10 | 1010 | 2 |
| 11 | 1011 | 3 |
| 12 | 1100 | 2 |
| 13 | 1101 | 3 |
| 14 | 1110 | 3 |
| 15 | 1111 | 4 |

FIG. 20

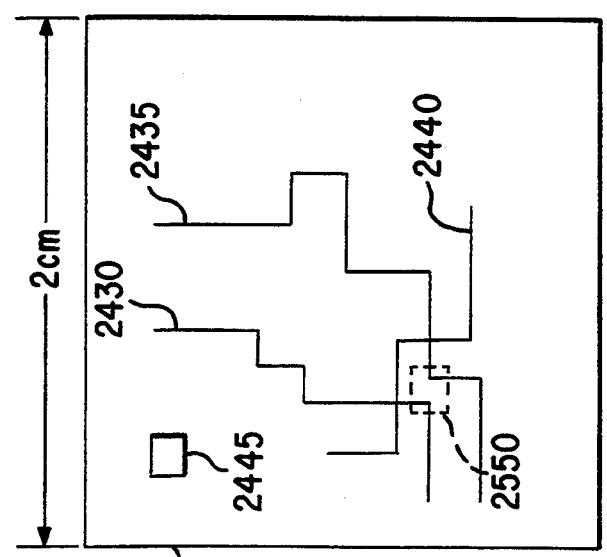
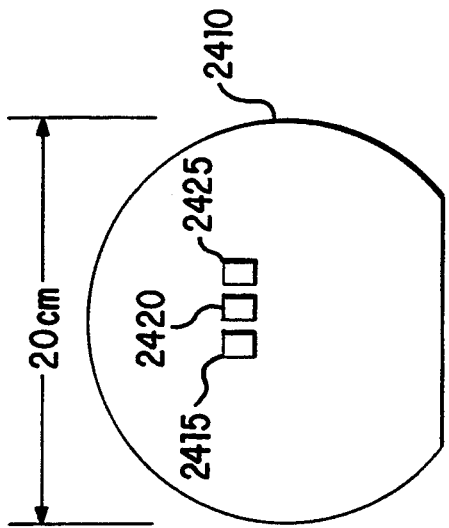
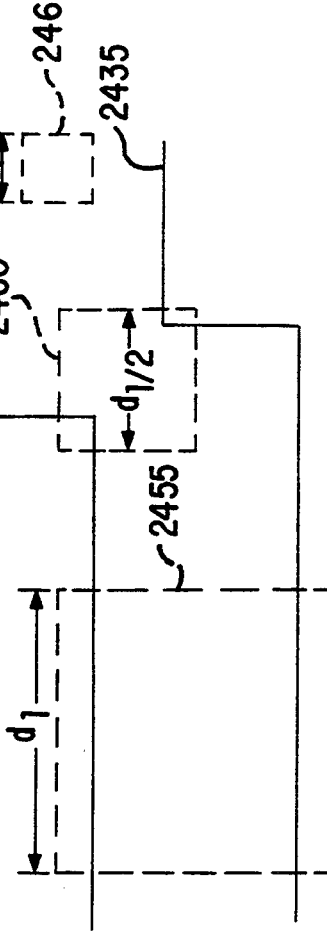
FIG. 24A
FIG. 24B
FIG. 24C

LOCATING A FIELD OF VIEW IN WHICH SELECTED IC CONDUCTORS ARE UNOBSCURED

BACKGROUND OF THE INVENTION

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

1. Field of the Invention

The present invention relates to methods and apparatus useful, for example, in analyzing and/or repairing Very Large Scale Integrated (VLSI) circuit devices. In particular, the present invention relates to locating a field of view such that selected conductors of an integrated circuit (IC) device may be accessed for probing, for measurement, for modification, or for other purposes, without changing the field of view.

2. The Prior Art

Linking Schematic, Layout and Actual Images

Integrated circuits are manufactured by applying a series of masks to build up multiple layers from which semiconductor devices are constructed. The layout data (the data defining the masks and from which the layout image display is produced) is represented as a stored data file describing polygons, each polygon associated with a characteristic physical layer of the IC. The schematic data (the data defining the circuit schematic) is represented as a data file describing net connectivity and, optionally, graphical information. Each net in the schematic is assigned a unique net identification number.

In the Schlumberger IDS systems discussed in more detail below, the layout data is indexed by net identification number so that the "pieces" (polygons) of layout data corresponding to each net of an IC device can be displayed individually (superposed on the overall layout image by highlighting) on display screen. Thus, each net of the schematic is associated with a set of polygons in the layout CAD data base. The polygons for a given net may span several layers. Layout data is linked in the IDS systems to schematic data by assigning to each layout polygon of a particular net the same net identification number. The net identification number, also called a Traversal ID or "TID", is derived by counting nets in the netlist by traversing from the top cell of the netlist in a depth-first fashion. The prior-art "linking" task is performed in the IDS 5000 system as a pre-processing operation on the computer-aided design (CAD) data file of the IC device before using the electron-beam to probe the IC device. The pre-processing operation in the IDS systems generates a set of index files which permit rapid accessing of nets and elements: Nodeindex, Polyindex, Multyindex, and Netindex. The Nodeindex file contains a Traversal ID to Layout Net Number index. The Polyindex file contains a Polygon Number to Layout Net Number index. Where a polygon contains more than one net (e.g., in special or device layers), the Polyindex entry refers to the Multyindex file which contains the Layout Net Numbers for polygons containing multiple nets. The Netindex file contains the Layout Net Number to layout data and Traversal ID index, and includes a count of the total number of nets and elements, a count of the total number of nets, and a net structure record for each Layout Net Number.

IC Probing—Locating IC Conductors for Observation within a Field of View

Characterizing and verifying the operation of VLSI circuit devices is an important element of their design. Probing internal nodes of such devices plays an increasingly significant role in this process. In recent years, electron-beam (E-beam) probing has become the preferred technique for diagnosing VLSI circuit devices.

An E-beam prober can be used to safely examine circuits having sub-micron geometric features which are too small and too densely-packed for mechanical probers. E-beam probing uses the principle of voltage contrast in a scanning electron microscope (SEM) to perform VLSI diagnosis through non-contact electron-beam measurement of internal signals in a VLSI device. Commercial introduction by Schlumberger in 1987 of the "IDS 5000 TM" workstation-based, electron-beam test probe system greatly simplified E-beam probing of circuit chips and increased the efficiency of circuit debug. Other such systems introduced commercially by Schlumberger are the "IDS 5000plus TM" and "IDS 3000 TM" systems. See S. Concina, G. Liu, L. Lattanzi, S. Reyfman & N. Richardson, Software Integration in a Workstation Based E-Beam Tester, INTERNATIONAL TEST CONFERENCE PROCEEDINGS (1986); N. Richardson, E-Beam Probing for VLSI Circuit Debug, VLSI SYSTEMS DESIGN (1987); S. Concina & N. Richardson IDS 5000: an Integrated Diagnosis System for VLSI, 7 MICROELECTRONIC ENGINEERING (1987); and see U.S. Pat. Nos. 4,706,019 and 4,721,909 to N. Richardson, which are incorporated herein by reference.

FIG. 1 is a block diagram of such a prior-art electron-beam test probe system 110. System 110 has three main functional elements: an electron beam test probe 112, a circuit exerciser 114, and a data processing system 116 which includes a display terminal 118. The circuit exerciser 114 may be a conventional integrated circuit tester, such as a model "S 15 TM" tester (available from Schlumberger Technologies of San Jose, Calif.) which can repeatedly apply a pattern of test vectors to the specimen circuit over a bus 124. The specimen circuit (device under test, or DUT) 126 is placed in a vacuum chamber 128 of the electron-beam test probe 112 so that potential measurements can be made as the test vector pattern is applied. The points at which such measurements are to be made are sent to the electron-beam test probe 112 by the data processing system 116 over a bus 122. The data processing system 116 may also be used to specify the test signal pattern used and the timing of the potential measurements relative to the test signal pattern. The electron beam test probe system is controlled by an operator who inputs commands through the display terminal 118.

FIG. 2 shows a more detailed schematic view of portions of test probe 112. Mounted to a surface 225 are a controllable stage 226 which supports DUT 126, a probe card 228, and an electron-beam column assembly 229. A wafer containing DUT 126 is mounted on stage 226. Stage 226 is used to position DUT 126 with respect to probe card 228. Probe card 228 receives power and test signals over a bus 224, and couples the power and test signals to the DUT by means of mechanical probes such as probe 235. The DUT may be moved in relation to the probe card 228 by controlling one or more of stage positioning means 231, 232, 233 and 234. The electron beam column generates an electron beam generally along an axis 236. The electron beam may be turned on and off by the application of potentials to blanking electrodes 238. The blanking electrodes 238 receive the potentials under control of data processing system 116 on bus 222.

The point at which the electron beam strikes the DUT is controlled by positioning means 240 and beam deflecting means 241, both of which are controllable by signals received from data processing system 116 over bus 222. Positioning means 240 is a stage used to define the field of view of the electron beam column by positioning electron beam column 229 relative to surface 225. Deflecting means 241 comprises a pair of deflection coils which allow the electron beam to be aimed at any point on the DUT which is within the field of view. Such probers have dramatically reduced the time required to design and analyze VLSI circuits, by making it possible to measure the internal signals of an Integrated Circuit (IC) in a similar way that an oscilloscope is used to measure the internal signals of a printed circuit board (PCB). They combine in a single powerful workstation the display of a schematic circuit diagram, layout mask data, and a live scanning electron microscope (SEM) image of the chip, along with analog and-/or digital waveforms.

The SEM, layout and schematic displays in the prior-art IDS 5000 system are linked together to facilitate navigation around the IC chip. For example, when the user pans (moves laterally) or zooms (changes magnification of) one of the linked displays, the others pan or zoom accordingly. And, when the user places a probe icon at a point on one of the linked displays, expected waveforms and actual measured waveforms at that point may be displayed for comparison.

The SEM image is related to the layout image much as an aerial view is related to a topographic or relief map of the same terrain. That is, if the SEM image is the "aerial view" of the chip, the layout image is the "topographic map." A qualitative difference is the causality; the topographical map was likely made from the aerial view, whereas the IC chip was manufactured according to the layout masks. The layout display is also linked to the schematic display in the prior-art IDS 5000 system.

FIG. 3 illustrates an example of linked schematic, layout, and SEM images. Schematic image 310 represents a portion of the circuit embodied in the DUT. Layout image 320 represents approximately the same portion of the circuit as is displayed in schematic image 310. SEM image 330 represents approximately the same portion of the circuit as is displayed in layout image 320. Examination of layout image 320 and SEM image 330 indicates a close correlation between the displayed circuit features. The images were produced with an IDS 5000 system with the magnification set to produce a relatively wide field of view. It is noted that the conventional IDS 5000 system displays layout images in multiple colors to provide the user with additional information such as the layer or net to which a particular displayed feature belongs.

Typically, a circuit designer wishing to analyze or characterize the operation of a DUT will move the e-beam probe from point to point on the DUT to obtain waveforms on various nets for comparison with expected waveforms. This is done by moving a "probe" icon on the display screen, which causes the electron beam to be repositioned by computer control of stage 240 and/or deflection coils 241. Movement of the e-beam by means of deflection coils 241 is almost instantaneous, allowing rapid probing of successive points within a limited field of view. Movement of the e-beam beyond this field of view requires physical displacement of stage 241 and entails a noticeable delay.

Attention is again directed to FIG. 3. Superposed on layout image 320 and SEM image 330, respectively, are boxes representing a layout window 340 and a SEM window 350 which delimit the field of view of the probe for a given stage position at an increased level of magnification. That is, as the field of view is zoomed in and out in response to commands from the user, the displayed images zoom in and out correspondingly. Layout window 340 and SEM window 350 match each other closely once the images have been linked; that is, they represent approximately the same field of view of the circuit.

The actual measurement point of the probe can be placed anywhere within the field of view. Accurate probe placement can only be assured if the SEM/layout magnification is fairly large, which limits the size of the field of view during probing. When conducting probing operations with the current IDS 5000 system, the field of view is typically a square with dimensions on the order of 50 $\mu$m on a side. The dimensions of a state-of;the-art VLSI circuit are typically more than 3 orders of magnitude greater than this (e.g., 1 cm on a side). The number of possible window locations is thus exceedingly large (greater than 1 million).

Thus, even with such electron-beam probe systems, diagnosis of VLSI circuit devices becomes more and more difficult and time-consuming with shrinking device geometries and increasingly complex designs.

Other IC probing and imaging systems are also known. These include probing systems in which a mechanical probe is placed in contact with a conductor of an IC within an optical field of view, and laser optical systems in which a laser beam is positioned within a field of view for IC observation.

IC Repair—Minimizing Distances between Conductors when adding Connections

Ion beams can also be used to image IC devices under vacuum by means of the voltage contrast phenomenon, much like electron beams. Systems employing ion beams are commonly referred to as Focused Ion Beam (FIB) systems, the Schlumberger "IDS 7000 FIB Station TM" being one such example. A focused ion beam can also be used to cut away, or mill, IC conductors. This is achieved by directing the focused ion beam on the same spot for an extended period of time so that a conductor is eroded by the impacting ions. Further, by injecting vaporized metals such as platinum into the vacuum chamber, it is possible to accomplish exactly the opposite effect, namely deposition. This is achieved when impacting ions fuse the injected metal onto the IC surface. It is therefore possible to repair IC devices through either ion-beam cutting or deposition or a combination of both.

A common task performed on FIB systems is to connect two or more conductors to overcome open-circuits, or effect other electrical modifications to the circuit. The first step is to locate where the conductors physically exist in close proximity, so that the shortest possible connection can be made. For today's extremely large, complex IC devices, this is extremely difficult.

Locating a Single Conductor

When only one conductor is to be located within a field of view (e.g., for SEM probing), it is sufficient to examine only the layout polygons comprising the corresponding net in order to select a suitable place to locate the focus point. The field of view can then be centered on the selected focus point. In the standard IDS systems, an algorithm locates the portion of the selected net which lies closest to the current stage position. More sophisticated focus point placement for a single net has been implemented on an IDS 5000 system in a program called findnet, in which the following three rules are applied in selecting a place to locate the probe on a selected net:

- Locate a corner of the net, since corners are often more in the open and therefore less susceptible to crosstalk.
- Identify polygons lying in the topmost layer of the net (highest layer, closest to the electron-beam column), since the signal-to-noise ratio of acquired waveforms generally improves with layer height.
- Determine the widest part of the net. If a wide enough location is chosen, a slight error in probe positioning can be tolerated. This is important in order to avoid accidental incorrect acquisition of waveform measurements of a neighboring net.

As useful as the findnet feature is, it will seek a focus point location for only one net at a time. Yet it is often desirable to locate the field of view where multiple selected conductors are "visible" (unobscured by other conductors). If multiple unobscured conductors of interest can be included in one field of view, i.e., if multiple conductors of interest can be accessed without operating stage 226 to move column 229 in the case of the IDS e-beam systems, the diagnostic process can be made significantly more efficient. Similar efficiency gain is possible with FIB systems and other systems. This is because moving a mechanical stage is usually much slower than moving an electron-beam within a field of view by control of deflection coils 241 or, more generally, moving a focus point within a field of view such in a FIB system. This is also especially useful when high-speed waveform acquisition techniques are used, such as implemented by the high-speed logic analyzer tool of the IDS electron-beam systems. Reducing movement of the stage (e.g., stage 226) also minimizes the amount of nine spent in aligning the actual field of view (e.g., SEM) with the layout field of view, as such alignment involves a fairly expensive image-processing computation.

Moreover, while the findnet program has been successful in locating places to probe individual nets, there are instances where an experienced human might choose a different point to locate the focus point on the net. This is because the human may take into account the proximity of neighboring nets when choosing a focus point, while the findnet program does not.

SUMMARY OF THE INVENTION

Consequently, there is much to be gained by locating the "best" field of view position—e.g., one which offers the maximum possible information content of value in diagnosis or one which includes a region where repair can be most efficiently and/or reliably made. For diagnosis, the "best" field of view may be one which includes the most nets of interest, or may simply be the one which includes the maximum number of nets. For repair, the "best" field of view may be one which includes a region where selected conductors to be interconnected by deposition are in close proximity to one another. As there are typically hundreds of thousands of potential field of view locations, selecting the "best" field of view location requires an intelligent technique.

The present invention is directed to a multi-net accessing strategy which addresses these needs, and which can at the same time take into account neighboring nets to minimize crosstalk when measuring waveforms on nets or position a field of view at a location where selected nets are at a minimum separation distance from one another. In accordance with the invention, methods and apparatus are provided for positioning the field-of-view in an IC imaging or repair system, where the system comprises means for supporting an IC device having multiple physical layers and multiple internal nets, and controllable positioning means for positioning the field of view relative to the device.

In a preferred method of the invention, CAD data describing the IC device is processed to prepare a processed data set. The processed data set describes each physical layer of the device as a plurality of reduced polygons, each reduced polygon having dimensions at least as great as a predetermined minimum feature dimension. The reduced polygons are preferably trapezoids, rectangles, or fixed-width lines for ease of manipulation and storage. Each of the reduced polygons is associated with a physical layer of the device and with one net of the device. For each of a plurality of selected nets to be accessed, a transformed data set is prepared which describes a plurality of dilated polygons associated with the net. Each dilated polygon defines the periphery of a region encompassed by the field of view when a point within the field of view is traced around the periphery of a reduced polygon. A bit plane is mapped for each of the selected nets, each mapped bit plane defining the two-dimensional extent of dilated polygons associated with the net. Two-dimensional overlap regions are identified over which a plurality of the dilated polygons of the mapped bit planes overlap one another. The positioning means is controlled to position the field of view relative to the device at a location which corresponds to a selected overlap region.

The methods and apparatus of the invention are useful in electron-beam probing systems, mechanical probing systems, laser observation systems, focused-ion beam systems, and the like.

These and other features of the present invention are described below with reference to the accompanying drawing Figures.

BRIEF DESCRIPTION OF THE DRAWING

FIG. 19 illustrates the sum of net planes in accordance with the present invention for the four net planes of FIG. 18;

FIG. 20 is an unordered ranking lookup table useful in practicing the present invention;

FIG. 24A shows a typical wafer including multiple IC devices;

FIG. 24B shows portions of a typical IC device; and

FIG. 24C illustrates a method in accordance with the invention for locating a field of view to include selected conductors at a minimum separation distance from one another.

Appendices A-H show computer code representative of that used in the invention.

DESCRIPTION OF THE PREFERRED EMBODIMENTS

Definitions

The following terms are defined as indicated to assist in understanding of the description herein:

| | |
|---|---|
| Conductor | A wire, or combination of wires not insulated from one another, suitable for carrying electrical current. |
| DUT | Device under test. |
| FIB | Focused Ion Beam. |
| Layer | A physical stratum of a DUT. |
| Layout Data | CAD mask data. |
| MCM | Multi-Chip Module, a collection of two or more IC devices attached to the same substrate. |
| Net | Connection between components. |
| Net Bounding Box | The smallest rectangle which includes a net portion, the rectangle defined by a pair of coordinates (e.g., defined by a coordinate $x_1$, $y_1$ representing the location of a corner of the rectangle and a coordinate $x_2$, $y_2$ representing the location of a diagonally opposing corner of the rectangle). |
| Schematic | Circuit diagram. |
| SEM | Scanning electron microscope. |
| Stage | Platform on which the electron beam column or other probe is mounted. In the IDS systems, the stage moves while the DUT is stationary. |
| Visible | Not obscured by a higher layer. |
| Window | The field of view of the probe with the stage positioned at any one stationary location. As noted above, the present invention is directed to positioning the stage to obtain the "best" window. The "best" window may be the window which includes the most nets of interest, or may simply be the one which includes the maximum number of nets. |
| $\alpha$ | Minimum separation between nets. |
| $\beta$ | Minimum feature size. |
| $\gamma$ | Crosstalk separation ($>\alpha$). |
| $\lambda$ | Field of view dimension. |

OVERVIEW

The following description of preferred embodiments is presented in two parts. In Part I, section A concerns positioning a field of view to include multiple unobscured conductors. Section B of Part I concerns selection of a focus point, such as a location at which a beam is to be aimed, within the field of view. Section C of Part I concerns minimizing distances between IC conductors when adding connections, such as when using a focused ion beam to effect metal deposition. Part II describes specific implementations of features of the invention.

PART I

I.A. Positioning a Field of View to Include Multiple Unobscured Conductors

Figure 4:
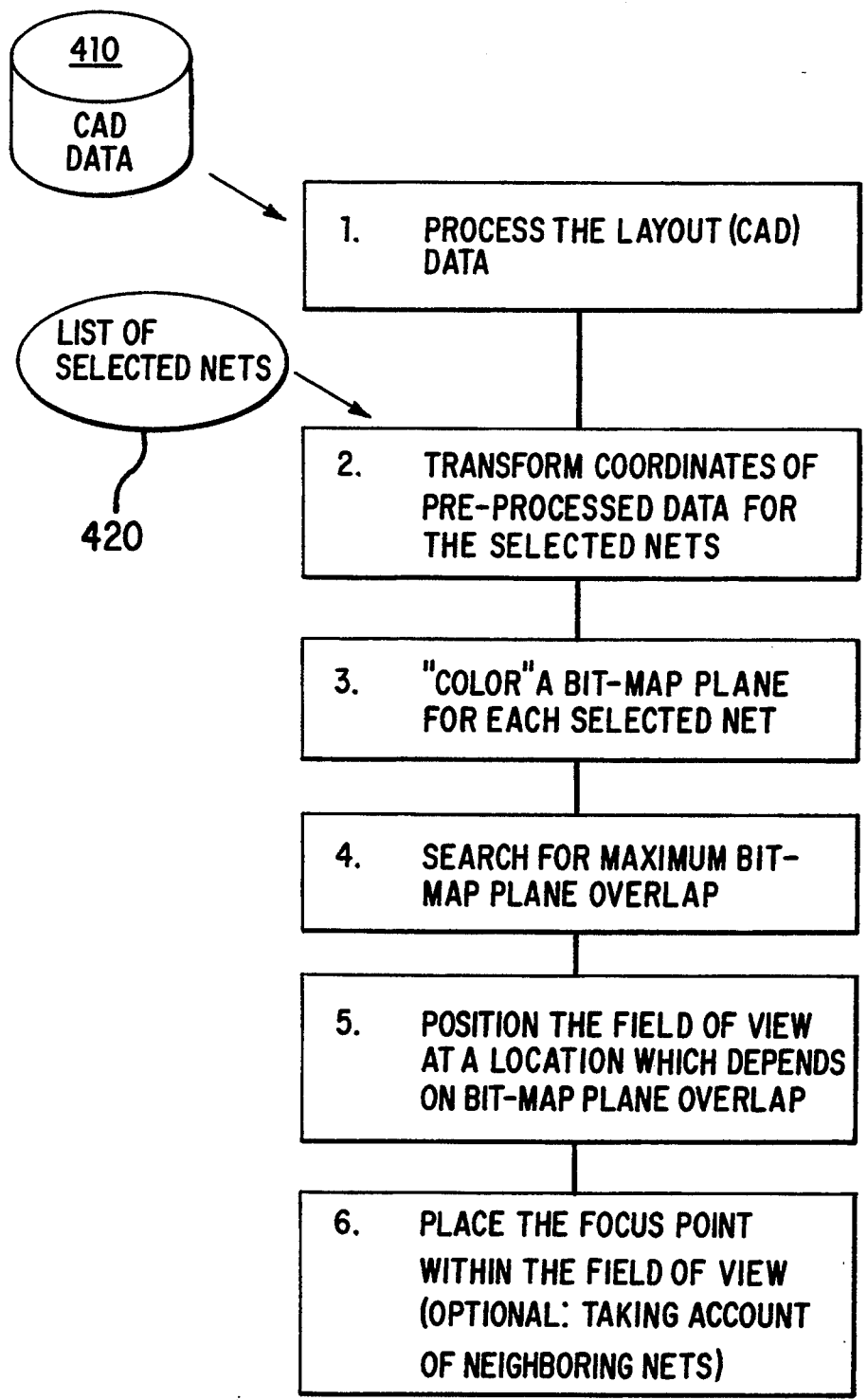
FIG. 4 is a flow chart illustrating the principle elements of a preferred method in accordance with the present invention.

The present invention offers an efficient, yet general, automated method of operating an IC imaging system for positioning a field of view such that a maximum number of selected nets or conductors can be accessed, such as for observation, probing or modification. As shown in FIG. 4, a preferred method in accordance with the invention comprises the following principal steps, each of which is described in more detail below.

1. Processing the CAD layout data 410.
2. Transforming coordinates of the processed layout data for the selected nets 420.
3. "Coloring" a bit-map plane for each selected net.
4. Searching for maximum bit-map plane overlap.
5. Positioning the field of view at a location which depends on bit-map plane overlap.

Step 1. Processing the Layout (CAD) Data

Figures 5, 6:
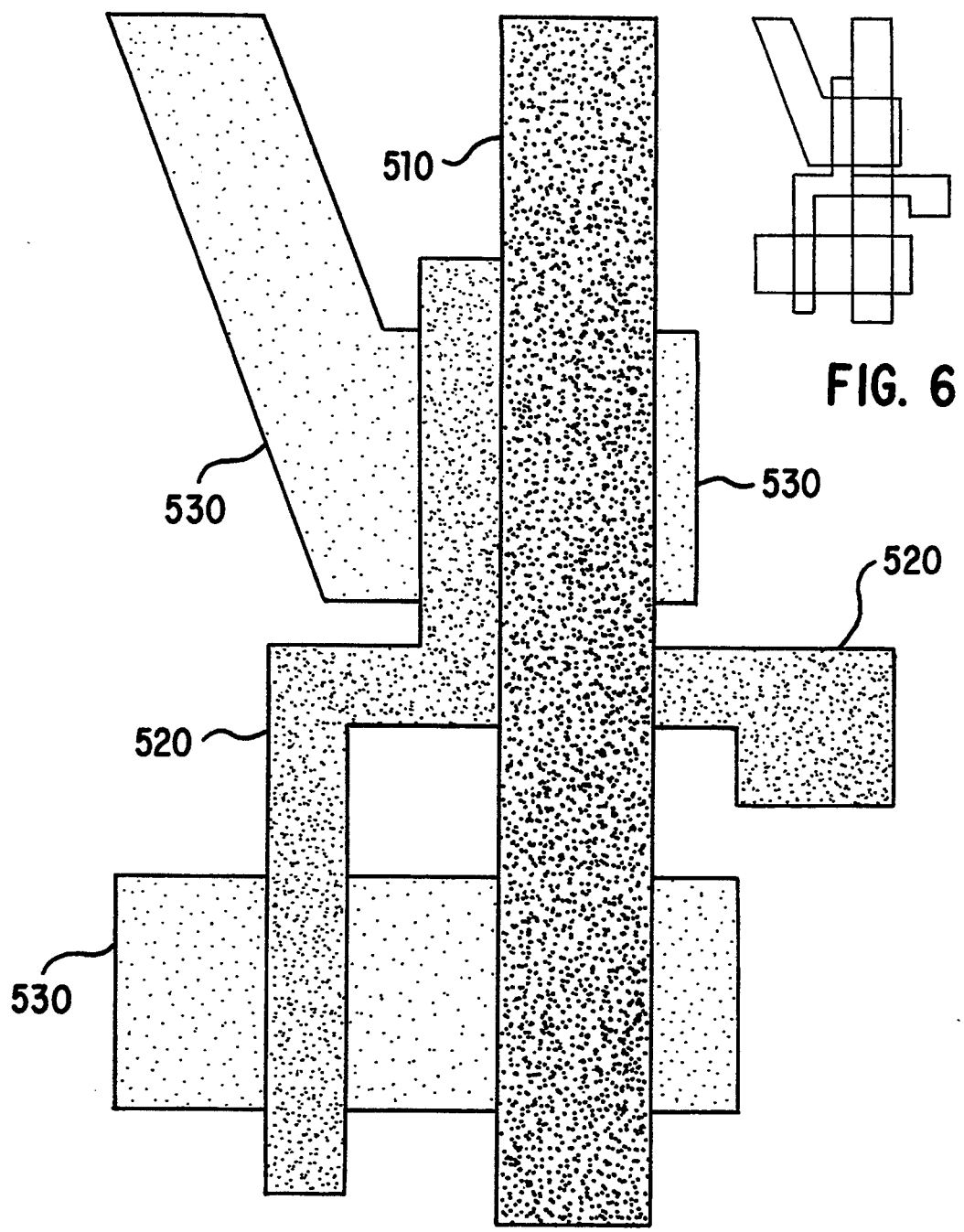
FIG. 5 is an enlarged view of original, complex layout polygons of a top, a middle, and a bottom layer of an IC device.
FIG. 6 is a view of the original layout polygons of FIG. 5, showing hidden lines of the middle and bottom layers.

FIG. 5 illustrates an example of original, complex layout polygons of three layers of an IC device: a top (metal) layer polygon 510, a middle (polysilicon) layer polygon 520, and a bottom (diffusion) layer polygon 530 of an IC device. The description of these polygons is contained in a set of CAD layout data files 410. FIG. 6 is a view of the original layout polygons of FIG. 5, showing hidden lines of the middle and bottom layers.

The layout data is first processed, preferably off-line, to reduce the complex polygons of the CAD description to sets of polygons more suitable for manipulation. The processing may be performed, e.g., by data processing system 116. This step is preferably performed as a pre-processing (initialization) step prior to runtime to minimize the time required to determined the "best" window location for a selected set of nets once the set of nets has been selected. The step may alternately be performed at runtime at the cost of reduced efficiency. Appendix A gives an example of a DRACULA TM command file for reducing polygons to simple polygons and generating visible layers; the DRACULA TM program is commercially available from Cadence Design Systems. The processing steps are preferably as follows, some of which are optional:

1.1 (Optional) Reduce all complex polygons to simple trapezoids. Concave polygons are reduced to convex polygons. The polygons may be approximated as rectangles for algorithmic efficiency and because rectangles can be manipulated and stored more efficiently than many other polygons. This step may be omitted, at the cost of greater computational complexity and increased data storage requirements.

Figure 7:
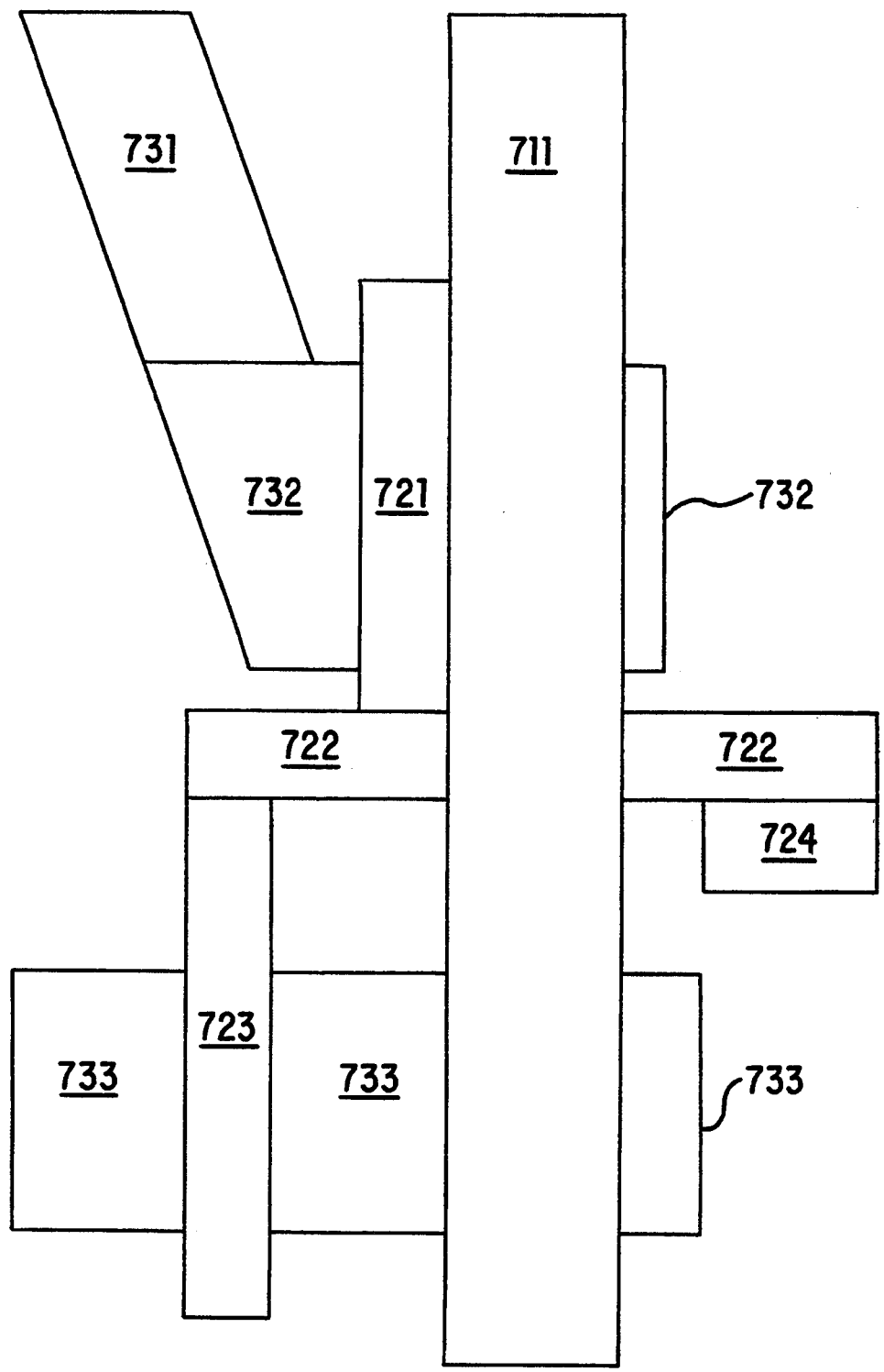
FIG. 7 is a view of the layout polygons of FIG. 5, after their reduction to simple trapezoids in accordance with the present invention.

Example: FIG. 7 is a view of the layout polygons of FIG. 5, after their reduction to simple trapezoids. Top-layer polygon 510 remains a rectangle, labeled 711 in FIG. 7. Middle-layer polygon 520 is reduced to rectangles 721, 722, 723 and 724. Bottom layer polygon 530 is reduced to rhomboid 731, trapezoid 732 and rectangle 733.

1.2. (Optional) Expand the top layer polygons by $\alpha$ (where $\alpha$ is the minimum acceptable separation between nets to be accessed), and remove portions of lower layers which are obscured (occluded) by the expanded top layer polygons. The minimum separation $\alpha$ is determined by factors such as the probe or beam diameter and the focus point placement tolerance, and may be set by user input to data processing system 116. This and subsequent CAD processing steps may be omitted if only the top layer (e.g., the METAL2 layer for a 2-metal technology, or the METAL3 layer for a 3-metal technology) of the IC device is to be probed.

Figure 8:
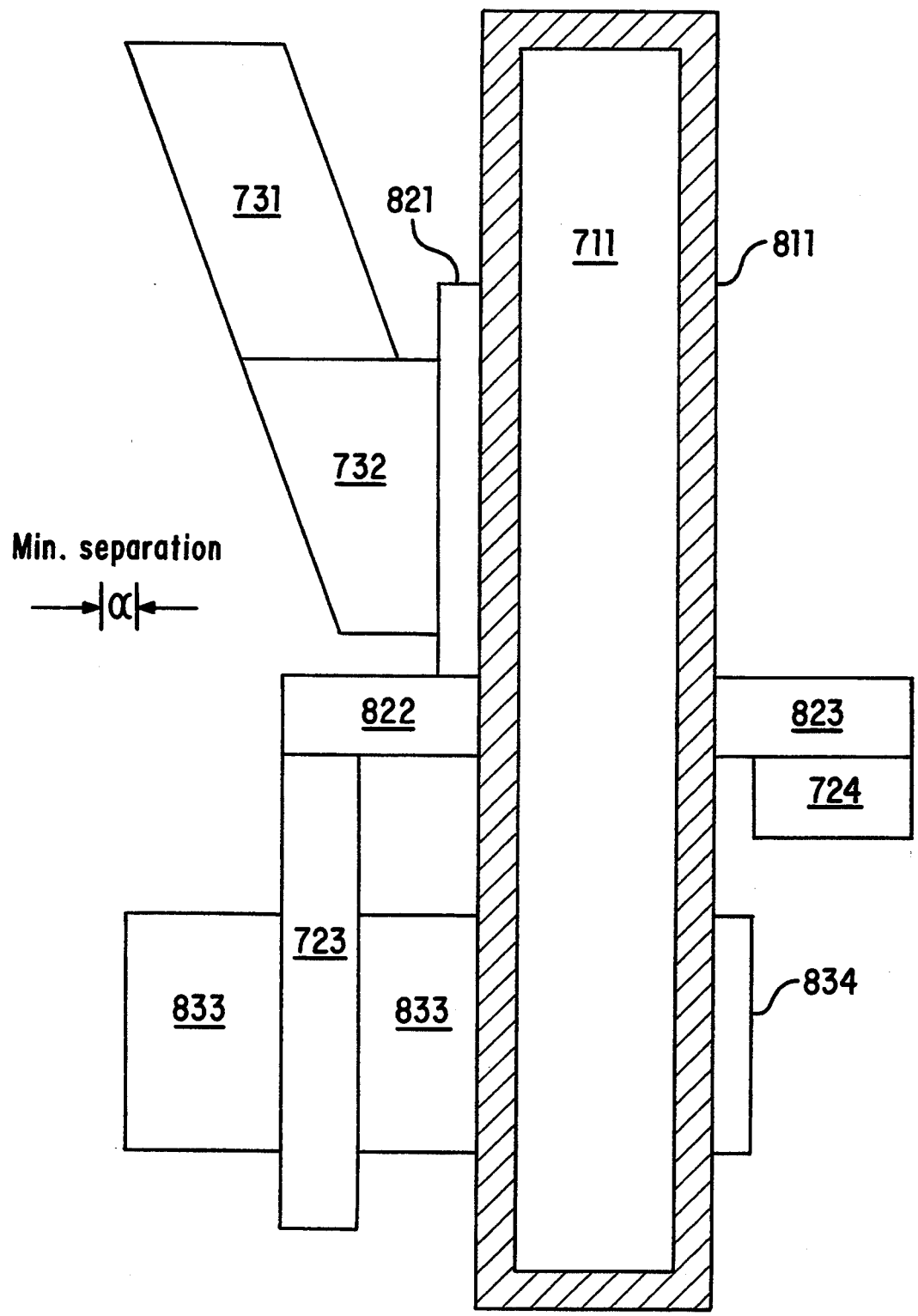
FIG. 8 is a view of the reduced layout polygons of FIG. 7, after expansion of the top layer polygon in accordance with the present invention.

Example: FIG. 8 is a view of the reduced layout polygons of FIG. 7, after expansion of top-layer polygon 711 by separation distance $\alpha$ to form an expanded top-layer polygon 811. Middle-layer polygons 723 and 724 remain unaffected, while the occluded portion of middle-layer polygon 721 is removed to leave middle-layer polygon 821, and the occluded portions of middle-layer polygon 722 are removed to leave middle-layer polygons 822 and 823. Similarly, bottom-layer polygons 731 and 732 remain unaffected, while occluded portions of bottom-layer polygon 733 are removed to leave bottom-layer polygons 833 and 834.

1.3. (Optional) Repeat step 1.2 until the second-to-lowest layer is reached. This step may be omitted, for example, if only the upper two layers of the IC device are to be probed.

Figure 9:
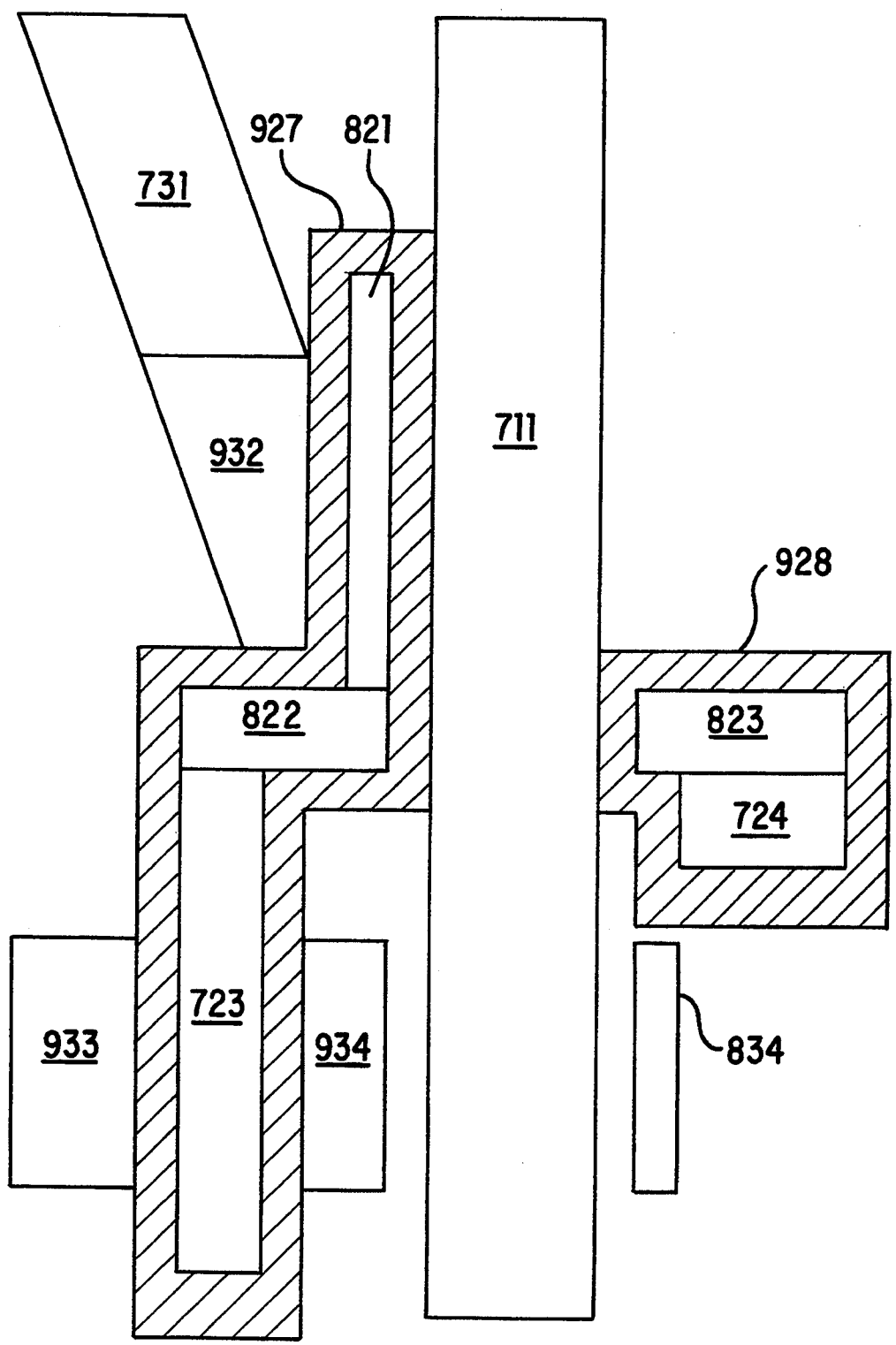
FIG. 9 is a view of the reduced layout polygons of FIG. 7, after expansion of the middle layer polygons in accordance with the present invention.
Figure 10:
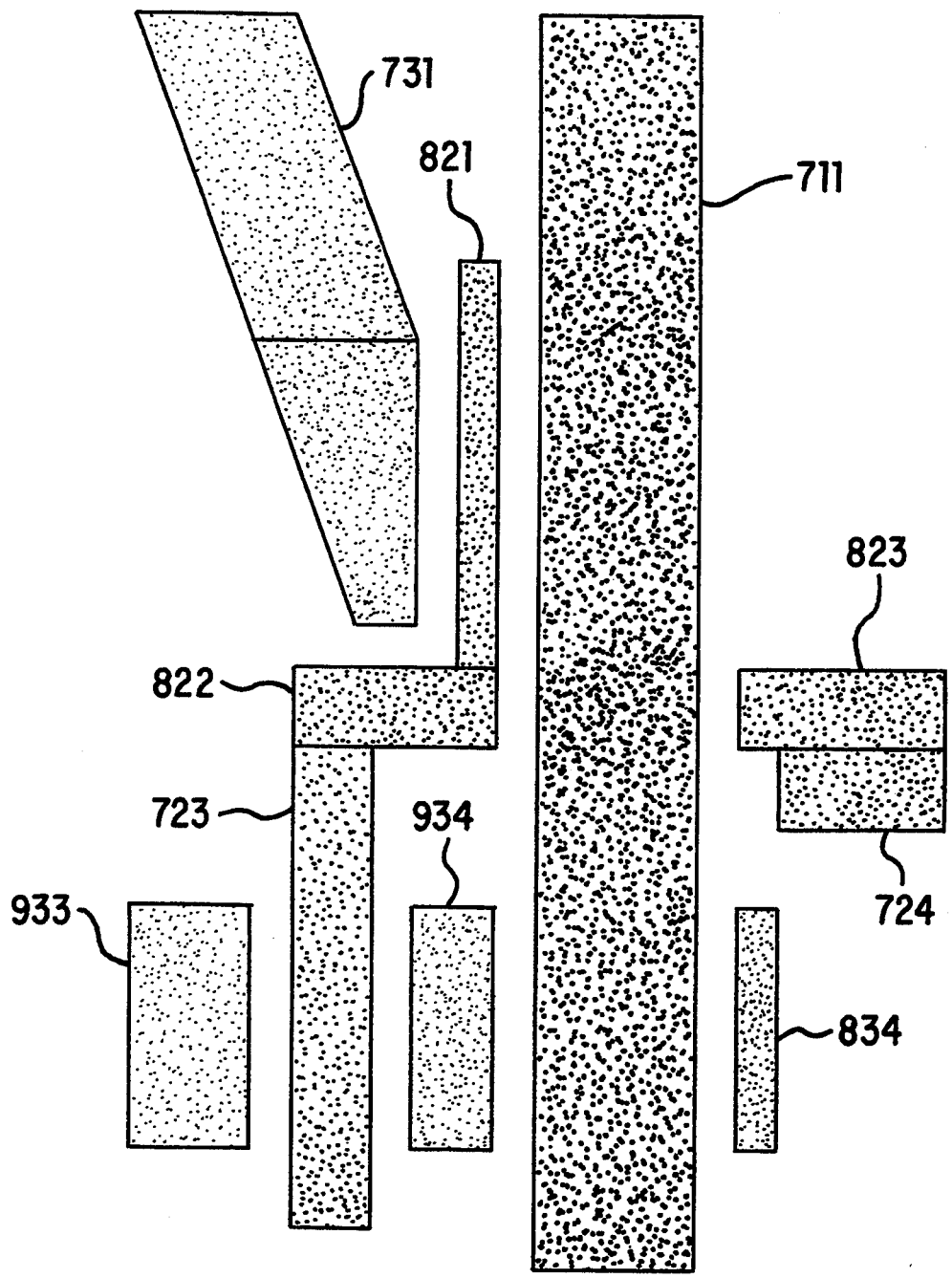
FIG. 10 is a view of the portions of the layout polygons of FIG. 7 which remain after expansion of the top-layer and middle-layer polygons in accordance with the present invention.

Example: FIG. 9 is a view of the reduced layout polygons of FIG. 8, after expansion of middle-layer polygons 821, 822 and 723 by separation distance a to form an expanded middle-layer polygon 927, and of middle-layer polygons 823 and 724 by separation distance $\alpha$ to form an expanded middle-layer polygon 928. Since there are only three layers in this example, no further repetition of step 1.2 is required. FIG. 10 is a view of the portions of the layout polygons of FIG. 7 which remain after expansion of the top-layer and middle-layer polygons and corresponding removal of portions of the middle-layer and bottom-layer polygons. That is, the remaining top-layer portion comprises polygon 711; the remaining middle-layer portions comprise polygons 821, 822, 723, 823 and 724; and the remaining bottom-layer portions comprise polygons 731, 932, 933, 934 and 834.

1.4. (Optional) Approximate all polygons as lines of fixed width (e.g., as parallelograms) for algorithmic and storage efficiency. This usually entails little loss of information as, in general, nets are simple wires. Unusually-shaped polygons are reduced to parallelograms which are a subset of the original polygon. This assures that any point within a parallelogram was also within the original polygon. This step may be omitted at the sacrifice of computational and storage efficiency. An example of a C programming language listing for converting trapezoids to fixed-width lines is attached as Appendix G ("lineindex.c").

Figure 11:
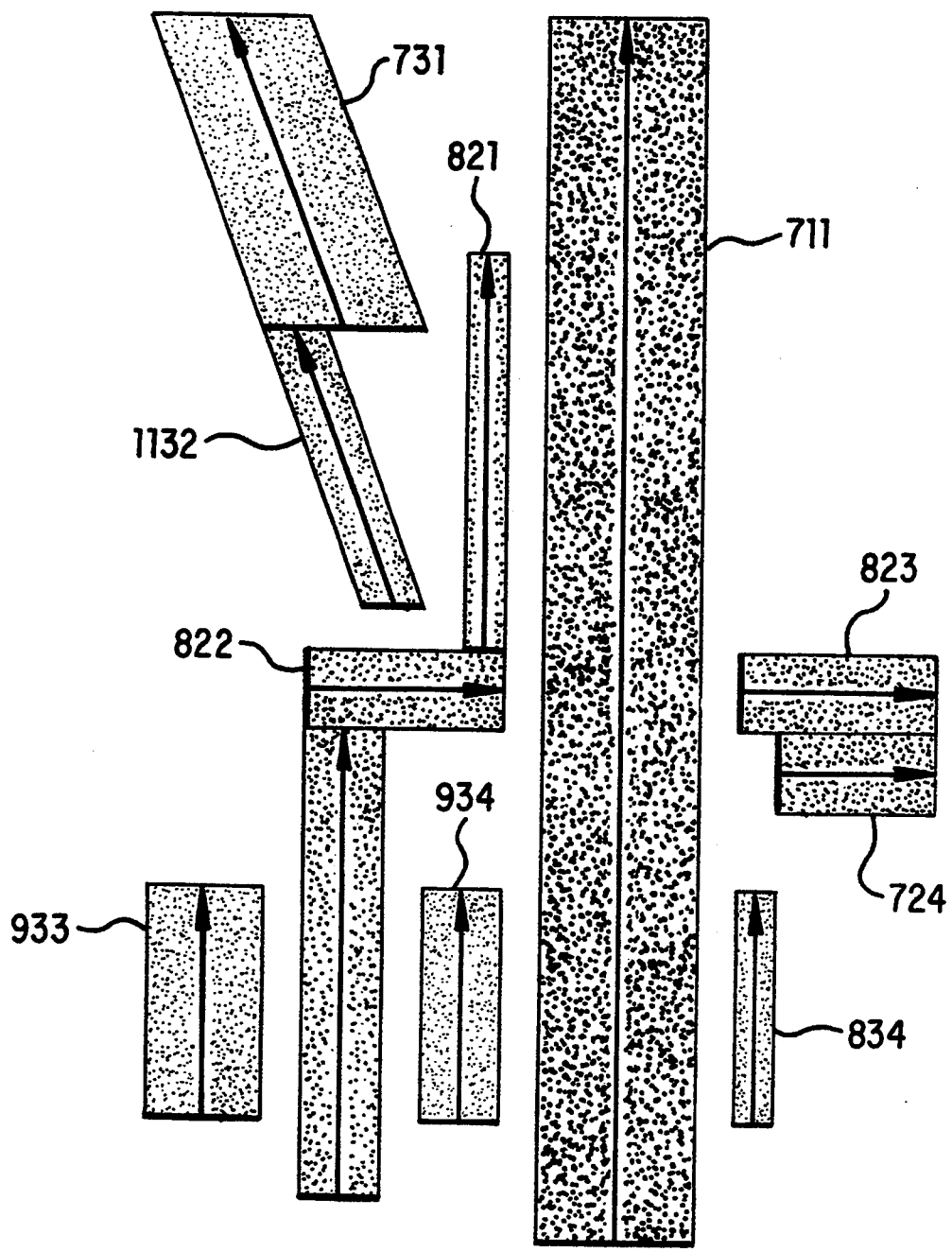
FIG. 11 illustrates the abstraction of the polygon portions of FIG. 10 as fixed-width lines in accordance with the present invention.

Example: FIG. 11 illustrates the abstraction of the polygon portions of FIG. 10 as fixed-width line segments. Top-layer polygon 711 remains unchanged in dimension. Middle-layer polygons 821, 822, 723, 823 and 724 likewise remain unchanged in dimension, as do bottom-layer polygons 731, 933, 934 and 834. However, odd-shaped bottom-layer polygon 932 is reduced in size to form a parallelogram 1132 when represented as a line having fixed width. It is noted that each point within polygon 1132 is within the bounds of original polygon 530.

1.5. Filter out the remaining polygons with dimensions less than $\beta$, where $\beta$ is the minimum feature dimension of interest (e.g., the minimum feature dimension which can be safely probed with an electron beam). The minimum feature dimension is determined principally by the diameter of the probe or beam. For example, the electron-beam spot produced in an IDS 5000 or an IDS 3000 system with a tungsten source has a typical diameter of about 0.3 $\mu$m, so that the minimum feature size which can be safely probed is about 1.2$\mu$m (e.g., about 4 times the e-beam spot diameter). The electron-beam spot produced in an IDS 5000plus system with a lanthanum hexaboride (LaB$_6$) source has a typical diameter of about 0.08 $\mu$m, and the minimum feature size which can be safely probed is about 0.3 $\mu$m. Focused-ion-beam systems and mechanical probe systems likewise have feature dimension limitations.

Figure 12:
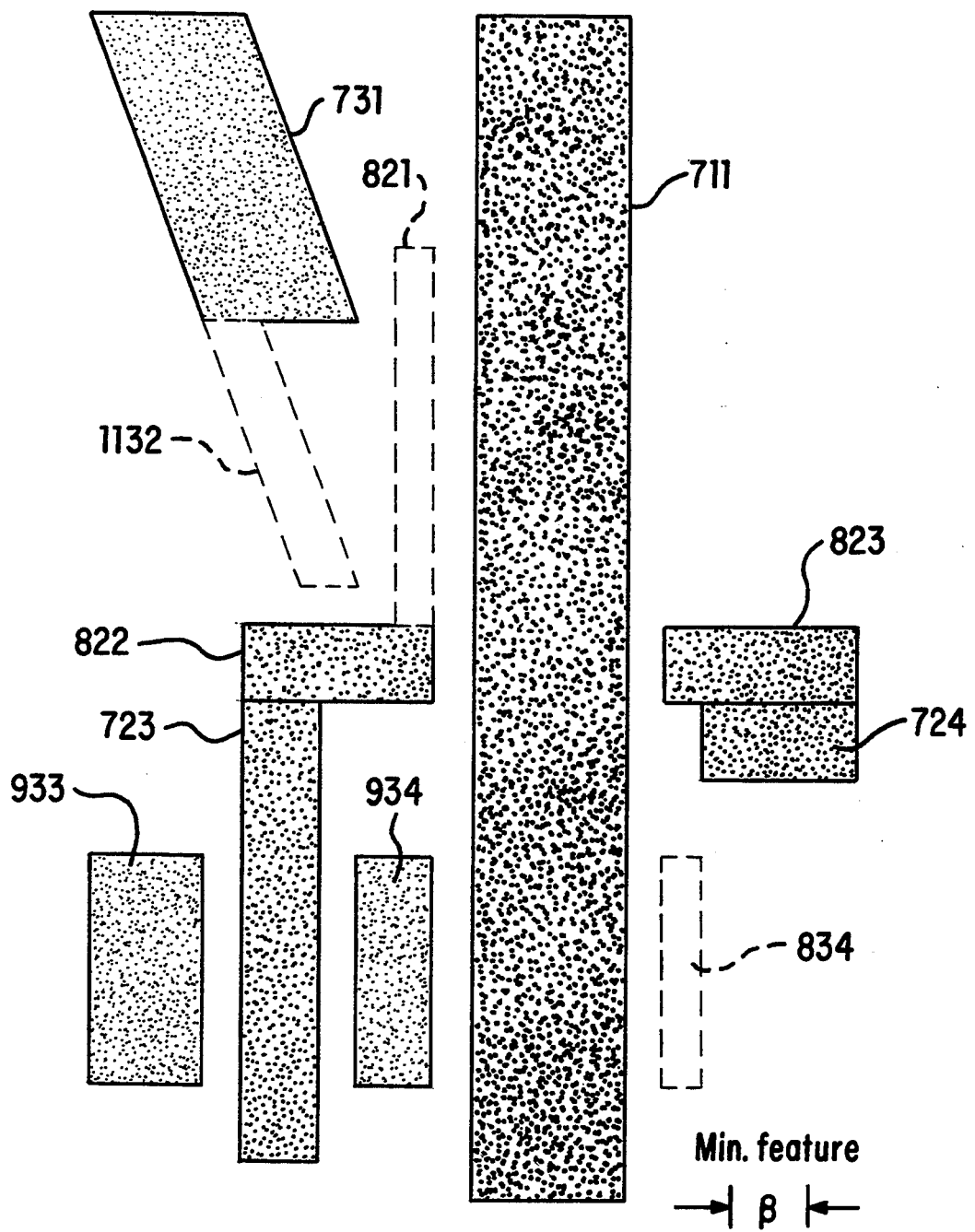
FIG. 12 illustrates the polygon portions of FIG. 10 which are suitable for probing as determined by the layout pre-processing in accordance with the present invention.

Example: FIG. 12 illustrates the polygon portions of FIG. 11 which meet the minimum feature dimension constraint as determined by the layout pre-processing in accordance with the present invention. Middle-layer polygon 821 and bottom-layer polygons 1132 and 834 have a dimension of less than the minimum feature dimension $\beta$ and are therefore filtered out (as represented by dotted lines). The remaining polygons are suitable locations, e.g., top-layer polygon 711, middle-layer polygons 822, 823, 723 and 724, and bottom-layer polygons 731, 933 and 934.

The CAD processing stage thus filters out polygons of less than a minimum feature dimension, as well as polygons which are not visible (e.g., which are obscured by polygons of higher physical layers of the IC device). The CAD processing may optionally filter out visible lower-layer polygons for nets which include higher-layer polygons, e.g., to assure acquisition of waveforms only at the topmost layers of a net with a SEM system in order to achieve a higher signal-to-noise ratio, or to enable faster and more reliable repair of the IC device with a FIB system by reducing the amount of milling and deposition required to make electrical contact with a conductor.

The layout processing steps can be summarized by the following generalized algorithm for an arbitrary number N of layers. Italicized names are layer names. Layer 1 is the top layer and LayerN is the bottom layer. All other layers are temporary "layers" generated during the CAD processing.

---

Covered = Covered_by_Layer1 = RESIZE Layer1 BY $\alpha$
Probe_Layer2 = Layer2 NOT Covered
Covered_by_Layer2 = RESIZE Layer2 BY $\alpha$
Covered = Covered OR Covered_by_Layer2
Probe_Layer3 = Layer3 NOT Covered
.
.
.
Covered = Covered OR Covered_by_LayerN-1
Probe_LayerN = LayerN NOT Covered
Probe_Layer1 = FILTER Probe_Layer1 < $\beta$
Probe_Layer2 = FILTER Probe_Layer2 < $\beta$
.
.
.
Probe_LayerN = FILTER Probe_LayerN < $\beta$

---

Where: $\alpha$=Minimum separation between nets, and $\beta$=Minimum feature size for safe probing.

Example: Assume that the DUT has three layers, Metal, Poly (polysilicon), and Diff (diffusion), that four nets have been selected for probing, and that each net comprises one original polygon. For this example, the above steps are compiled into the following logical, resizing and filter operations:

Covered=Covered_by_Metal=RESIZE Metal BY $\alpha$
Probe_Poly=Poly NOT Covered
Covered_by_Poly=RESIZE Poly BY $\alpha$
Covered=Covered_by_Metal OR Covered_by_Poly
Probe_Diff=Diff NOT Covered
Probe Metal=FILTER Probe_Metal<$\beta$
Probe_Poly=FILTER Probe_Poly<$\beta$
Probe_Diff=FILTER Probe_Diff<$\beta$

Step 2. Coordinate Transformation

The second principal step, coordinate transformation, assumes that the layout CAD data has been processed in accordance with Step 1, and a set of nets has been selected for which a single field of view is sought. That is, coordinate transformation occurs at run time after a set of nets has been selected. In the second principal step, coordinates of all of the pre-processed layout polygons for the selected nets are transformed such that the original layout window, which is a rectangle, is reduced to a single point in the transformed coordinate system.

This coordinate transformation technique, is an adaptation of the well-known C-obstacle transformation which has been applied in the prior art to the problem of navigating a robot through a set of obstacles. The robot, a polygon in cross-section, is reduced to a point, while the obstacles are expanded in size. Testing whether or not the robot hits an obstacle is then a relatively simple matter of determining if the point (which is the transformed robot) lies inside a transformed-obstacle polygon. This transformation reduces an expensive polygon-polygon problem to a polygon-point problem, vastly reducing processing time.

In robot navigation, the goal is to avoid overlap between the robot and the obstacles, since this amounts to a collision. In locating a field of view, however, the goal is to maximize overlap between the window (robot) and the selected nets (obstacles), since this corresponds to the "best" location for the field of view.

Figure 13:
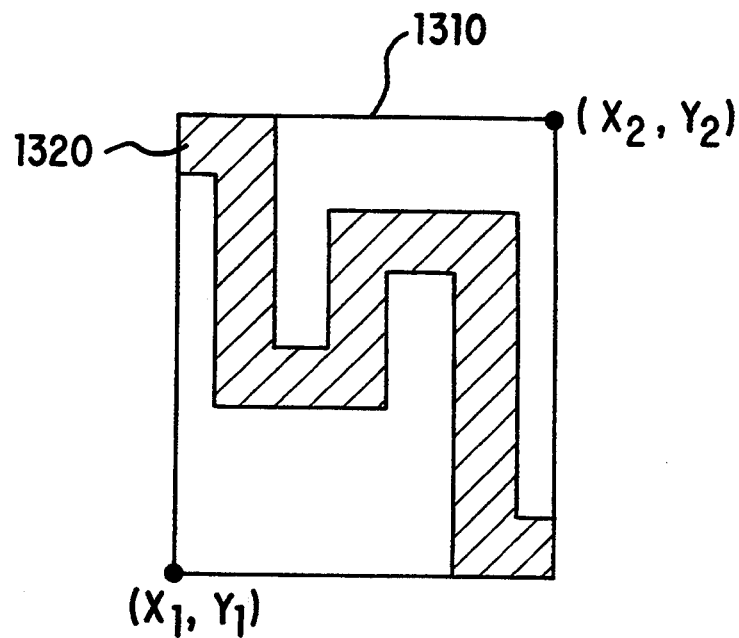
FIG. 13 illustrates a net bounding box.
Figure 14:
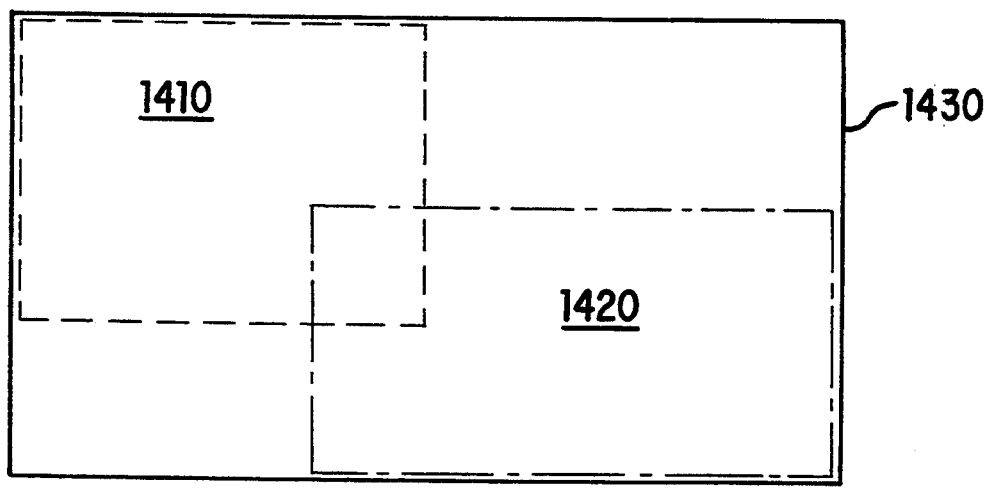
FIG. 14 illustrates the union of two net bounding boxes

At most, only an area equal to the union of the net bounding boxes need be considered. FIG. 13 illustrates a bounding box 1310 for a net 1320, defined by the coordinates $x_1$, $y_1$ and $x_2$, $y_2$ of diagonally opposing corners of the box. The union of a pair of bounding boxes is illustrated in FIG. 14. The union of a bounding box 1410 and a bounding box 1420 is shown at 1430. The resolution is tied to the dimensions $\lambda$ of the field of view, not to the feature size $\beta$. For example, if the field of view is a square having a dimension $\lambda$ of 50 $\mu$m on a side, a resolution of $\lambda/5$, or 10 $\mu$m, may be used; all coordinates are rounded to the resolution.

In general, the C-obstacle transformation can be applied to any polygon as follows: the transformed net (C obstacle) is generated by tracing a point within the field of view (robot) around the edges of the net (obstacle). If the center of the field of view (robot) is used as the tracing point, the transformed net (C obstacle) defines the region in which the original net (obstacle) overlaps the field of view (robot). Although the polygon may be concave or convex, the algorithm is in general more efficient for convex polygons and is especially efficient for rectangles such as fixed-width lines.

Figure 15:
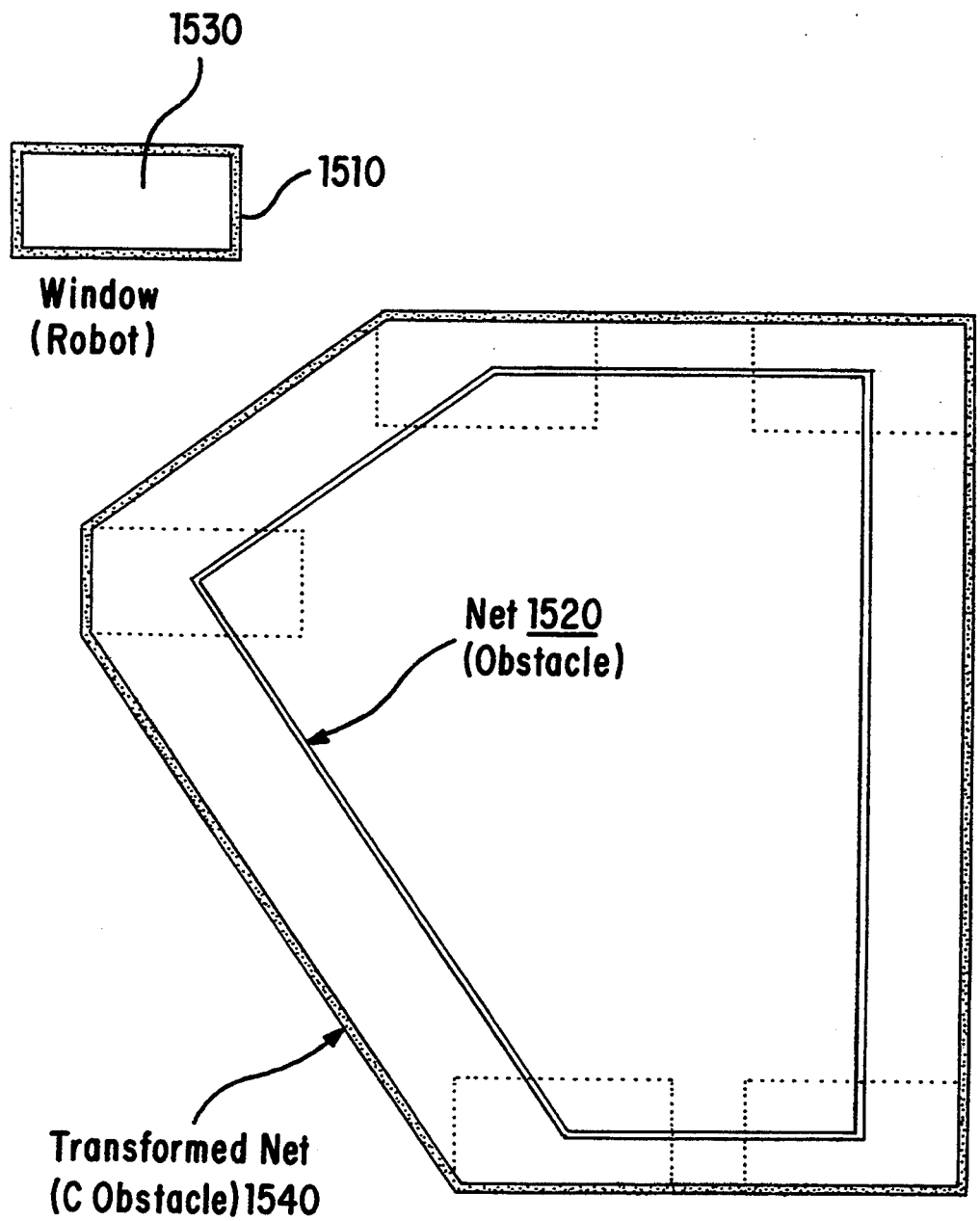
FIG. 15 illustrates the principles of C-obstacle transformation as employed in the present invention.

FIG. 15 illustrates the principle of C-obstacle transformation as employed in the present invention. It is desired to determine whether a rectangular field of view 1510 placed at any given location will overlap a net 1520. Tracing the center point 1530 of field of view 15 10 around the periphery of net 1520 produces a transformed net 1540 which is a "dilated" version of the original net. After the transformation, determining whether a given location for field of view 1510 will overlap net 1520 is simply a matter of determining whether the center point 1530 of field of view 1510 falls within transformed net 1540.

Figure 16:
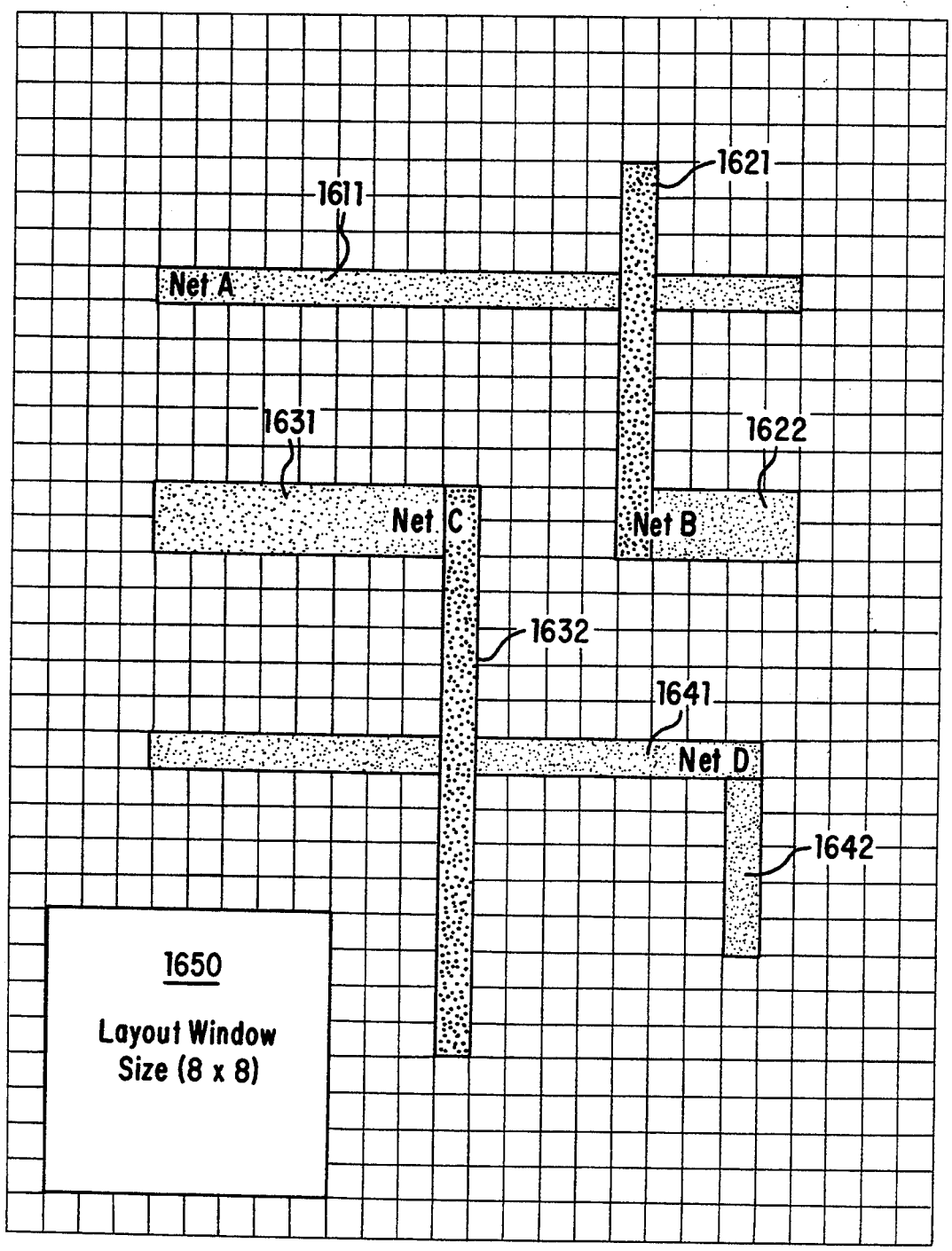
FIG. 16 illustrates a set of pre-processed polygons for four nets, in scale with a layout window, in accordance with the present invention.

Example: FIG. 16 illustrates a set of pre-processed polygons for four nets, in scale with a field of view (layout window). In this example, four nets of an IC have been selected for which a field of view position is sought: net A, net B, net C and net D. Pre-processed polygons of the selected nets are found on two different layers of the IC: a top, metal layer (dark shading) and a middle, polysilicon layer (light shading). That is, net A comprises a mid-layer polygon 1611, net B comprises a top-layer polygon 1621 and a mid-layer polygon 1622, net C comprises a mid-layer polygon 1631 and a top-layer polygon 1632, and net D comprises mid-level polygons 1641 and 1642. The layout window 1650 is in this example a square having a dimension of $\lambda$ on each side, and the resolution (grid) of the pre-processed layout is λ/8.

Figure 17:
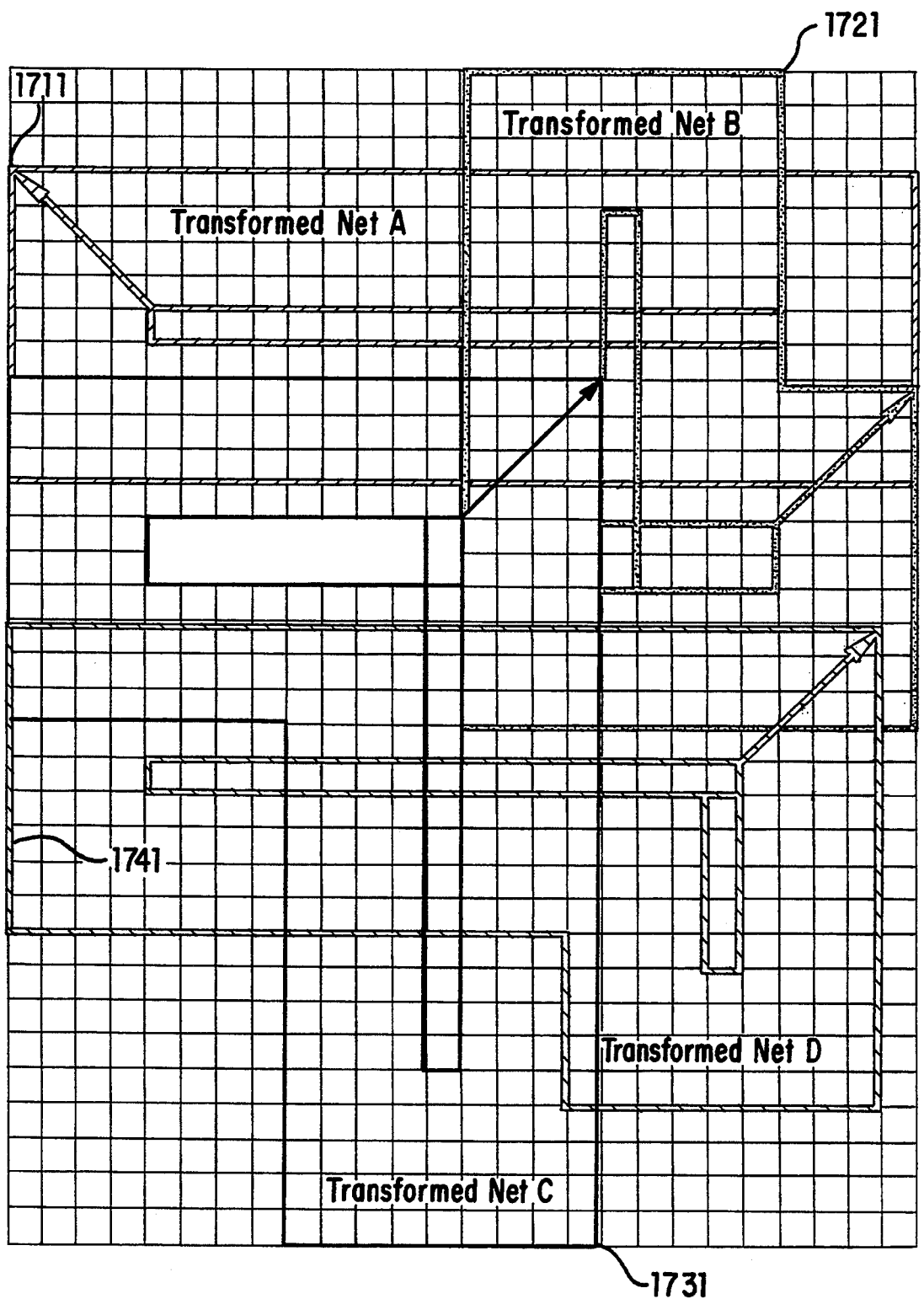
FIG. 17 illustrates the polygons of FIG. 16, as transformed in accordance with the present invention.

FIG. 17 illustrates the polygons of FIG. 16, as transformed in accordance with the present invention. Each of the polygons is transformed using the C-obstacle method to produce a corresponding "dilated" polygon. That is, transformed net A becomes a polygon 1711, transformed net B becomes a polygon 1721, transformed net C becomes a polygon 1731, and transformed net D becomes a polygon 1741.

Determining whether a possible position for field of view 1650 overlaps a net is a matter of determining whether the center point of field of view 1650 at that position falls within the "dilated" polygon for that net. An example of a C programming language listing for implementing the C-obstacle functions is included in the attached Appendix H ("c_obstacle.c").

Step 3. "Coloring" a Bit-map Plane for each Net Selected for Probing (Coloring by Net Plane)

In the third principal step of the process, each selected net is assigned a unique bit plane, or "color". All of the transformed polygons are then "painted" in the color of their respective nets, independent of layer. In other words, every point in the plane included inside the transformed polygons of a net is turned on. In doing this, the original layer information, e.g., Metal or Poly, is lost, although the overall topological extent of the net becomes clear from the number of bits in the plane which are on. The resolution of the bit plane is the same fraction of the dimensions of the field of view as used for coordinate transformation (e.g., λ/5 in this example). The dimensions of the bit plane(s) correspond to the dimensions of the union of "dilated" net boundary boxes (e.g., the boundaries of the "dilated" net polygons), scaled by the resolution.

Figure 18:
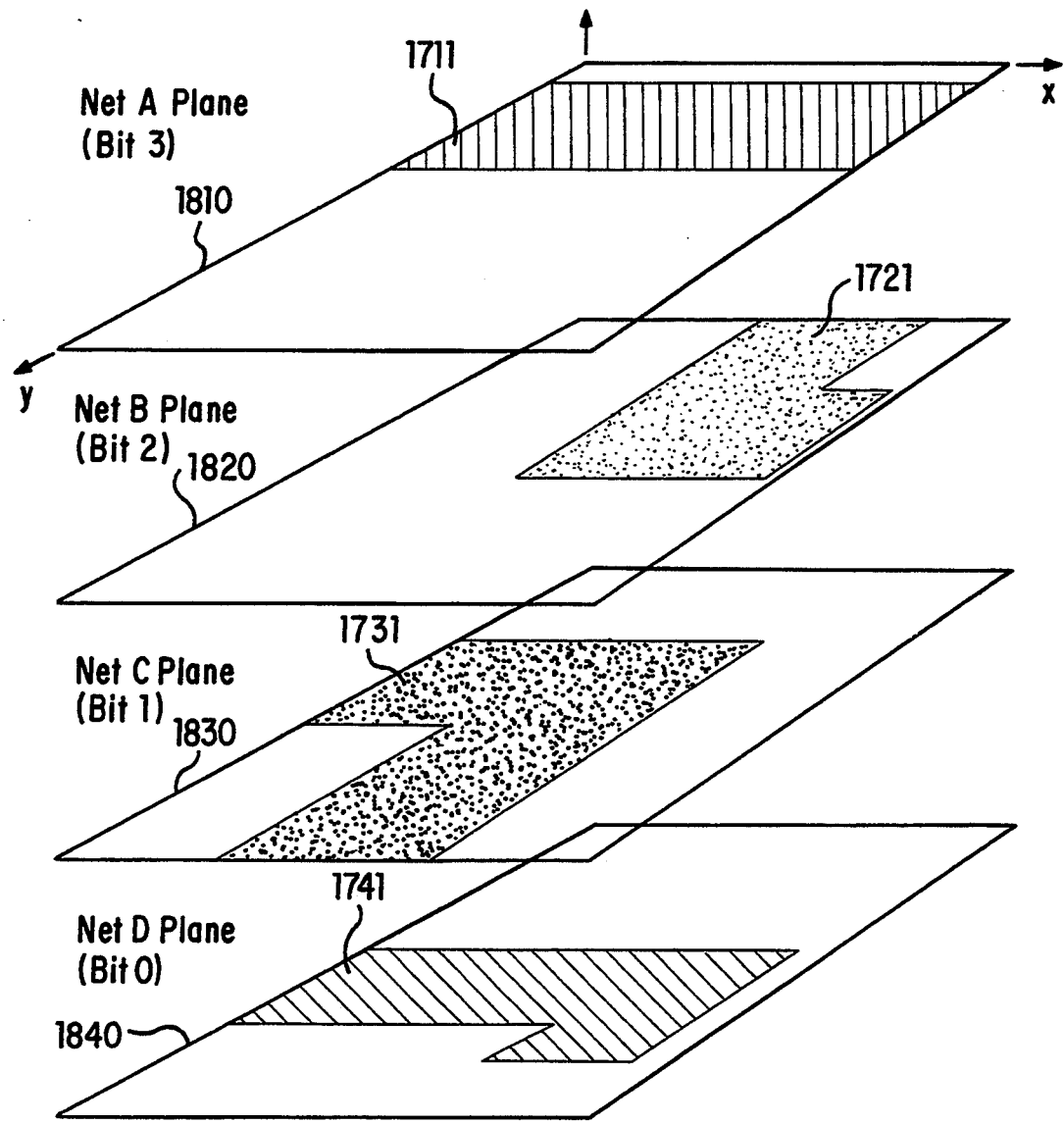
FIG. 18 illustrates the principle of coloring by net plane in accordance with the present invention for the four nets of FIGS. 16 and 17.

Example: FIG. 18 illustrates the principle of coloring by net plane in accordance with the present invention for the four nets of FIGS. 16 and 17. Transformed net A polygon 1711 is mapped onto bit-map net plane 1810, transformed net B polygon 1721 is mapped onto bit-map net plane 1820, transformed net C polygon 1731 is mapped onto bit-map net plane 1830, and transformed net D polygon 1741 is mapped onto bit-map net plane 1840. The fact that net B and net C each occupy multiple physical layers of the IC device is not taken into account in "coloring" the net planes.

Step 4. Searching for Maximum Overlap

In the fourth principal step, the point of "maximum" overlap of the bit-map net-planes, is found by scanning the "sum" of the planes. The "sum" of the planes at any x,y location of the mutually-aligned stack of net planes is the value of a binary word made up of one bit from each of the planes; the value of each bit is determined by whether it is on or off at that location. The "maximum" of the sum of the net planes can be defined in at least two ways, depending on whether or not the nets are ranked in importance. If the nets are not ranked in importance, the "maximum" is defined as the largest number of "on" bits. If the selected nets are ranked in importance, the "maximum" is defined as the largest sum of weighted on bits, where each bit is assigned a weight according to the importance of probing the corresponding net. Whichever the criterion for the "maximum," the point of maximum overlap corresponds to a "best" location for the field of view.

Example: Each bit-map net-plane is assigned a "weight," or bit position. In FIG. 18, net A plane 1810 is assigned bit 3, net B plane 1820 is assigned bit 2, net C plane 1680 is assigned bit 1, and net D plane 1840 is assigned bit 0. Thus, a 4-bit binary "word" may be formed for any given x,y coordinate of the planes, with each bit of the binary "word" representing the presence or absence of a "colored" location in the corresponding bit-map net-plane at that x,y coordinate position. The value of the binary "word" at that x,y coordinate position represents the "sum" of the bit-map net-planes for that position.

FIG. 19 illustrates the sum of the four "colored" net planes shown in FIG. 18. In a region 1910, none of the net planes is "colored" and the binary "word" for each x, y coordinate position within that region is therefore 0000, having a decimal value of 0. In a region 1912, net plane B is "colored"; the binary "word" for each x, y coordinate position within that region is therefore 0100, having a decimal value of 4. In a region 1916, net A is "colored; the binary "word" for each x, y coordinate position within that region is therefore 1000, having a decimal value of 8. In a region 1918, net planes A and B are "colored"; the binary "word" for each x, y coordinate position within that region is therefore 1100, having a decimal value of 12. In a region 1924, nets A, B and C are "colored; the binary "word" for each x, y coordinate position within that region is therefore 1110, having a decimal value of 14. In a region 1934, nets B, C and D are "colored; the binary "word" for each x, y coordinate position within that region is therefore 0110, having a decimal value of 7. Similarly, a binary "word" is assigned for each x, y coordinate position within regions 1914, 1920, 1926–1932 and 1936–1946.

As shown graphically in FIG. 19, there are possible field of view in which as many as three of the selected nets are "visible" (nets A+B+C or nets B+C+D), but there are no possible field of view locations within which all four of the selected nets are "visible" in this example.

The choice of ranking strategy, ordered or unordered, is left to the user. Each has value, depending on which nets are being sought and why.

In the ordered strategy, the user wishes to prioritize the importance of having the selected nets in the field of view. Finding the "best" field of view location is in this case a matter of treating the binary word at each possible field of view location directly as an integer, provided that the most significant bit corresponds to the most important net and the least significant bit corresponds to the least important net.

Referring to the example of FIGS. 18 and 19, net planes 1810–1840 are ordered such that Net A corresponds to the most significant bit and Net D the least significant bit. This is the scheme used when the importance of including the nets in the field of view is ranked from Net A (most important) to Net D (least important). If each vertical slice through the n planes is treated as an n-bit binary integer (where the most significant bit corresponds to the most important net, the least significant bit corresponds to the least important net, and the remaining bits are arranged to correspond to the order of importance of the remaining nets), the largest integer value then occurs at field of view locations which contain the most important nets. The dark shaded region 1924 of FIG. 19 indicates the optimal field of view location in this example, as it contains the most important nets, Net A, Net B, and Net C. Note that this binary weighting scheme ensures that a field of view location containing Net A (e.g., region 1916, having an integer value of 14) has a higher value than one containing any combination of nets B, C and D (e.g., region 1934, having an integer value of 7). The table of FIG. 20 indicates in the center column each of the possible binary "words" for a four-net example of FIG. 19 and, in the center column, the corresponding integer value.

In the unordered strategy, the user wishes to have the maximum number of selected nets in the field of view, without regard to relative importance. Finding the "best" field of view location in this case is a matter of examining the binary "word" for each possible location to determine the number of "on" bits (which equals the number of nets which are "visible" within a field of view at that location). This may be done with a lookup table, such as the table of FIG. 20, in which the right-hand column (labeled "number of nets") indicates the number of "on" bits for each possible binary "word" in the example of FIG. 19. Thus, locations within regions 1924 and 1934 are equally suitable for field of view placement because each will allow probing of three nets, but locations within all other regions of FIG. 19 will allow probing of fewer than three nets.

In summary, whatever the criterion for the "maximum," a point of maximum overlap corresponds to the "best" location for the field of view.

Step 5. Positioning the Field of View

Once the "best" field of view location has been found in Step 4, a command is given to move the field of view to that location. In the IDS systems, field of view positioning involves sending a command with the desired field of view location to the software program in data processing system 116 (FIG. 1) which controls stage 240. It will be recalled that in the IDS E-beam systems, the focus point (the E-beam probe) is positioned within the field of view by signals applied to deflection coils 241 under control of data processing system 116. The IDS 7000 FIB Station makes similar use of a stage for positioning a field of view and deflection coils for positioning the focus point of the focused ion beam within the field of view. A mechanical probe system may, for example, employ a first stage for positioning an optical field of view within which the mechanical probe may be moved, and a second stage for positioning the mechanical contact probe at the equivalent of a focus point within the field of view.

I.B. Focus Point Selection within the Field of View

Once the field of view has been positioned, a focus point location can be selected within the field of view, such as a point at which a electron beam or an ion beam is to be aimed or at which a mechanical probe is to be placed. Selection of the focus point may take into account the proximity of neighboring nets, for example to minimize crosstalk when using an electron beam probe for waveform acquisition.

It will be recognized that the layout processing step (principal Step 1 of Part I, Section A, above) assures that all nets located in the layout window are visible, but certain locations on the net may often be more suitable for probing than others.

Selection of the focus point may if desired be carried out by applying the rules employed in the findnet program described above:

Locate the focus point at a corner of the net.

Locate the focus point at the highest possible layer of the net.

Locate the focus point at the widest part of the net.

Using an IDS system, the findnet program may simply be run to place the focus point on each of the selected nets. A copy of the findnet program, written in the C programming language, is attached as Appendix F. The findnet program as currently implemented does not take neighboring nets into account, sometimes resulting in placement of the focus point at undesirable locations. However, the layout pre-processing step (principal Step 1, above) ensures that each point located in a remaining region of possible focus points satisfies the basic separation distance ($\alpha$) and minimum feature size ($\beta$) requirements.

In accordance with the invention, the focus point may optionally be located on each selected net within the field of view which takes into account the proximity of neighboring nets. To do this, all polygons within the field of view are "dilated" by an amount sufficient to avoid signal crosstalk from neighboring nets when probing a net to achieve a crosstalk separation distance ($\gamma$). That is, each polygon is dilated by an amount equal to half the crosstalk separation (e.g., by $\gamma/2$). Portions of nets lying in or near the regions of overlap of the dilated nets are avoided when selecting the focus point location within the field of view.

Figure 21:
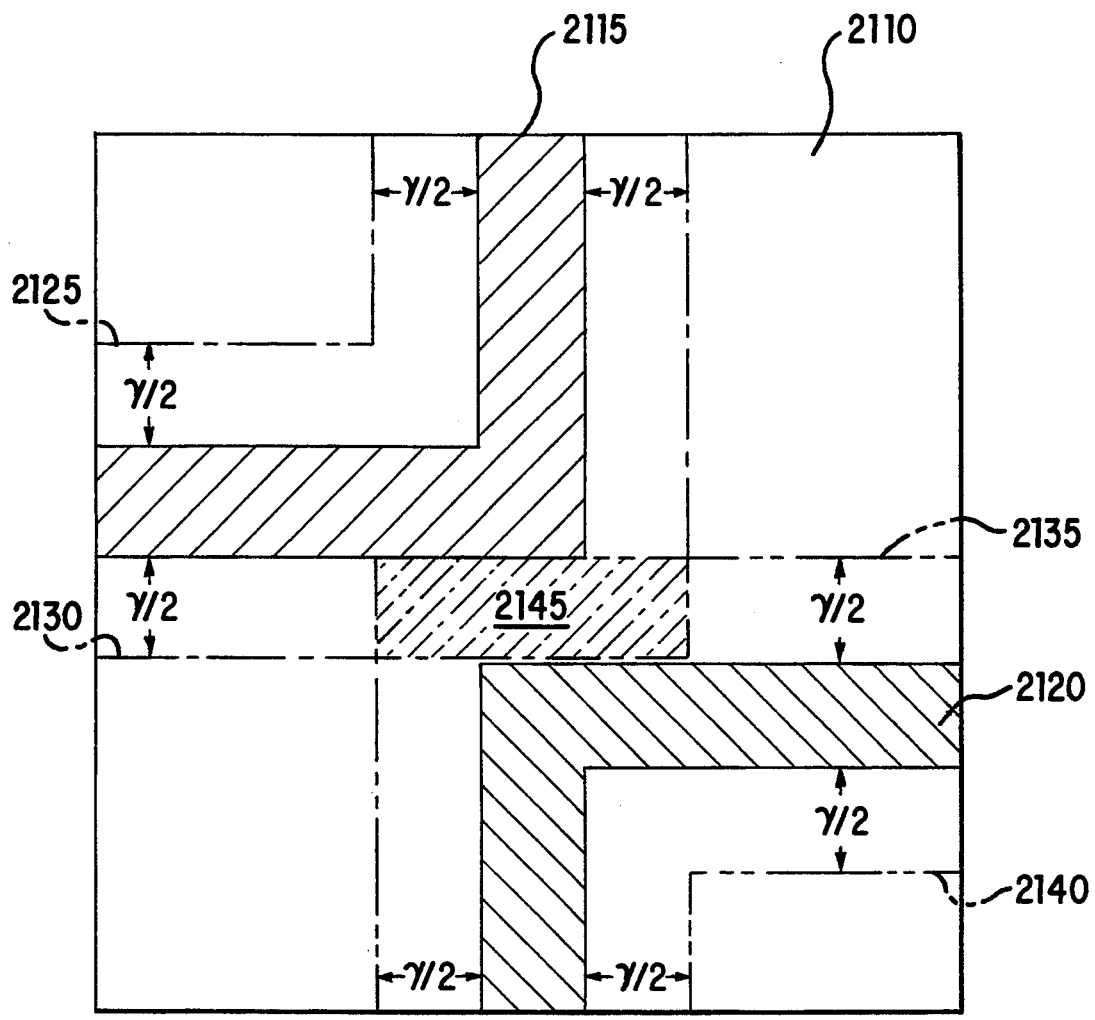
FIG. 21 shows a probe window containing two net images, "dilated" in accordance with an optional feature of the present invention.

Example: FIG. 21 shows a field of view 2110 in which a portion of a net 2115 and a portion of a net 2120 are visible. It is desired to locate the focus point on one, or in succession on each, of nets 2115 and 2120. The polygons of net 2115 are "dilated" by a distance $\gamma/2$ as shown by dashed lines 2125 and 2130. Similarly, the polygons of net 2120 are "dilated" by a distance $\gamma/2$ as shown by dashed lines 2135 and 2140. The "dilated" nets overlap in a region 2145. Once the "crosstalk" overlap regions are determined, each net is scanned from one end to the other within the field of view and a "crosstalk coefficient" representing a sum of distances to each overlap region is determined for each scan point. The point with the lowest coefficient is preferably chosen as the focus point. Nets are scanned at intervals $\geq \gamma$.

I.C. Minimizing Distances Between IC Conductors within the Field of View

The techniques described in Section A of Part I above are effective to locate a field of view in which selected conductors are present and unobscured portions of the conductors are visible. However, when using a focused ion beam system for deposition of metal connections in IC repair, it is desirable to further constrain the field of view location such that distance between selected conductors is minimized, because:

Short connections are more reliable than long ones, and

Deposition is time-consuming, so short connections save time.

In accordance with the invention, the procedure of Part I, Section A, above is invoked one or more times to perform a binary search until a minimum distance, $d_{min}$, between selected conductors is found. To do this, an initial distance $d_{init}$ is selected as the field of view dimension $\lambda$. The procedure for locating a field of view of dimension $d_{init}$ is then carried out.

If the starting distance, $d_{init}$, is less than the actual distance between the selected conductors, no field of view location will be found which includes the selected conductors. In this case, the field of view dimension $\lambda$ is increased (for example, by a factor of 2), and the procedure for locating a field of view is invoked once again. The process continues, each time with an increased field of view dimension $\lambda$ until a field of view location is found which includes the selected conductors.

If the starting distance, $d_{init}$, is greater than the actual distance between the selected conductors, a field of view location which includes the selected conductors will be found on the first attempt. In this case, it is preferred to reduce the field of view dimension $\lambda$ (for example, by a factor of 2) and again invoke the procedure for locating a field of view containing the selected conductors. The process continues, each time with a decreased field of view dimension $\lambda$ until no field of view location is found which includes the selected conductors. The field of view dimension $\lambda$ is then increased to the minimum dimension for which a field of view containing the selected conductors was found.

The procedure for locating a field of view containing selected conductors at a minimum distance from one another is preferably carried out using a processing system such as data processing system 116, suitably programmed to carry out the following steps:

1. Identify selected conductors to be connected
2. If the bounding boxes of the selected conductors do not overlap, then report failure
3. Initialize distance, $d=d_{init}$, $d_{min}=0$, outside=FALSE
4. Perform "findnets" procedure of Part I, Section A, using a field of view dimension $\lambda=d$.
5. If (selected conductors are inside the field of view) then

```
{
    d_min = d
    if(outside = TRUE) goto 7
    d = d/2
} else if(d_min > 0){
    d = d * 2
    outside = TRUE
} else goto 7
```

6. Go to 4
7. Report minimum conductor separation, $d_{min}$

Note that this process will succeed for any positive value of $d_{init}$, unless the bounding boxes of the conductors do not overlap at all, in which case there is no solution.

To illustrate, FIG. 24A shows a wafer 2410 which includes multiple IC devices 2415, 2420 and 2425. A typical wafer has a diameter of 20 cm, and each device may have a typical dimension of 2 cm on a side. FIG. 24B shows in more detail portions of device 2415 having conductors 2430, 2435 and 2440 which are not in electrical contact with one another. A typical field-of-view window 2445 may have a dimension of 50 mm on a side. It is desired to identify a region 2550 at which conductors 2430 and 2435 are at a minimum distance from one another so that metal can be deposited to establish electrical contact between these conductors with maximum efficiency. FIG. 24C shows the result of a first attempt to locate a field of view of dimension $d_1$ within which conductors 2430 and 2435 are visible—a field of view 2455 is identified, but does not satisfy the requirement of minimum separation distance between the selected conductors. FIG. 24C further shows the result of a second attempt to locate a field of view of dimension $d_1/2$ within which conductors 2430 and 2435 are visible—a field of view 2460 is identified, but it is unknown whether the requirement of minimum separation distance between the selected conductors has been satisfied. FIG. 24C still further shows the result of a third attempt to locate a field of view of dimension $d_1/4$ (e.g., as shown at 2465) within which conductors 2430 and 2435 are visible. However, no such location is identified as the field of view 2465 is too small to include the selected conductors. It is thus known that the minimum distance between the selected conductors is on the order of dimension $d_1/2$. The field of view is thus preferably located as shown at 2460.

PART II

Implementation in an IDS E-beam Probe System

Figure 1:
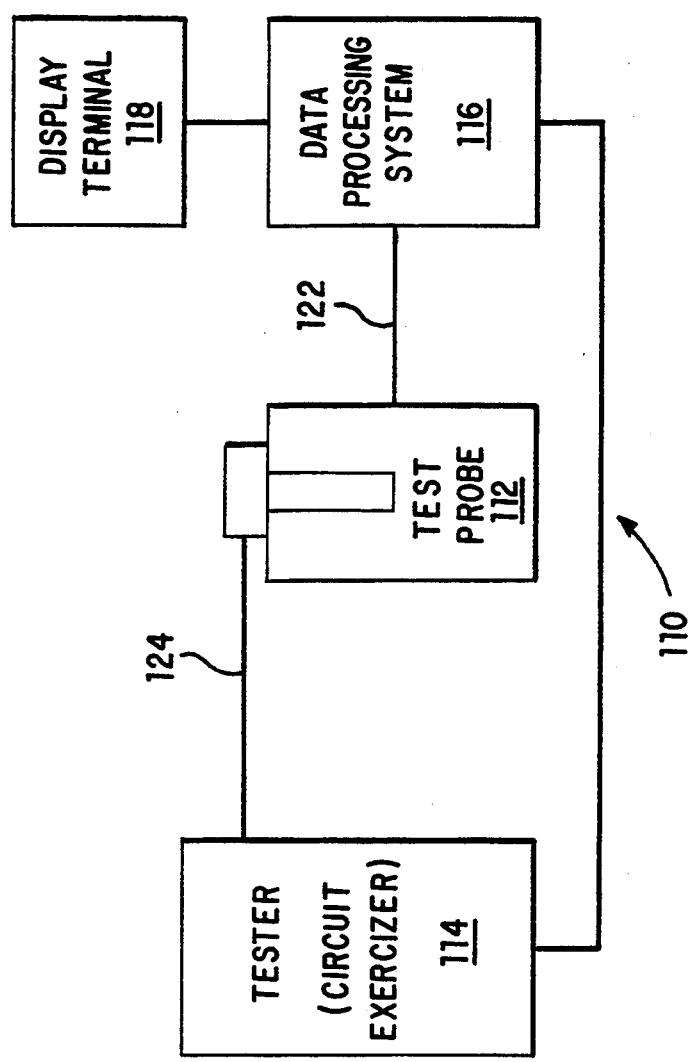
FIG. 1 is a block diagram of a prior-art electron-beam test probe system.
Figure 2:
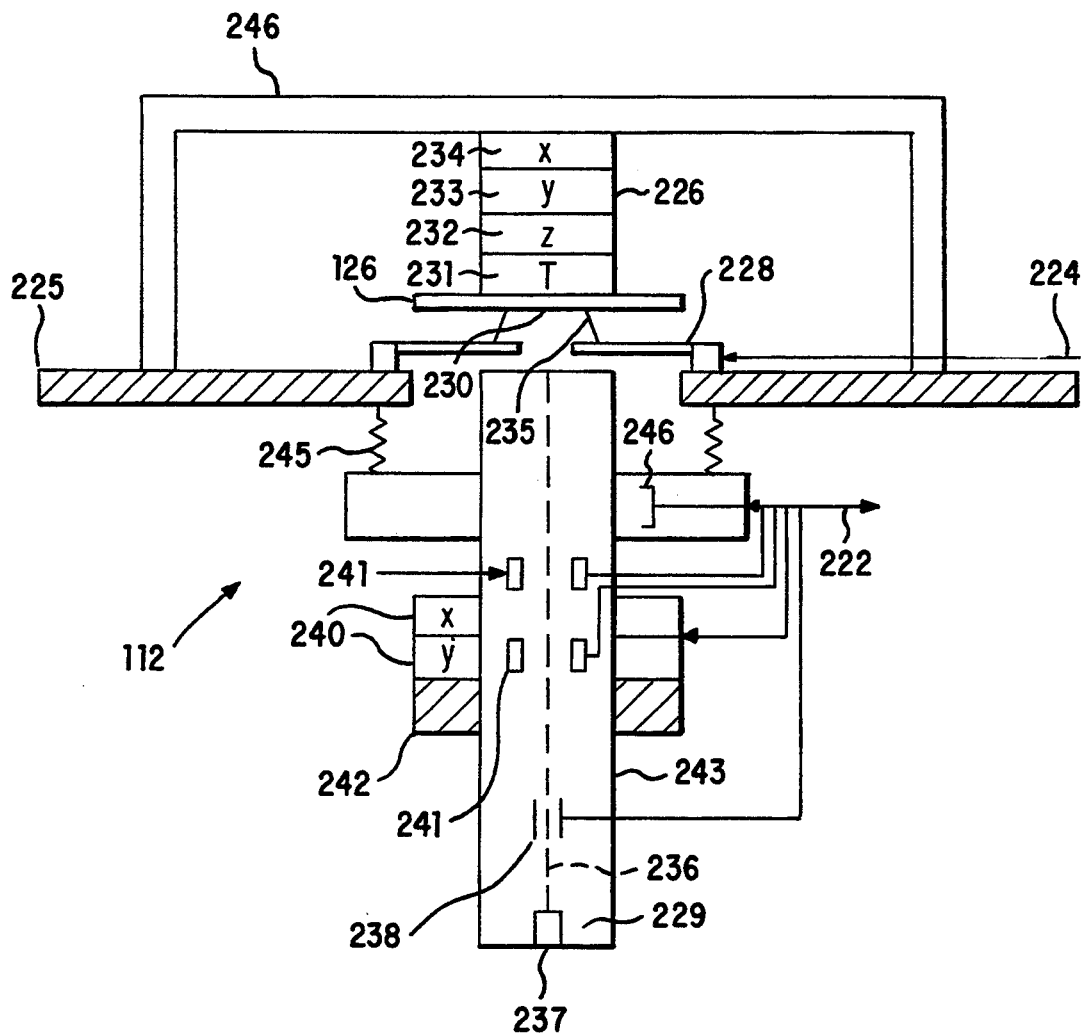
FIG. 2 illustrates a prior-art electron-beam test probe used in the system of FIG. 1.

Features of the present invention have been implemented in an IDS 5000 E-beam probe system of the type described with reference to FIGS. 1 and 2. The system comprises means (e.g., stage 226) for supporting a DUT (e.g., DUT 126) having multiple physical layers and multiple internal nets, a probe (e.g., column 229 for generating a probe beam, or a mechanical probe), first controllable positioning means (e.g., deflection coils 241 in the case of an electron-beam probe, or a fine-adjustment stage for a mechanical probe) for positioning the probe within a field of view defining a probe window, and second controllable positioning means (e.g., stage 240) for positioning the probe window relative to the device. Such systems include a programmable data processing system 116 having data storage means and a terminal 118 for displaying images and other information and through which an operator may communicate with the data processing system (e.g., using a keyboard, a pointer device such as a mouse and/or other means).

Figure 3:
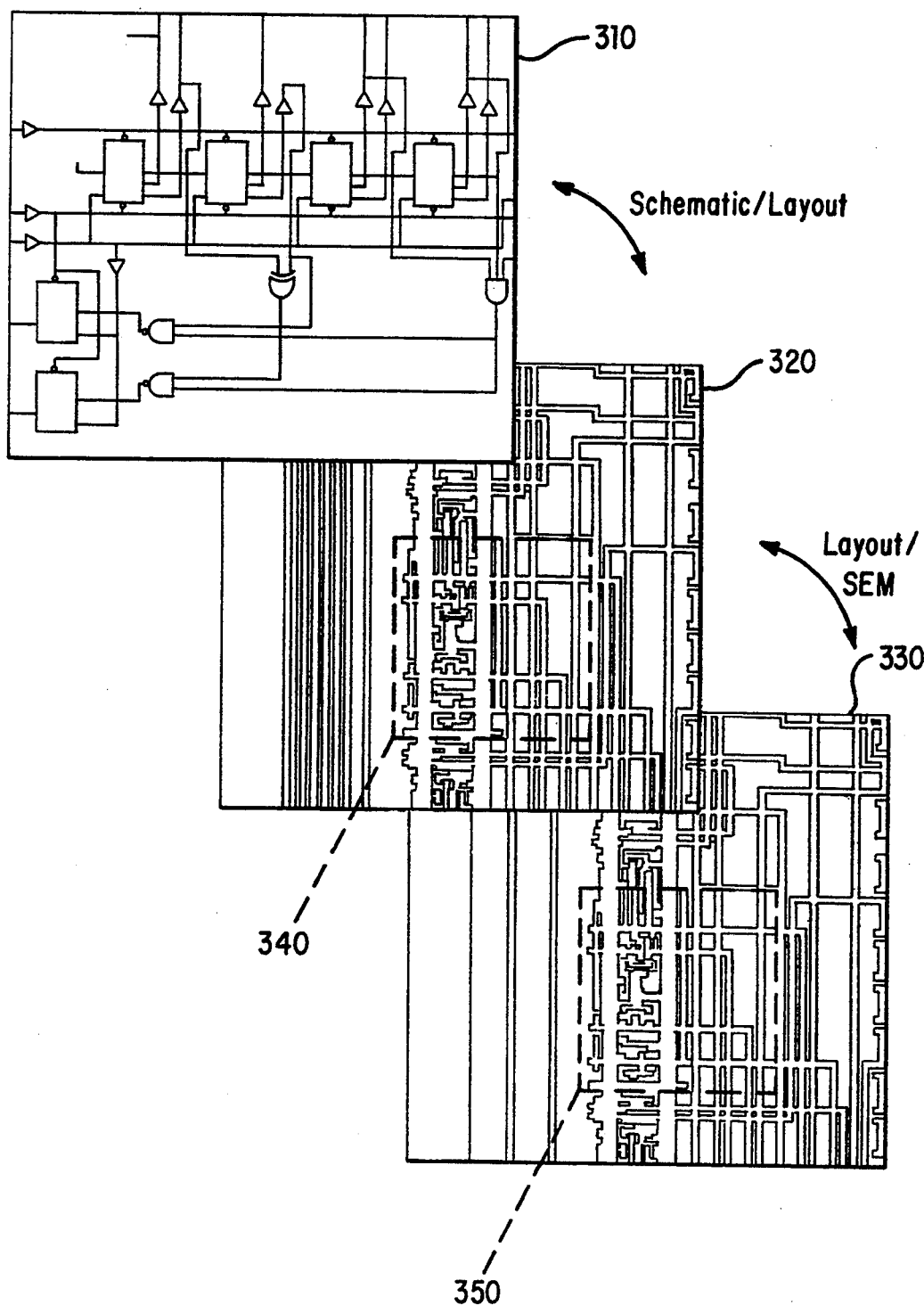
FIG. 3 illustrates an example of linked schematic, layout, and SEM images, with field-of-view windows superposed on the layout and SEM images.

In standard IDS systems, the user may select a net to be highlighted on a screen display such as that shown in FIG. 3. Portions of the physical layer(s) forming the net are then highlighted (shown in a contrasting color) on the images of the display. The user may elect to have displayed or highlighted only those portions of a net which are "visible" to the probe. The "visible" portions are those portions not occluded by a higher layer of the device. To make this possible, the IDS system needs access to a data set which associates geometric information about the physical layers of the DUT with internal electrical connectivity of the DUT, and which distinguishes "visible" portions from occluded portions. Such a data set is typically not generated during design of the DUT, but can be derived from the layout and netlist files which are typically generated during design of the DUT. Tools accessible to the user through display terminal 118 are provided in the standard IDS systems for deriving such a data set in a series of pre-processing operations which will now be described.

CAD Data Processing in Standard IDS Systems

Figure 22:
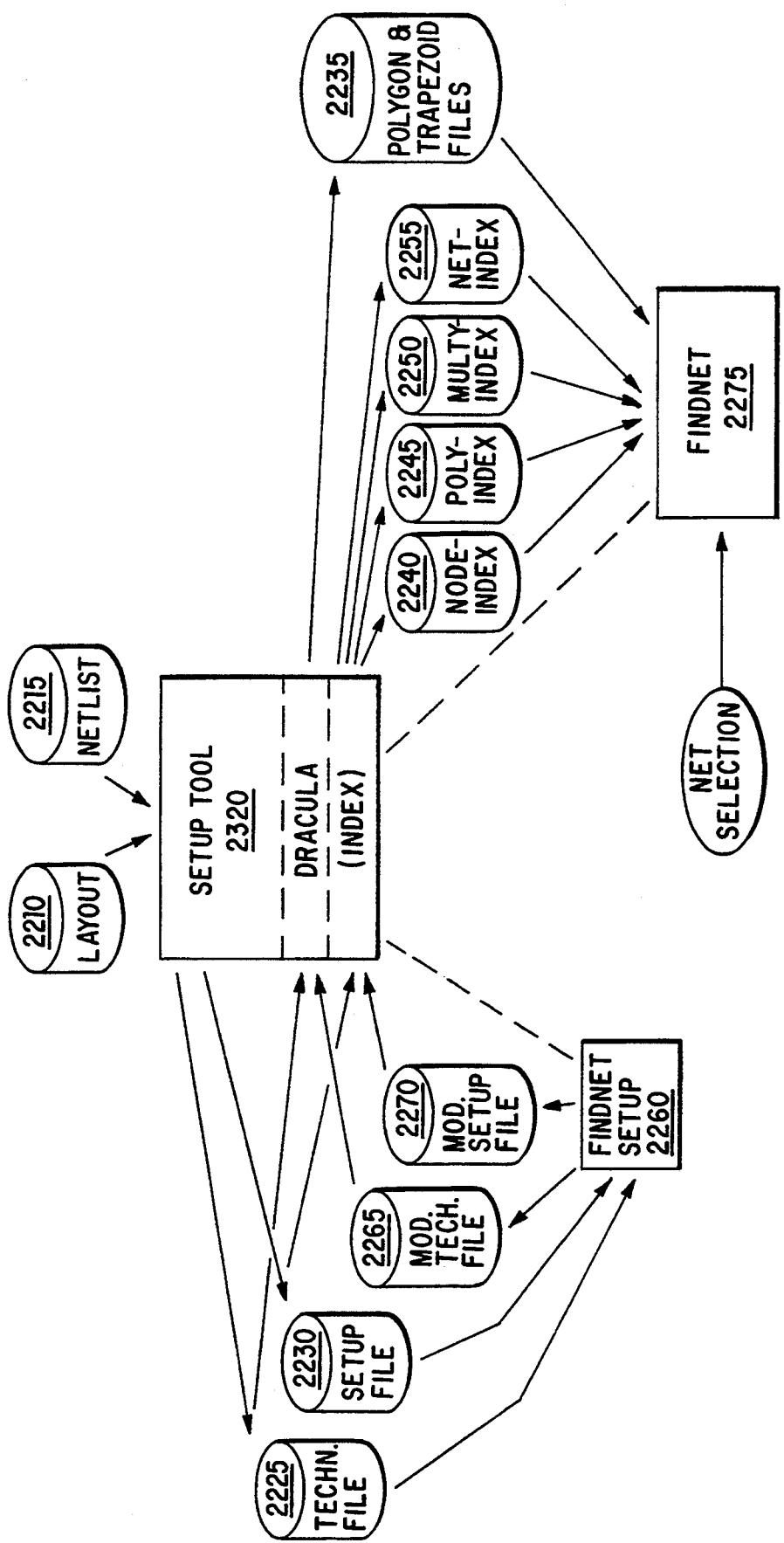
FIG. 22 illustrates pre-processing of CAD data in prior-art IDS systems.

Referring to FIG. 22, a layout file 2210 containing data which describes the geometry of the masks used in manufacturing the DUT is loaded in a data store accessible to data processing system 116. This geometry is described by each physical layer of the DUT as a group of polygons, many of which may be complex polygons. A netlist file 2215 containing data which describes the electrical connectivity of elements within the DUT is also loaded in a data store accessible to data processing system 116. The layout and netlist files are generated as the DUT is designed with computer-aided design (CAD) tools, and may be in any of a number of conventional formats such as GDS2, Apple, or CIF.

A Setup Tool 2220, implemented in software on the IDS systems, is accessed by the user through display terminal 118. Setup Tool 2220 is used to create a Technology file 2225 and a Setup file 2230. Technology file 2225 contains a set of arguments and commands in a format understandable to the "Dracula" program offered commercially by Cadence Technologies of San Jose, Calif. A listing of a Technology file for a 4-layer MOS-technology DUT is provided in Appendix A. Setup file 2230 contains a set of arguments and commands in a format understandable to an Index program which may be invoked from within Setup Tool 2220 or separately. A listing of a Setup file for a 4-layer MOS-technology DUT is provided in Appendix B. In the conventional IDS system, the Dracula program and the Index program may be run from within Setup Tool 2220.

The Dracula program makes use of the arguments and commands of technology file 2225 to perform certain operations on the data in layout file 2210 and netlist file 2215. First, the layout data (which may be in GDS2, Apple, or CIF format) is translated into a common polygon format. Second, the polygons described in layout file 2210 are reduced to trapezoids, and one or more "special" layers (also called "derived" or "pseudo" layers) are created. The "special" layers define physical regions of the DUT which form elements such as transistors. One purpose of such "special" layers can be understood by considering the simple case of a line of a diffusion layer which crosses over a line of a polysilicon layer of the DUT. Because a transistor is formed at the intersection of these two lines, the line of the diffusion layer is electrically a part of two nets. Creation of the "special" layers separates the layout description into regions which are suitable for probing (e.g., trapezoidal regions forming part of a net) and regions which are not (e.g., trapezoidal regions forming part of a transistor). Third, a "layout versus schematic" (LVS) routine matches each trapezoid to the corresponding net or element of the schematic. A trapezoid forming part of a net is identified to that net, for example. The Dracula program thus produces a set of files 2235 which describe the DUT in terms of polygons and trapezoids identified to the electrical connectivity of the DUT.

The Index program of Setup tool 2220 prepares a set of index files which permit nets and other elements of the DUT to be rapidly accessed. Each layout net number is assigned a "Traversal ID" (TID) number and an index of the assignments is placed in a Nodeindex file 2240. Each polygon is matched with a layout net number and an index of the matchings is placed in a Polyindex file 2245. Polygons associated with multiple nets are matched with multiple layout net numbers and an index of the matches is placed in a Multyindex file 2250. Where a polygon encompasses more than one net (e.g., in "special" layers), the Polyindex entry refers to an entry of Multyindex file 2250. A count of the total number of nets and elements, a count of the total number of nets, and a net structure description for each layout net number are prepared and placed in a Netindex file 2255. Index files 2240–2255 allow the IDS system to rapidly locate data from polygon and trapezoid files 2235, e.g., for preparing linked screen displays of layout and schematic images.

The "findnet" Program

As noted above, probe placement for a single, selected net has been automated in a program called findnet. To enable the findnet program, the pre-processing operation of the standard IDS systems is modified so that files 2235 and 2240–2255 also describe and index those portions of the DUT's physical layers which are "visible" to the probe. After preparing technology file 2225 and setup file 2230, a Findnet Setup command script 2260 is executed. Findnet Setup command script 2260 prepares from technology file 2225 and setup file 2230 a modified technology file 2265 and a modified setup file 2270, by adding arguments and commands which define the "visible" layer portions. Appendix C contains a copy of one possible Findnet Setup command script 2260 written as Unix Bourne-shell and Unix "awk" programs, comprising a set of files entitled "findnet-setup", "findnet_layers.awk", "findnet_technology.awk" and findnet_setup.awk". By way of example, the command script of Appendix C was used to generate from the technology file of Appendix A the modified technology file of Appendix D, and to generate from the setup file of Appendix B the modified setup file of Appendix E.

Items included in Appendix D and which are not found in Appendix B include definitions of the resolution to be used in processing ("RESOLUTION . . . "), layers to be treated as hidden ("TEMPORARY-LAYER=HIDDEN"), the portions of layers to be considered "visible" layers (section entitled ";Findnet (visible) layers"), and the layers which are to be associated electrically (section entitled ";Stamp Findnet layers"). Items included in Appendix E and which are not found in Appendix C include an instruction to treat all layers as "special" layers for which polygons are reduced to trapezoids ("special 9METAL2.DAT . . . "), a definition of the preferred order of probing layers where a net may be probed in more than one physical layer ("probe_order . . . "), and a definition of the minimum feature size to be probed ("probe_feature . . . ").

The findnet program uses modified technology file 2265 and modified setup file 2270 (instead of the standard IDS technology file 2225 and setup file 2230) to generate files 2235–2255. Files 2235–2255 then include "visible" layer information which identifies suitable locations for probing nets. With the findnet program, the user selects a single net to be probed. The net may be identified to the IDS system in one of several ways, such as by keyboard entry of a TID number or by "picking" the net on the schematic or layout image of the screen display with a pointer or mouse. An automated Findnet procedure 2275 then performs a set of functions to determine a "best" place to probe the selected net, and returns a set of optimal probe coordinates. The probe beam is then directed to those probe coordinates under control of data processing system 116. Exhibit F contains a listing of a file entitled "findnet.c", which contains a set of C-language functions for performing the Findnet procedure.

CAD Data Processing and FINDNETS in Accordance with the Invention

Figure 23:
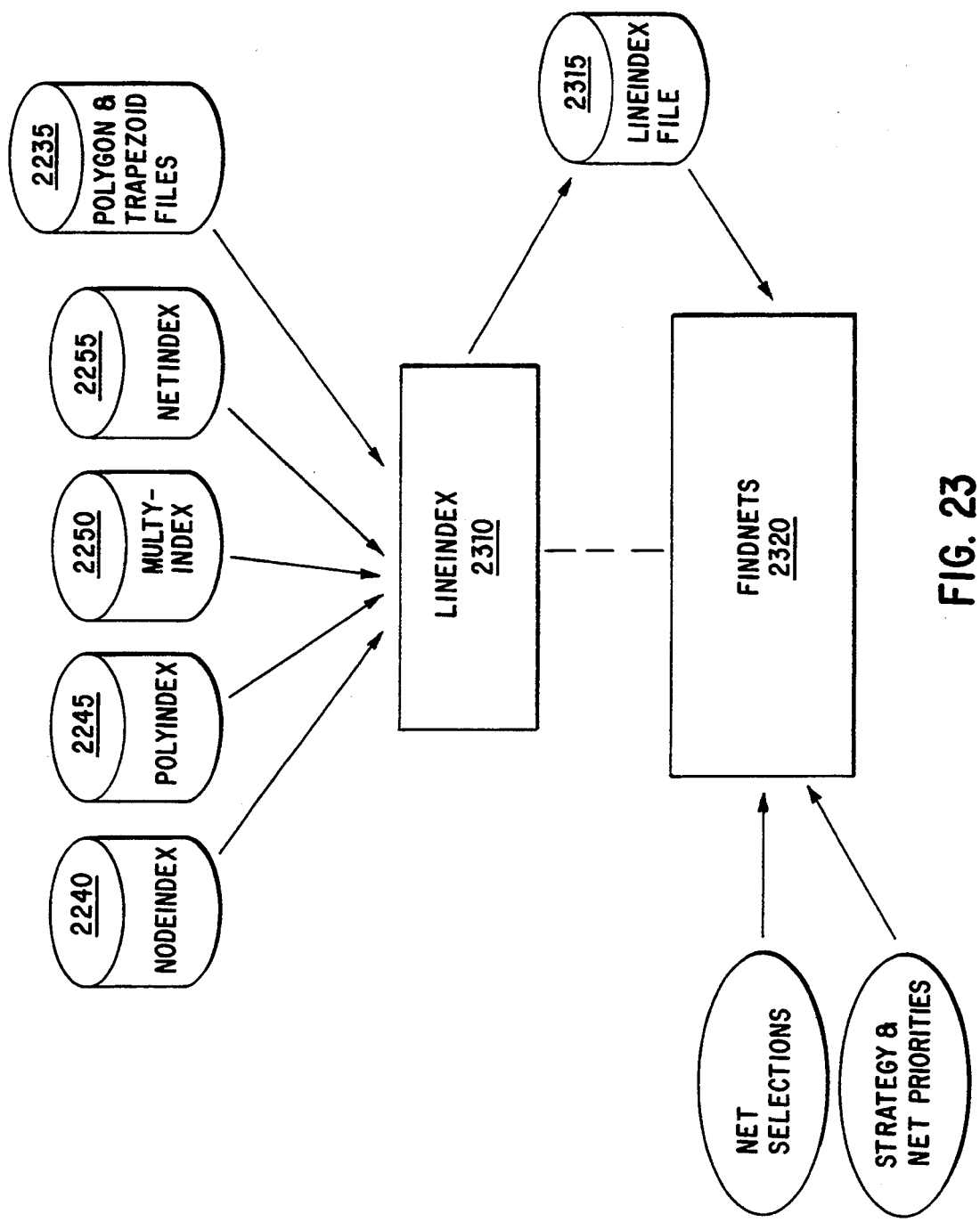
FIG. 23 illustrates additional pre-processing of CAD data in accordance with the present invention.

One preferred implementation of the present invention makes use of the pre-processing of CAD data of the standard IDS systems, and the modified technology file and modified setup file of the findnet program. That is, polygon & trapezoid files 2235 and index files 2240–2255 are created as described with reference to FIG. 22, using modified technology file 2265 and modified setup file 2270. Referring to FIG. 23, a further operation is then performed by a LineIndex routine 2310 to approximate the "visible" trapezoids as fixed-width line segments ("wires"). (The line segments are not necessarily all of the same width, but each line segment is of constant width.) LineIndex routine 2310 prepares a description of each line segment, indexes each line segment description against a TID number, calculates bounding boxes, and places the descriptions, index data and bounding-box data in a LINEINDEX file 2315. One possible implementation of LineIndex routine 2310 is given in Appendix G as a C-language program file entitled "lineindex.c". File "lineindex.c" takes as inputs the NODEINDEX and NETINDEX index files (e.g., files 2240–2255) and the probe order ranking and probe feature size (e.g., from modified setup file 2270), and generates a LINEINDEX file (e.g., file 2315). The "lineindex" program could also be modified easily to take trapezoid files directly as inputs, thus circumventing the need to generate NODEINDEX or NETINDEX files using "index". At this stage, the CAD data processing of "Step 1" of FIG. 4 is completed, and the LINEINDEX file contains a set of data describing the physical geometry of the "visible" regions of the DUT and an index relating the "visible" regions to electrical connectivity.

Once the LINEINDEX file 2315 has been prepared, the user may select a list of nets to be probed. The list may be entered, for example, through a keyboard as a list of TID numbers or by "picking" nets on a schematic image on the display screen. The list may alternatively be generated by an automated backtracing routine or the like. Entered (or generated) along with the list is an indication of whether an "ordered" strategy is to be employed and, if so, the relative priorities of the selected nets. A FINDNETS routine 2320 is then executed, taking as inputs the list of selected nets, the priorities (if any) of the selected nets, and the LINEINDEX file 2315. Execution of Findnets routine 2320 generates a set of coordinates for the "best" probe window location.

One possible implementation of Findnets routine 2320 is provided in Appendix H, which contains a pair of C-language files entitled "findnets.c" and "c_obstacle.c". The function "ads_findnets" takes as input arguments the selected list of TID numbers and the probing strategy/priority information. The LINEINDEX file is read for the appropriate net data. As described with reference to "Step 2" above, bounding boxes (pre-calculated when running LineIndex routine 2310) are used to define the search area, and C-obstacle transformations are performed by calling the "general_transform" function contained in file "c_obstacle.c". A bit plane is mapped for each selected net (as in "Step 3" above), and the maximum overlap of the bit planes is calculated (as in "Step 4" above) by the "find_maximum" function, to determine the best probe window location. Nets which may be probed within the window at this location are added to a "found" list.

The "ads_findnets" function generates the coordinates of the "best" probe window location ("winx", "winy"), the number of selected nets in and out of the window ("hits", "misses"), the TID numbers of the selected nets in and out of the window ("found", "missed"). The "ads_findnets" function also makes use of the Findnet "ads_locate" function to determine the best probe location for each of the selected nets within the window, and provides the location coordinates and physical layer identification of each probe location as outputs ("positions").

Those of skill in the art will recognize that the present invention is not limited to the specific embodiments described above, and that many modifications are possible within the spirit and scope of the invention as defined in the following claims. By way of example, but not of limitation, the LINEINDEX file need not be prepared in the manner described, but may instead be prepared directly from a CAD database describing physical geometry of the DUT and relating the geometry to electrical connectivity. Such information is sometimes prepared during the design of the DUT. Alternatively, the LINEINDEX file need not be prepared at all; the needed physical geometry description and associated electrical connectivity information may be generated when and as needed, though this may result in significant delay from the time a list of nets is selected for probing to the time the probe window is positioned at the "best" location.

While the preferred embodiments have been described with reference to probe systems employing an electron-beam probe, the methods and apparatus of the invention apply as well to other types of systems, including but not limited to systems employing a focused ion beam, a laser-beam, or a mechanical microprobe. As used herein, the term "probe" includes beams used not only for voltage or waveform measurement, but also for modification of a DUT (e.g., an ion beam or laser beam used for modifying a DUT by cutting conductors or removing or depositing material).

Appendix A

```
*DESCRIPTION
 SYSTEM       - CIF
 PRIMARY      - toplevel_sc
 INDISK       - /use9/chips/spock/cad/spock.cif
 OUTDISK      - /use9/chips/spock/cad/discard
 SCALE        - 0.01 MIC
 RESOLUTION   - 0.25 MIC
 PRINTFILE    -. ecad
 LISTERROR    - YES
 PROGRAM-DIR  - /usr/ids5000/ecad/
 SCHEMATIC    - LVSLOGIC.DAT
 KEEPDATA     - SMART
*END
;------------------------------------------
```

```
*INPUT-LAYER
  NWELL    = CNW
  PWELL    = CPW
  PDIFF    = CPD
  NDIFF    = CND
  POLY     = CP
  CONTACT  = CC
  METAL    = CM
  VIA      = CC2
  METAL2   = CM2
  PASS     = CG
  SUBSTRATE = BULK 63
  CONNECT-LAYER = PSD NSD POLY METAL METAL2
  EXPORT = 9NWELL NWELL
  EXPORT = 9PWELL PWELL
  EXPORT = 9PDIFF PDIFF
  EXPORT = 9NDIFF NDIFF
  EXPORT = 9POLY POLY
  EXPORT = 9CONTACT CONTACT
  EXPORT = 9METAL METAL
  EXPORT = 9VIA VIA
  EXPORT = 9METAL2 METAL2
  EXPORT = 9PASS PASS
  EXPORT = NSD
  EXPORT = PSD
  ;Elements
  EXPORT = MOSXN8G MOSXP8G
  ;Tree file
  EXPORT = TREEtopl
  *END
;----------------------------------------
*OPERATION
*BREAK LAY
  AND NDIFF POLY NGATE
  AND PDIFF POLY PGATE
  NOT NDIFF NGATE NSD
  NOT PDIFF PGATE PSD
;----------------------------------------
*BREAK CON
  CONNECT METAL NSD BY CONTACT
  CONNECT METAL PSD BY CONTACT
  CONNECT METAL POLY BY CONTACT
  CONNECT METAL2 METAL BY VIA
;----------------------------------------
  ELEMENT MOS[N] NGATE POLY NSD
  ELEMENT MOS[P] PGATE POLY PSD
*END
;-------- END OF FILE -----------------
```

Appendix B

```
colormap spock
tree TREEtopl.DAT
design toplevel_sc
scale 0.01
resolution 0.01
layer 9PDIFF.DAT PSD.DAT MOSXP8G.DAT
layer 9NDIFF.DAT NSD.DAT MOSXN8G.DAT
layer 9PWELL.DAT
layer 9NWELL.DAT
layer 9POLY.DAT POLY.DAT
layer 9METAL.DAT METAL.DAT
layer 9METAL2.DAT METAL2.DAT
layer 9CONTACT.DAT
layer 9VIA.DAT
layer 9PASS.DAT
count 9METAL2.DAT 9METAL.DAT 9POLY.DAT 9NDIFF.DAT 9PDIFF.DAT
element MOSXP8G.DAT MOSXN8G.DAT
special 9PDIFF.DAT 9NDIFF.DAT
textfile 6LAYTXT.DAT
schemtop toplevel_sc
layoutspice LVS.spi
spice mux.spi
edif mux.sch
```

Appendix C

```sh
#!/bin/sh
#**********************************************************************
#*                                                                    *
#*      Copyright (c) Schlumberger Technologies, 1989. All rights reserved. *
#*      No part of this program may be photocopied, reproduced, or    *
#*      translated to another programming language without the prior  *
#*      written consent of Schlumberger Technologies.                 *
#*                                                                    *
#**********************************************************************

# File:   findnet_setup
# Author: Alan C. Noble

# Master script for modifying DRACULA technology file for visible layer
# derivation

VERSION="0.1"
DATE="`date`"
echo "*** findnet_setup V" $VERSION " ***"

echo "Design - " ${DESIGNS}/${CURRENT_DESIGN}
echo "Extracting layer information "
rm -f /usr/tmp/findnet_layers.tmp
awk -f ${FINDNET_SETUP_DIR}/findnet_layers.awk VERSION=$VERSION DATE="$DATE" \
   ${DESIGNS}/${CURRENT_DESIGN}/technology/${CURRENT_DESIGN}.ecad > \
   /usr/tmp/findnet_layers.tmp
echo "The following connect layers were found."
echo "The corresponding input layers are shown below."
cat /usr/tmp/findnet_layers.tmp
echo -n "Are these layers correct and in top-down order? (y/n) "
read ans
while test $ans = "n"
do
   echo "Enter all connect layers in top-down order on one line, "
   echo "followed by the corresponding input layers on a second line."
   echo "The third line is the number or database units per micron"
   echo "(as specified in the INPUT-LAYER section of the technology file.)"
   echo "Hit CONTROL-D after hitting a cariage return on the second line."
   rm -f /usr/tmp/findnet_layers.tmp
   cat > /usr/tmp/findnet_layers.tmp
   echo -n "OK? (y/n) "
   read ans
done if test -f /usr/tmp/findnet.tmp
then rm -f /usr/tmp/findnet.tmp
fi
echo -n "Modify technology file? (y/n) "
read ans
if test $ans != "n"
then
   echo " Modifying technology file ..."
   awk -f ${FINDNET_SETUP_DIR}/findnet_technology.awk DATE="$DATE" VERSION=$VERSION \
      /usr/tmp/findnet_layers.tmp \
      ${DESIGNS}/${CURRENT_DESIGN}/technology/${CURRENT_DESIGN}.ecad > \
      /usr/tmp/findnet.tmp
   rm -f ${DESIGNS}/${CURRENT_DESIGN}/technology/${CURRENT_DESIGN}.ecad
   mv /usr/tmp/findnet.tmp \
      ${DESIGNS}/${CURRENT_DESIGN}/technology/${CURRENT_DESIGN}.ecad
fi echo -n "Modify setup file? (y/n) "
read ans
if test $ans != "n"
then
   echo " Modifying setup file ..."
   awk -f ${FINDNET_SETUP_DIR}/findnet_setup.awk DATE="$DATE" VERSION=$VERSION \
      /usr/tmp/findnet_layers.tmp \
      ${DESIGNS}/${CURRENT_DESIGN}/setup/${CURRENT_DESIGN} > \
```

```
       /usr/tmp/findnet.tmp
    mv /usr/tmp/findnet.tmp \
       ${DESIGNS}/${CURRENT_DESIGN}/setup/${CURRENT_DESIGN}
.fi
echo "Done.  Now run DRACULA."

#**************************************************************************
#*                                                                        *
#*    Copyright (c) Schlumberger Technologies, 1989.  All rights reserved. *
#*    No  part  of  this program may be photocopied, reproduced, or       *
*    translated to another programming language without the  prior       *
*    written consent of Schlumberger Technologies.                       *
*                                                                        *
#**************************************************************************

# File:    findnet_layers.awk
# Author: Alan C. Noble

# Awk program for finding the connect layers.

# First note what the connect layers are then find out what the
# corresponding polygon layers are named.
Note how many database units per micron BEGIN {
  # The layers that Findnet deals with
  MET2  = 1;
  MET1  = 2;
  POLY  = 3;
  DIFF2 = 4;
  DIFF1 = 5;
}

{
  if($1 == "SCALE") {
    size = 1 / $3;
  } else if($1 == "CONNECT-LAYER") {
    connect[MET2]  = $(NF);
    connect[MET1]  = $(NF-1);
    connect[POLY]  = $(NF-2);
    connect[DIFF2] = $(NF-3);
    connect[DIFF1] = $(NF-4);
    polygon[MET2]  = "";
    polygon[MET1]  = "";
    polygon[POLY]  = "";
    polygon[DIFF2] = "";
    polygon[DIFF1] = "";
  } else if($1=="NOT" || $1=="AND") {
    for(i=1; i<=5; i++) {
      if(polygon[i] == "" && connect[i] == $4) {
        # the connect layer is derived from $2
        polygon[i] = $2;
        next;
      }
    }
  }
  next;
}

END {
  for(i=1; i<=5; i++) {
    printf "%s ", connect[i];
  }
  printf "\n";
  for(i=1; i<=5; i++) {
    if(polygon[i] == "") {
      # connect layer is not derived
      printf "%s ", connect[i];
    } else {
      # connect layer is derived
      printf "%s ", polygon[i];

}
  }
```

```
  printf "\n";
  print size, " DBU / MICRON";
}

#*************************************************************************
#*                                                                        *
#*      Copyright (c) Schlumberger Technologies, 1989. All rights reserved. *
#*      No  part  of  this program may be photocopied, reproduced, or     *
#*      translated to another programming language without the  prior     *
#*      written consent of Schlumberger Technologies.                     *
#*                                                                        *
#*************************************************************************

# File:   findnet_techology.awk
# Author: Alan C. Noble

# Awk program for modifying the DRACULA technology file.

BEGIN {
  section = "";
  # The layers that Findnet deals with
  MET2  = 1;
  MET1  = 2;
  POLY  = 3;
  DIFF2 = 4;
  DIFF1 = 5;
}

{
  if(NR ==1) {
    # 1st record contains connect layers
    connect[MET2]  = $1;
    connect[MET1]  = $2;
    connect[POLY]  = $3;
    connect[DIFF2] = $4;
    connect[DIFF1] = $5;
    print "; Modified by findnet_setup V",VERSION," on ",DATE;
    next; # skip to next record without printing } else if(NR ==2) {
    # 2nd record contains input layers
    input[MET2]  = $1;
    input[MET1]  = $2;
    input[POLY]  = $3;
    input[DIFF2] = $4;
    input[DIFF1] = $5;
    next; # skip to next record without printing } else if(NR ==3) {
    # 3rd contains expansion size
    size = $1;
    next; # skip to next record without printing
  } else if(substr($1,0,1)=="*") { if($1=="*INPUT-LAYER") {
      block = "INPUT-LAYER";

} else if($1=="*OPERATION") {
      block = "OPERATION";
    } else if($1=="*BREAK") { if(section =="EXT" || section =="LAY" ) {
        # Add visible layers
        print ";Findnet (visible) layers";
        print " SIZE  ", connect[MET2], " BY ", size
        print " NOT   ", connect[MET1], "   ", connect[MET2], "   VMET1","       ;[:

print " OR    ", connect[MET2], "   ", connect[MET1], "   HIDDEN","        ;
        print " NOT   ", connect[POLY], "   HIDDEN VPOLY","       ;[findnet]";
        print " OR    HIDDEN VPOLY  HIDDEN","         ;[findnet]";
        print " NOT   ", connect[DIFF1], "   HIDDEN VDIFF1","      ;[findnet]";
        print " NOT   ", connect[DIFF2], "   HIDDEN VDIFF2","      ;[findnet]";
```

```awk
      } else if(section =="CON") {
        # Stamp Findnet layers
        print ";Stamp Findnet layers"
#       print "STAMP VMET2 BY  ", connect[MET2],"     ;[findnet]";
        print "STAMP VMET1 BY  ", connect[MET1],"     ;[findnet]";
        print "STAMP VPOLY BY  ", connect[POLY],"     ;[findnet]";
        print "STAMP VDIFF2 BY ", connect[DIFF2],"    ;[findnet]";
        print "STAMP VDIFF1 BY ", connect[DIFF1],"    ;[findnet]";
      }
      section =$2;  # new section } else if($1=="*END") {
      # end of a block
      if(block == "INPUT-LAYER") {
        # add exports
        print ";Export Findnet (visible) layers ";
        print " EXPORT = VDIFF1","    ;[findnet]";
        print " EXPORT = VDIFF2","    ;[findnet]";
        print " EXPORT = VPOLY","     ;[findnet]";
        print " EXPORT = VMET1","     ;[findnet]";
#       print " EXPORT = VMET2","     ;[findnet]";
      }
    }
    } else if($1 == "CONNECT-LAYER") {
      print " TEMPORARY-LAYER = HIDDEN","    ;[findnet]";
    } else if($1== "EXPORT") {
      # don't export useless trap files
      for(i=2; i<=4; i++) {
        if(input[i] == substr($3,2)) {
          print $1,$2,$3;
          next;
        }
      }
    }
    # print the line unchanged
    print;
  }
#*********************************************************************
#*                                                                   *
#*   Copyright (c) Schlumberger Technologies, 1989.  All rights reserved. *
#*   No  part  of  this program may be photocopied, reproduced, or   *
#*   translated to another programming language without the  prior   *
#*   written consent of Schlumberger Technologies.                   *
#*                                                                   *
#*********************************************************************

# File:   findnet_setup.awk
# Author: Alan C. Noble

# Awk program for modifying the IDS setup file (used by the index program)

# First note what the connect layers are then find out what the
# corresponding polygon layers are named.
Note how many database units per micron
BEGIN {
  # The layers that Findnet deals with.
  MET2  = 1;
  MET1  = 2;
  POLY  = 3;
  DIFF2 = 4;
  DIFF1 = 5;
}
{
  if(NR ==1) {
    # 1st record contains connect layers
    connect[MET2]  = $1;
    connect[MET1]  = $2;
    connect[POLY]  = $3;
    connect[DIFF2] = $4;
    connect[DIFF1] = $5;
    # no vlayer for MET2
    vlayer[MET1]  = "VMET1.DAT";
    vlayer[POLY]  = "VPOLY.DAT";
    vlayer[DIFF2] = "VDIFF2.DAT";
    vlayer[DIFF1] = "VDIFF1.DAT";
```

```
    print "* Modified by findnet_setup V",VERSION," on ",DATE;
    print "* Derived visible (pseudo) layers are used for highlighting."
    print "* Therefore all count layers are all declared as special layers."
    next; # skip to next record without printing } else if(NR ==2) {
    # 2nd record contains input layers
    input[MET2] = $1;
    input[MET1] = $2;
    input[POLY] = $3;
    input[DIFF2] = $4;
    input[DIFF1] = $5;
    next; # skip to next record without printing } else if($1=="layer") {
    # remove "9" prefix and ".DAT" extension layer = substr($2,2,length($2)-5);
    for(i=1; i<=5; i++) {
       if(input[i]==layer) {
          if(i==MET2) {
             print; # no special vlayer for MET2
          } else {
             print $1, $2, vlayer[i], $4,$5,$6,$7,$8,$9;
          }
          count[i] = $2;

next;
       }
    }
} else if($1=="special") {
    printf "special ";
    # add the other layers, since everything is special in findnet
    for(i=1; i<=5; i++) {
       if(count[i] != "")
          printf "%s ", count[i];
    }
    printf "\n";
    next;
  }
  print;
}
```

Appendix D

```
; Modified by findnet_setup V 0.1
*DESCRIPTION
SYSTEM       = CIF
PRIMARY      = toplevel_sc
INDISK       = /use9/chips/alan/spock/cad/spock.cif
OUTDISK      = /use9/chips/alan/spock/cad/discard
SCALE        = 0.01 MIC
RESOLUTION   = 0.01 MIC
PRINTFILE    = ecad
LISTERROR    = YES
PROGRAM-DIR  = /usr/ids5000/ecad/
SCHEMATIC    = LVSLOGIC.DAT
KEEPDATA     = YES
DELCEL       = spock_cram
*END
;----------------------------------------
*INPUT-LAYER
  NWELL    = CNW
  PWELL    = CPW
  PDIFF    = CPD
  NDIFF    = CND
  POLY     = CP
  CONTACT  = CC
  METAL    = CM
  VIA      = CC2
  METAL2   = CM2
  PASS     = CG
  SUBSTRATE = BULK 63
```

```
   TEMPORARY-LAYER = HIDDEN              ;[findnet]
   CONNECT-LAYER = PSD NSD POLY METAL METAL2
   EXPORT = 9NWELL NWELL
   EXPORT = 9PWELL PWELL
   EXPORT = 9PDIFF PDIFF
   EXPORT = 9NDIFF
   EXPORT = 9POLY
   EXPORT = 9CONTACT CONTACT
   EXPORT = 9METAL
   EXPORT = 9VIA VIA
   EXPORT = 9METAL2 METAL2
   EXPORT = 9PASS PASS
   EXPORT = NSD
   EXPORT = PSD
   ;Elements
   EXPORT = MOSXN8G MOSXP8G
   ;Tree file
EXPORT = TREEtop1
;Export Findnet (visible) layers
   EXPORT = VDIFF1          ;[findnet]
   EXPORT = VDIFF2          ;[findnet]
   EXPORT = VPOLY           ;[findnet]
   EXPORT = VMET1           ;[findnet]
*END
;--------------------------------------------------
*OPERATION
*BREAK LAY
 AND NDIFF POLY NGATE
 AND PDIFF POLY PGATE
 NOT NDIFF NGATE NSD
 NOT PDIFF PGATE PSD
;--------------------------------------------------
;Findnet (visible) layers
  NOT    METAL    METAL2    VMET1       ;[findnet]
  OR     METAL2   METAL     HIDDEN      ;[findnet]
  NOT    POLY     HIDDEN VPOLY          ;[findnet]
  OR     HIDDEN VPOLY  HIDDEN           ;[findnet]
  NOT    PSD      HIDDEN VDIFF1         ;[findnet]
  NOT    NSD      HIDDEN VDIFF2         ;[findnet]
;--------------------------------------------------
*BREAK TEXT
EDTEXT PADS.TEXT
;--------------------------------------------------
*BREAK CON
  CONNECT METAL NSD BY CONTACT
  CONNECT METAL PSD BY CONTACT
  CONNECT METAL POLY BY CONTACT
  CONNECT METAL2 METAL BY VIA
;--------------------------------------------------
  ELEMENT MOS[N] NGATE POLY NSD
  ELEMENT MOS[P] PGATE POLY PSD
;--------------------------------------------------
;Stamp Findnet layers
STAMP VMET1  BY    METAL      ;[findnet]
STAMP VPOLY  BY    POLY       ;[findnet]
STAMP VDIFF2 BY    NSD        ;[findnet]
STAMP VDIFF1 BY    PSD        ;[findnet]
*BREAK LVS
LVSCHK[FX]
*END
;------- END OF FILE ------------------
```

Appendix E

```
* Modified by findnet_setup V 0.1
* Derived visible (pseudo) layers are used for highlighting.
* Therefore all count layers are also declared as special layers.
colormap spock
tree TREEtop1.DAT
design toplevel_sc
scale 0.01
resolution 0.01
layer 9PDIFF.DAT VDIFF1.DAT MOSXP8G.DAT
layer 9NDIFF.DAT VDIFF2.DAT MOSXN8G.DAT
layer 9PWELL.DAT
```

```
layer 9NWELL.DAT
layer 9POLY.DAT VPOLY.DAT
layer 9METAL.DAT VMET1.DAT
layer 9METAL2.DAT METAL2.DAT
layer 9CONTACT.DAT
layer 9VIA.DAT
layer 9PASS.DAT
count 9METAL2.DAT 9METAL.DAT 9POLY.DAT 9NDIFF.DAT 9PDIFF.DAT
element MOSXP8G.DAT MOSXN8G.DAT
special 9METAL2.DAT 9METAL.DAT 9POLY.DAT 9NDIFF.DAT 9PDIFF.DAT
textfile 6LAYTXT.DAT
schemtop toplevel_sc
spice mux.spi
edif mux.sch
layoutspice LVS.spi
# Additional ADS parameters
cell_library vtilibl.5
probe_order 6 5 4 1 0
probe_feature 1.6
voltage_swing 5.0
thresholding relative
calibration_nets G-NET7 NET107
#tids for the above nets: 112 45
#calibration_nets XOUT CB[0] G-NET7 NET107
#tids for the above nets: 28 33 112 45
calibration_correlations 6
output_frequency 10000
measured_output benchmark_meas
compare_tolerance 50.0
acquire_tolerance 3
routing_capacitance 0.1 0.1 - - 0.06 0.03 0.03 - - -
routing_width        1.6 1.6 - - 1.6  1.6  2.4  - - -
layout_image /var/tmp/uaimage.layout
image_scale 1.09
align_magnification 0.241
align_search_area 25
# for demo
# sem_center 230 237
# for indium
sem_center 255 227
```

Appendix F

```
/************************************************************************\
 *                                                                        *
 *    Copyright (c) Schlumberger Technologies, 1989.  All rights reserved.*
 *    No  part  of  this program may be photocopied, reproduced, or       *
 *    translated to another programming language without the  prior       *
 *    written consent of Schlumberger Technologies.                       *
 *                                                                        *
 \************************************************************************/

/*
 * This file contains functions for locating the best place to probe a
 * single net.
 *
 * Author: Alan C. Noble
 * Date:
 * File:    findnet.c
 */

/*
 * $Id: findnet.c,v 1.3          21:32:10 noble Exp $
 * $Log:  findnet.c,v $
 * Revision 1.3           21:32:10  noble
 *
 *
 * Revision 1.2           18:20:02  noble
 * Replaced fn_errno with ads_errno.
 *
 * Revision 1.1.          07:47:09  noble
 * Initial revision
```

```c
*
*
*/ include <stdio.h>
include <setup.h>
#include <utilities.h>
#include <lineindex.h>
include <findnets.h>

/*
 * Arrays used for initalizing pointers
 */
static Netsegment initial_bestsegment = { 0,0, {0,0}, {0,0}, 0, 0};
static int initial_index[MAXLAYERS];

/*MAN ADS
NAME
     ads_get_layer_data--get layer data for a design
SYNOPSIS
     ads_get_layer_data(setupdata, data)
     Adsparams *setupdata;
     Layerdata *data;
DESCRIPTION
     ads_get_layer_data() gets layer data `data' necessary for
     findnets from `setupdata'.  If `setupdata' is NULL, the setup
     file is read.
RETURN VALUE
     0 on sucess, -1 on failure
AUTHOR
     Alan C Noble
UPDATES
                    Created
*/ ads_get_layer_data(setupdata, data)
Adsparams *setupdata;
Layerdata *data;
{
  Adsparams params, *p;
  register int i;

if(setupdata == NULL) {
    p = ¶ms;
    if(ads_parse_setup(&params) != 0 ) {
      ads_errno = ADS_SETUP_FILE_ERROR;
      return -1;
    }
  } else {
    p = setupdata;
  } if (p->probe_layers < 1 ) {
    fprintf(stderr,"ads_init_findnets: No probe_layers in setup file!");
    return -1;
  }
  data->order = p->probe_order;
  data->norder = p->probe_layers;
  data->index = initial_index;
  data->nindex = MAXLAYERS;
  ASSERTNZ(data->segment = (Netsegment**)
       malloc(data->norder * sizeof(Netsegment*)));

/* initialize layer index to -1*/
  for(i = 0; i < data->nindex; i++) {
    data->index[i] = -1;
  }
  /* set data->index[i] to the index of layer i in data->order */
  for(i = 0; i < data->norder; i++) {
    data->index[data->order[i]] = i;
  }
```

```
#ifdef FN_DEBUG
  printf("Probe order: ");
  for(i=0; i < data->norder; ++i) {
    printf("%d ", data->order[i]);
  }
  printf("\n\n");
#endif
  return 0;
}

/*MAN ADS
NAME
    ads_locate--locate place to probe a net, given the net segments
SYNOPSIS BELOW
DESCRIPTION
    ads_locate() finds the highest, largest geometry of a net, in the
    region specified by the bouding box `bbox`, given the segments of
    the net.

`seg` is the array of `nseg` segments. `bbox` is the bounding box of
    the search area. This MUST be initialzed before calling ads_locate().
    `flags` is either IDS_END or IDS_CENTER. `inside` is set to 1 if
    the net has a portion which is inside the global `bbox`,
    otherwise 0.  (`x`, `y`) and `layer` are the calculated probe
    location and layer respectively.
RETURN VALUE
    0 on success, -1 otherwise.
AUTHOR
    Alan C Noble
UPDATES
    17 Sep 1989   Created
*/ int ads_locate(seg, nseg, bbox, data, flags, inside, x, y, layer)
Netsegment *seg;
int nseg;
POINT *bbox;
Layerdata *data;
int flags;
int *inside, *x, *y, *layer;
{
  Netsegment **bestsegment;

register int i,l;

ads_errno = 0;
*inside = 0;

/* First, set (re)initialize the segment pointers for each probe layer */
for(i=0; i < data->norder; ++i) {
  data->segment[i] = &initial_bestsegment;
}

/*
 * Find the best segment for each layer
 */
for(i=0; i < nseg; i++) {
  l = seg[i].layer;
  /*
   * don't consider segment if it is not a probe layer or
   * it is outside the original search area
   */
  if((data->index[l] == -1) || (seg[i].angle == -1)) {
    continue;
  } if((seg[i].end.y < LOWERY(bbox) ) ||
     (seg[i].start.y > UPPERY(bbox)) ||
     (seg[i].end.x < LOWERX(bbox)) ||
     (seg[i].start.x > UPPERX(bbox))) {
    /* segment is outside bbox so ignore it */
    seg[i].angle = -1;
    continue;
```

```c
}
/*
 * clip segment so that all of it is within layout window
 */
switch(seg[i].angle) {
case 0:
  {
   if(seg[i].start.x < LOWERX(bbox)) {
     seg[i].length -= (LOWERX(bbox) - seg[i].start.x);
     seg[i].start.x = LOWERX(bbox);
   }
   if(seg[i].end.x > UPPERX(bbox)) {
     seg[i].length -= (seg[i].start.x - UPPERX(bbox));
     seg[i].end.x = UPPERX(bbox);
   }
   if(seg[i].start.y < LOWERY(bbox)) {
     seg[i].width -= (LOWERY(bbox) - seg[i].start.y);
     seg[i].start.y = LOWERY(bbox);
    }
    if(seg[i].end.y > UPPERY(bbox)) {
      seg[i].width -= (seg[i].end.y - UPPERY(bbox));
      seg[i].end.y = UPPERY(bbox);
    }
   }
    break;

case 2:
   {
    if(seg[i].start.x < LOWERX(bbox)) {
      seg[i].width -= (LOWERX(bbox) - seg[i].start.x);
      seg[i].start.x = LOWERX(bbox);
    }
    if(seg[i].end.x > UPPERX(bbox)) {
      seg[i].width -= (seg[i].end.x - UPPERX(bbox));
      seg[i].end.x = UPPERX(bbox);
    }
    if(seg[i].start.y < LOWERY(bbox)) {
      seg[i].length -= (LOWERY(bbox) - seg[i].start.y);
      seg[i].start.y = LOWERY(bbox);
    }
    if(seg[i].end.y > UPPERY(bbox)) {
      seg[i].length -= (seg[i].end.y - UPPERY(bbox));
      seg[i].end.y = UPPERY(bbox);
    }
   }
    break;

case 1:
  case 3:
     fprintf(stderr,"Warning: non-manhattan angle (%d degrees)\n",
         seg[i].angle * 45);
     break;

default:
     fprintf(stderr,"ads_locate: illegal segment angle %d\n",
         (int)seg[i].angle );
     ads_errno = ADS_ILLEGAL_ANGLE;
     return -1;
  }
  (*inside)++;
  if((seg[i].width > data->segment[data->index[1]]->width) ||
     ((seg[i].width == data->segment[data->index[1]]->width) &&
     (seg[i].length > data->segment[data->index[1]]->length))) {
     data->segment[data->index[1]] = &seg[i];
  }
 }
 if(*inside == 0) {
   ads_errno = ADS_NET_OUTSIDE_WINDOW;
   /* No segments were found inside the given bbox */
   return 0;
 }
/*
```

```
 * Now find the highest layer segment found for this net
 */
for(i=0; i< data->norder; ++i) {
  if(data->segment[i] != &initial_bestsegment) {
    if(flags & IDS_END) {
    int center;
    /* take the end closest to the center of the bbox */
    switch(data->segment[i]->angle) {
    case 0:
      {
        center = AVG(LOWERX(bbox), UPPERX(bbox));
        if(ABS(data->segment[i]->start.x - center) <
           ABS(data->segment[i]->end.x - center) ) {
          *x = data->segment[i]->start.x + (data->segment[i]->width / 2);
        } else {
          *x = data->segment[i]->end.x - (data->segment[i]->width / 2);
        }
        *y = AVG(data->segment[i]->start.y,data->segment[i]->end.y);
      }
      break;
    case 2:
      {
        *x = AVG(data->segment[i]->start.x,data->segment[i]->end.x);
        center = AVG(LOWERY(bbox), UPPERY(bbox));
        if(ABS(data->segment[i]->start.y - center) <
           ABS(data->segment[i]->end.y - center) ) {
          *y = data->segment[i]->start.y + (data->segment[i]->width / 2);
        } else {
          *y = data->segment[i]->end.y - (data->segment[i]->width / 2);
        }
      }
      break;
    default:
      ads_errno = ADS_ILLEGAL_ANGLE;
      return -1;
    }

} else {
    /* Center of segment */
        *x = AVG(data->segment[i]->start.x, data->segment[i]->end.x);
    *y = AVG(data->segment[i]->start.y, data->segment[i]->end.y);

}

*layer = data->segment[i]->layer;
    return 0;
  }
  }
  fprintf(stderr, "ads_locate, impossible condition\n");
  return -1;
}

/*MAN ADS
NAME
     ads_findnet--returns optimal probe coordinates for net given a TID
SYNOPSIS
     ads_findnet(tid, x, y)
     long tid;
     int *x;
     int *y;
DESCRIPTION
     Returns optimal probe coordinates ('x, y'), in layout database
     units for a single net given its traversal ID number, 'tid'.
     Unlike ads_findnets(), this information is retrieved directly
     from the LINEINDEX file and requires no further computation.
RETURN VALUE
     0 on success, -1 on success.
SEE ALSO
     ads_findnets().
AUTHOR
     Alan C Noble
UPDATES
```

```
*/
ads_findnet(tid, x, y)
long tid;
int *x;
int *y;
{
  int lineindex;
  int netcnt;
  Netline line;

ads_errno = 0;
  if(ads_open_index(&lineindex, "LINEINDEX") == -1) {
    ads_errno = ADS_CANNOT_OPEN_LINEINDEX;
    return -1;
  }
  if(read(lineindex, &netcnt, sizeof(int)) != sizeof(int)) {
    ads_errno = ADS_CANNOT_READ_LINEINDEX;
    close(lineindex);
    return -1;
  }
  if(read_netline(lineindex, netcnt, tid, &line)) {
    close(lineindex);
    return -1;
  }
  if(line.segments <= 0) {
    close(lineindex);
    return -1;
  }
  if((line.probe.x == MININT) && (line.probe.y == MININT)) {
    close(lineindex);
    return -1;
  }
  *x = line.probe.x;
  *y = line.probe.y;
  close(lineindex);
  return 0;
}
```

Appendix G

```
/**********************************************************************\
 *                                                                      *
 *   Copyright (c) Schlumberger Technologies, 1989.                     *
 *   All rights reserved.  No part of this program may be photocopied,  *
 *   reproduced, or translated to another programming language without  *
 *   the prior written consent of Schlumberger Technologies.            *
 *                                                                      *
\**********************************************************************/

/*
 * $Id: lineindex.c,v 1.1.1.1           noble Exp $
 * $Log:       lineindex.c,v $
 * Revision 1.1.1.1                    noble
 * *** empty log message ***
 *
 * Revision 1.1                  ; noble
 * Initial revision
 *
 */

/*
 * Author: Alan C. Noble
 */
include <stdio.h>
include <sys/file.h>
#include <index.h>
#include <utilities.h>
#include <setup.h>
include <lineindex.h> static float resolution;
```

```
/*********************************************************************/
/*                ABSTRACT TRAPEZOIDS TO LINE SEGMENTS               */
/*********************************************************************/ static int abstract_segment(trap,segment,line,min_size,discarded)
ECADTRAP *trap;
NETSEGMENT *segment;
NETLINE *line;
int min_size, *discarded;
{
  register int dx,dy, x_right, x_left;

*discarded = FALSE;

segment->layer = (char)(trap->ecad_dev >> SHIFTLAYER);
  x_right = MIN(trap->ecad_x2, trap->ecad_x4);
  x_left  = MAX(trap->ecad_x1, trap->ecad_x3);
  dx = x_right - x_left;
  dy = trap->ecad_ytop - trap->ecad_ybot;

if((dx < min_size) || (dy < min_size)) {
    *discarded = TRUE;
    return 0;
  }

/* classify trap */
  if(dx > dy) {
    /* horizontal => angle=0 */
/*
    +----------------+           x3       x4
    |                |          +--------+              +------------+
    |                |         /          \              \          /
    +----------------+        +------------+              +--------+
                              x1           x2

*/
    segment->angle=0;
    segment->width=dy;
    segment->length = dx;
    segment->start.x = x_left;
    segment->end.x = x_right;
    segment->start.y = trap->ecad_ybot;
    segment->end.y = trap->ecad_ytop;
    if( x_right > line->bbox[1].x)
      line->bbox[1].x = x_right;
    if( x_left < line->bbox[0].x)
      line->bbox[0].x = x_left;
    if( trap->ecad_ytop > line->bbox[1].y)
      line->bbox[1].y = trap->ecad_ytop;
    if( trap->ecad_ybot < line->bbox[0].y)
      line->bbox[0].y = trap->ecad_ybot;
  } else if ((trap->ecad_x1 == trap->ecad_x3) &&
             (trap->ecad_x2 == trap->ecad_x4)) {
/*
    +----+
    |    |
    |    |
    |    |
    |    |
    |    |
    |    |      -   -
    |    |
    |    |
    +----+
*/
    /* vertical => angle = 2 */
    segment->angle = 2;
    segment->width = dx;
    segment->length = dy;
    segment->start.x = x_left;
    segment->end.x   = x_right;
    segment->start.y = trap->ecad_ybot;
    segment->end.y = trap->ecad_ytop;
    if( x_right > line->bbox[1].x)
      line->bbox[1].x = x_right;
```

```
        if( x_left < line->bbox[0].x)
            line->bbox[0].x = x_left;
        if( trap->ecad_ytop > line->bbox[1].y)
            line->bbox[1].y = trap->ecad_ytop;
        if( trap->ecad_ybot < line->bbox[0].y)
            line->bbox[0].y = trap->ecad_ybot;
    } else if ((trap->ecad_x3 > trap->ecad_x1) ||
               (trap->ecad_x4 > trap->ecad_x2)) {
/*            x3    x4
          +----+         +----+          +------------+
         /    /         /    |           |           /
        /    /         /     |           |          /
       /    /         /      |           |         /
      /    /         /       |           |        /
     /    /         /        |           |       /
    +----+         +---------+           +----+
    x1   x2
*/
    /* 45 degrees */
    segment->angle =1;
    segment->width = MIN((trap->ecad_x4 - trap->ecad_x3),
                        (trap->ecad_x2 - trap->ecad_x1));
                    /* not real width */
    segment->length = ROUND((float)dy * SQRT2);
    segment->start.x = trap->ecad_x1;
    segment->end.x = MAX(trap->ecad_x3, trap->ecad_x4 - segment->width);
    segment->start.y = trap->ecad_ybot;
    segment->end.y = trap->ecad_ytop;
    if( trap->ecad_ytop > line->bbox[1].y)
        line->bbox[1].y = trap->ecad_ytop;
    if( trap->ecad_ybot < line->bbox[0].y)
        line->bbox[0].y = trap->ecad_ybot;
    if( trap->ecad_x4 > line->bbox[1].x)
        line->bbox[1].x = trap->ecad_x4;
    if( trap->ecad_x1 < line->bbox[0].x)
        line->bbox[0].x = trap->ecad_x1;

} else if ((trap->ecad_x1 > trap->ecad_x3) ||
               (trap->ecad_x2 > trap->ecad_x4)) {
        /* 135 degrees */
/* x3   x4
    +----+           +------------+          +----+
    \    \           \            |          |    \
     \    \           \           |          |     \
      \    \           \          |          |      \
       \    \           \         |          |       \
        \    \           \        |          |        \
         +----+           +----+             +------------+
         x1   x2
*/
    segment->angle =3;
    segment->width = MIN((trap->ecad_x4 - trap->ecad_x3),
                        (trap->ecad_x2 - trap->ecad_x1));
                    /* not real width */
    segment->length = ROUND((float)dy * SQRT2);
    segment->start.x = trap->ecad_x2;
    segment->end.x = MIN(trap->ecad_x4, trap->ecad_x3 + segment->width);
    segment->start.y = trap->ecad_ybot;
    segment->end.y = trap->ecad_ytop;
    if( trap->ecad_ytop > line->bbox[1].y)
        line->bbox[1].y = trap->ecad_ytop;
    if( trap->ecad_ybot < line->bbox[0].y)
        line->bbox[0].y = trap->ecad_ybot;
    if( trap->ecad_x2 > line->bbox[1].x)
        line->bbox[1].x = trap->ecad_x2;
    if( trap->ecad_x3 < line->bbox[0].x)
        line->bbox[0].x = trap->ecad_x3;
    } else {
        /* two vertices must be coincident so trapezoid has become a triangle */
        fprintf(stderr,"\nTrapezoid discarded:   ");
        print_ecadtrap(stderr,trap,resolution);
```

```
      *discarded = TRUE;
      return 0;
    }
    if(segment->width < line->min_width)
      line->min_width = segment->width;
    if(segment->layer > line->max_layer)
      line->max_layer = segment->layer;
    return 0;
} make_lineindex()
{
  char filename[BUFSIZ];
  ADS_PARAMS params;
  NETENTRY entrybuf[2];
  NETLINE *line_array;
  NETSEGMENT *segment_array;
  NETSEGMENT **segment_ptr;
  long loffset,toffset;
  register int tid, tsz, i,j;
  int ln; /* layout net number */
  register int power;
  int maxnettid; /* max net TID */
  int nodeindex, netindex, lineindex; /* file pointers */
  int min_size, discarded;

printf("lineindex (net abstractor)\n");

/* determine minimum size of interest */
  printf("Reading setup file\n");
  if(ads_parse_setup(&params) != 0 ) {
    fprintf(stderr,"Error reading setup file\n");
    return(-1);
  }
  resolution = params.resolution;
  if(params.probe_feature == 0) {
    params.probe_feature = PROBE_FEATURE_FACTOR * params.spot_size;
  }
  min_size = params.probe_feature / resolution;
  printf("Discarding trapezoids smaller than %d CAD units (%g microns)\n",
         min_size, params.probe_feature);
  if(ads_open_index(&nodeindex, NODEINDEX) == -1)
    return -1;
  if(ads_open_index(&netindex, NETINDEX) == -1)
    return -1;

read(netindex, &maxnettid, sizeof(int)); /* totalcnt: dont need this */
  read(netindex, &maxnettid, sizeof(int)); /* number of nets plus 1 */
  power = (maxnettid<100? 10: (maxnettid<1000? 100: 1000));
  /* open LINEINDEX */
  if (get_index_file(filename, LINEINDEX)) {
    fprintf(stderr,"Cannot find %s index\n", LINEINDEX);
    return -1;
  }
  if ((lineindex = open(filename, O_WRONLY |O_CREAT |O_TRUNC, 00666)) == -1) {
    fprintf(stderr,"Cannot open %s index file\n", LINEINDEX);
    return -1;
  }

/* create array of line descriptors */
  if((line_array = (NETLINE *) calloc(maxnettid, sizeof(NETLINE))) == 0) {
    printf(stderr,"Out of memory\n");
    return -1;
  }
  loffset = maxnettid * sizeof(NETLINE)+sizeof(int);
  if((segment_ptr = (NETSEGMENT **) calloc(maxnettid,sizeof(NETSEGMENT*))) == 0) {
    printf(stderr,"Out of memory\n");
    return -1;
  }
  printf("Abstracting nets\n");
  for(tid=0; tid < maxnettid; tid++) {
```

```
      if(tid % power ==0)
         printf("  %d\n", tid);

/* Find (DRACULA) layout net number for this tid */
      lseek(nodeindex, tid * sizeof(int), L_SET);
      if(read(nodeindex, &ln, sizeof(int)) != sizeof(int)) {
         fprintf(stderr,"Error reading %s: TID=%d\n", NODEINDEX, tid);
         return -1;
      }
      if(ln == -1 || ln == 0) {
         /* Unmatched net */
         line_array[tid].segments = -1;
         printf("  - %d\n", tid);
         continue;
      }

/* initialize line descriptor */
      line_array[tid].offset = (int)loffset;
      line_array[tid].min_width = MAXCHAR;
      line_array[tid].max_layer = 0;
      line_array[tid].bbox[0].x = MAXINT;
      line_array[tid].bbox[0].y = MAXINT;
      line_array[tid].bbox[1].x = MININT;
      line_array[tid].bbox[1].y = MININT;

/* Find net in the header and read 2 NETENTRYs */
         lseek(netindex, 2 * sizeof(int) + ln * sizeof(NETENTRY), L_SET);
      if(read(netindex, entrybuf, sizeof(entrybuf)) != sizeof(entrybuf)) {
         fprintf(stderr,"Error reading %s: TID=%d, ln=%d\n", NETINDEX, tid, ln);
         return -1;
      }
      /* get offsets for start and end of trapezoid data */
      toffset = entrybuf[0].trap_offset;
      tsz = entrybuf[1].trap_offset - toffset;
      tsz /= sizeof(ECADTRAP);

if(tsz != 0) {
         register int i;
         ECADTRAP trap;
      if((segment_array = (NETSEGMENT *) malloc(tsz*sizeof(NETSEGMENT)))
            == 0) {
         printf(stderr,"Out of memory\n");
         return -1;
      } lseek(netindex, toffset, L_SET); /* go to start of trap data */
      for(j=0, i=0; i<tsz; i++) {
         if(read(netindex, &trap, sizeof(ECADTRAP))
               != sizeof(ECADTRAP)) {
            fprintf(stderr,"Error: Bad trapezoid in %s: TID=%d, ln=%d\n",
                  NETINDEX, tid, ln);
            return -1;
         }
         if(abstract_segment(&trap,&segment_array[j],
                        &line_array[tid],min_size,&discarded) == -1) {
            return -1;
         }
         if(!discarded) {
            j++;
         }
      }
      line_array[tid].segments = j; /* number of segments not discarded */
      segment_ptr[tid] = segment_array;
      loffset += j*sizeof(NETSEGMENT);
   } else {
      segment_ptr[tid] = NULL;
   }

} /* next tid */
printf("%d nets processed\n", maxnettid);
printf("Writing %s\n", filename);

/* write the number of nets */
```

```
    write(lineindex, &maxnettid, sizeof(int));
    /* now write all the line descriptors */
    write(lineindex, line_array, maxnettid * sizeof(NETLINE));
    /* write the segments */
    for(i=0; i < maxnettid; i++) {
      if(segment_ptr[i] != 0)
        write(lineindex, segment_ptr[i],
              (line_array[i].segments)*sizeof(NETSEGMENT));
    }
    /* tidy up */
    close(lineindex);
    close(netindex);
    close(nodeindex);
    printf("Done\n");
    return 0; /* normal return */
}

/*************************************************************************/
/*                PRINT CONTENTS OF LINEINDEX INDEX FILE                 */
/*************************************************************************/ print_lineindex(all)
int all;
{
  char filename[BUFSIZ];
  register int tid, j;
  NETLINE line;
  NETSEGMENT segment;
  int lineindex; /* file descriptor */
  int maxnettid;
  ads_open_index(&lineindex, LINEINDEX);

/* read maxnettid */
  if (read(lineindex, &maxnettid, sizeof(int)) != sizeof(int)) {
    fprintf(stderr,"Cannot read %s",LINEINDEX);
    return -1;
  }
  for(tid=0; tid < maxnettid; tid++) {
    /* read the NETLINE record for this tid */
    if(read_netline(lineindex, maxnettid, tid, &line)) {
      return -1;
    }
    printf("TID %d\n", tid);
    if(line.segments > 0) {
      print_netline(stdout,&line);
      if(all) {
        for(j=0;j<line.segments; j++) {
          lseek(lineindex, line.offset+(j*sizeof(NETSEGMENT)), L_SET);
          if (read(lineindex, &segment, sizeof(NETSEGMENT))
              != sizeof(NETSEGMENT)) {
            fprintf(stderr,"Cannot read %s",LINEINDEX);
            return -1;
          }
          print_netsegment(stdout,&segment);
        }
      }
    }
  } /* next net */
} print_net(tid,print_segments)
long tid;
int print_segments;
{
int lineindex, maxnettid;
NETLINE line;
NETSEGMENT segment;
register int i,j;

if(ads_open_index(&lineindex, LINEINDEX)==-1) {
  return -1;
}
if(read(lineindex, &maxnettid, sizeof(int)) != sizeof(int)) {
  close(lineindex);
```

```
    return -1;
  } if((read_netline(lineindex, maxnettid, tid, &line)) == -1) {
    close(lineindex);
    return -1;
  } printf("TID %d\n", tid);
  if(line.segments > 0) {
    print_netline(stdout,&line);
    if(print_segments) {
      for(j=0;j<line.segments; j++) {
        lseek(lineindex, line.offset+(j*sizeof(NETSEGMENT)), L_SET);
        if (read(lineindex, &segment, sizeof(NETSEGMENT))
            != sizeof(NETSEGMENT)) {
          fprintf(stderr,"Cannot read %s",LINEINDEX);
          return -1;
        }
        print_netsegment(stdout,&segment);
      }
    }
  }
  return 0;
}
```

Appendix H

```
/***********************************************************************\
*                                                                         *
*   Copyright (c) Schlumberger Technologies, 1989.  All rights reserved.  *
*   No  part  of  this program may be photocopied, reproduced, or         *
*   translated to another programming language without the  prior         *
*   written consent of Schlumberger Technologies.                         *
*                                                                         *
\***********************************************************************/

/*
 * $Id: findnets.c,v 1.4              noble Exp $
 * $Log:   findnets.c,v $
 * Revision 1.4                       noble
 *
 *
 * Revision 1.3                       noble
 * Fixed bug when more than maxbits number of nets.
 * Set ads_errno when an error has occured.
 *
 * Revision 1.2                       noble
 * Minor mods due to new include files.
 *
 * Revision 1.1                       noble
 * Initial revision
 *
 */

/*
 * This file contains functions for optimizing placement of the probe
 * for probing multiple selected nets, "findnets."
 *
 * The "findnet" function for placing the probe for the single net can
 * be found in findnet.c.
 *
 * Author: Alan C. Noble
 * Date:
 * File:    findnets.c
 */

/*
 * Explanation:
 *
 * The findnets calculation uses a Hough-like transform on the
 * c-obstacles of the layout trapezoids, in the so-called the C-obstacle
```

* frame, or COF.
 * The COF is a scaled down version of the layout frame. The scaling
 * factor is cof_grid.
 *
 *
 *
 *
 *
 *
 */

```c
#include <stdio.h>
include <sys/file.h>
#include <sys/param.h>
#include <pixrect/pixrect_hs.h>
#include <setup.h>
#include <utilities.h>
#include <list.h>
#include <lineindex.h>
include <findnets.h>

/* The following includes are only for optional display purposes */
#include <suntool/sunview.h>
#include <suntool/panel.h>
#include <suntool/canvas.h>
include <suntool/scrollbar.h> extern unsigned short bitstable[];

ifdef NEVER
static short icon_image[] ={
#include <hello.icon>
};
DEFINE_ICON_FROM_IMAGE(hello_icon, icon_image);
endif /*
 * non-negative element is an index into probe_order.
 * negative index means that this layer is not to be probed.
 */
#define COF_SIZE_LIMIT    1000000  /* 1MByte */
#define BYTESIZE          8        /* nothing new */
#define MAXPRIORITYBITS   24       /* SUN color limitation */
#define MAXEQUALBITS      16       /* lookup table size limitation */

/*
 * Globals relating to the the C-obstacle frame
 */
unsigned int *cof;          /* pointer to C-obstacle frame */
struct pixrect *cof_pr;     /* pointer to COF pixrect */
POINT cof_bbox[2];          /* bounding box of C-obstacle frame */
int cof_width;              /* COF width */
int cof_height;             /* COF height */
int cof_depth;              /* COF depth = max number of nets */
int cof_grid;               /* COF grid size */
int cof_grid_mask;          /* masks out numbers off the grid */
int cof_half_grid;          /* half grid of cof */
int cof_log_grid;           /* COF grid, log base 2 */
int fn_width;               /* width of layout window */
int fn_half_width;          /* half width of layout window */
int fn_half_height;         /* half height of layout window */
int fn_scaled_height;       /* scaled height of layout window */

POINT fn_bbox[2];           /* bbox of layout frame, in database units */
static int fn_initialized = 0;
static int fn_window_initialized = 0;
static float fn_scale;
```

/******************************************************************/
/*            FUNCTIONS TO LOCATE THE MAXIMUM COF VALUE           */
/******************************************************************/

```
/*
 * What is the maximum COF value?
 *
 * The "maximum" COF value is by definition the best place to
 * position the window. * There is one bit per gridpoint per net.
 * The "maximum" is determined by the ranking strategy.
 *
 * Ranking strategies:
 *
 * PRIORITY stategy (default):
 *
 * Each net is prioritized according to its order in the original input
 * list. * The fist net has maximum priority, the last has mimimum
 * priority.  The maximum value is then the one with the largest number of
 * significant bits.
 *
 * EQUAL strategy:
 *
 * All nets have the same weight.
 *
 */

/*
 * Functions to optimize the "maximum" location
 */
best_maximum_short(maximum, maxp, x, y)
unsigned short maximum,*maxp;
int *x, *y;
{
  register unsigned short *plim, *p;
  int x1, x2, y1, y2;

y1 = y2 = (maxp - (unsigned short*)cof) / cof_width;
  p = maxp;
  while(*p == maximum) {
    p += cof_width;
    y2++;
  }
  x1 = x2 = maxp - (unsigned short*)cof - (y1 *  cof_width);
  plim = (unsigned short*)cof + ((y1+1) * cof_width);
  p = maxp;
  while(*p == maximum && p < plim) {
    p ++;
    x2++;
  }
  *x = AVG(x1, x2);
  *y = AVG(y1, y2);
  if( *( (unsigned short*)cof + (*y * cof_width) + *x) != maximum) {
    *x = x1;
    *y = y1;
  }
} best_maximum_int(maximum, maxp, x, y)
unsigned int maximum, *maxp;
int *x, *y;
{
  register unsigned int *plim, *p;
  int x1, x2, y1, y2;

y1 = y2 = (maxp - cof) / cof_width;
  p = maxp;
  while(*p == maximum) {
    p += cof_width;
    y2++;
  }
  x1 = x2 = maxp - cof - (y1 *  cof_width);
  plim = cof + ((y1+1) * cof_width);
  p = maxp;
  while(*p == maximum && p < plim) {
    p ++;
    x2++;
```

```
   }
   *x = AVG(x1, x2);
   *y = AVG(y1, y2);
   if( *( cof + (*y * cof_width) + *x) != maximum) {
      *x = x1;
      *y = y1;
   }
}

/*
 * Functions to find the maximum
 */ find_priority_strategy_maximum(best, result, x, y)
unsigned int best, *result;
int *x, *y;
{
   register unsigned int maximum, *maxp, *p;
   register int i;

maximum = 0;
   for(p = cof, i = cof_width * cof_height; --i >= 0; p++) {
      if( *p > maximum ) {
         maximum = *p;
         maxp = p;
         if(maximum == best) {
         break;
         }
      }
   }
   best_maximum_int(maximum, maxp, x, y);
   *result = *maxp;
   return 0;
} find_equal_strategy_maximum(best, result, x, y)
unsigned int best, *result;
int *x, *y;
{
   register unsigned short maximum, *maxp, *p;
   register int i;
   short best_short = (short)best;

maximum = 0;
   for(p = (unsigned short*)cof, i = cof_width * cof_height; --i >= 0; p++) {
      if(bitstable[*p] > maximum ) {
         maximum = bitstable[*p];
         maxp = p;
         if(maximum == best_short) {
         break;
         }
      }
   }
   best_maximum_short(maximum, maxp, x, y);
   *result = (unsigned int)(*maxp);
   return 0;
} find_maximum(flags,best,value,winx,winy)
int flags;
unsigned int best, *value;
int *winx, *winy;
{
   if(flags & IDS_EQUAL) {
      best = (unsigned int) bitstable[best];
      find_equal_strategy_maximum(best, value, winx, winy);
   } else {
      find_priority_strategy_maximum(best, value, winx, winy);
   }
ifdef FN_DEBUG
   printf("cof coords: x=%d, y=%d; value=%d; score=%d/%d)\n",
      *winx,*winy, (int)(*value),
```

```
        ((flags & IDS_EQUAL)? (int)bitstable[*value] : (int)(*value)},
        (int)best);
#endif
  /*
   * Translate (winx,winy) to database units.  (winx,winy) is window center
   */
  *winx = LOWERX(fn_bbox) + (*winx * cof_grid + cof_half_grid);
  *winy = LOWERY(fn_bbox) + (*winy * cof_grid + cof_half_grid);
  return 0;
}

/*************************************************************************/
/*                         FINDNETS CALCULATION                         */
/*************************************************************************/

/*MAN ADS
NAME
      ads_set_findnets_window--set size of window used by findnets
SYNOPSIS
      ads_set_findnets_window(w, h, grid)
      int w, h;
      int grid;
DESCRIPTION
      This function set the window size used by ads_findnets().
      `w' and `h' are the window width and height in database units.
      `grid' is the grid size (resolution) in database units.  If
      `grid' is -1, a default value is calculated from `w' and `h'
WARNING
      ads_set_findnets_window() must be called before ads_findnets().
RETURN VALUE
      0 on sucess, -1 on failure.
AUTHOR
      Alan C Noble
*/ ads_set_findnets_window(w, h, grid)
int w, h;
int grid;
{
  int height;
  register int i;

if(grid == -1) { /* none specified so calculate default */
    grid = MIN(w, h) / 8;
  }

/* sanity check */
  if(grid <= 0) {
    fprintf(stderr,"ads_set_findnets_window: bad grid %d\n", grid);
    return -1;
  }
  cof_grid = floor_to_power_of_two(grid, &cof_log_grid);
  cof_half_grid = cof_grid / 2;

/* quick check of input arguments */
  if((w < cof_grid) || (h < cof_grid)) {
    ads_errno = ADS_GRID_TOO_BIG;
    return -1;
  }
  /*
   * Set window constants.  These values are globals because they get used
   * everywhere, all the time.
   * Make the window slightly smaller than the actual one to allow for
   * scaling inaccuracies.
   */
  fn_width = C_FLOOR(w - cof_grid) * cof_grid;
  fn_scaled_height = C_FLOOR(h - cof_grid);
  height = fn_scaled_height * cof_grid;
  fn_half_width = fn_width / 2;
  fn_half_height = height / 2;
```

```
#ifdef FN_DEBUG
  printf("width = %d, height = %d, grid = %d (database units)\n",
    fn_width, height, cof_grid);
#endif
  fn_window_initialized = 1;
  return 0;
}

/*MAN ADS
NAME
    ads_findnets--find the layout window with the most nets
SYNOPSIS
    ads_findnets(inputs,flags,winx,winy,hits,misses,found,missed, positions)
    LIST *inputs, **found, **missed, **positions;
    int flags;
    int *winx, *winy;
    int *hits, *misses;
DESCRIPTION
    Calculates coordinates of window with the most nets in the list
    'inputs'.

'(winx, winy)' are coordinates of the calculated window center in
    database units.  'hits' is the number of nets included in the
    calcuated window, 'misses' the number not included.  'found' is
    the TID list of nets included, 'missed' the list of nets not
    included.  'positions' is the list of probe positions for the
    included nets and has the form, (x1,y1,layer1,x2,y2,layer2,..).
SECTION PREREQUISTES
    Assumes that the LINEINDEX file has been opened by calling
    ads_init_findnets.
RETURN VALUE
    0 on success, -1 on failure.
AUTHOR
    Alan C Noble
UPDATES
        6 Apr 1990   First documented
*/ int ads_findnets(inputs,flags,winx,winy,hits,misses,found, missed, positions)
LIST *inputs, found, missed, **positions;
int flags;
int *winx, *winy; /* window center coordinates in database units*/
int *hits, *misses;
{
  register int i, j, k;       /* counters */
  register int total;         /* total number of nets */

LIST *p;
Netline *line,
    **lines_array = NULL;     /* array of Netlines */
Netsegment *segments,
    **segments_array = NULL;  /* array of Netsegments */
long *tids = NULL;            /* array of TIDs */
int *inside = NULL;           /* array of booleans indicating inside */
int size;
int actually_inside;
int maxbits;                  /* maximum number of bits = max nets */
unsigned int best;            /* the best possible (ideal) maximum */
unsigned int value;           /* value of COF for actual maximum */
unsigned int max_mask;
int gnd, vcc;                 /* TRUE if GND or power is in 'inputs' */
POINT temp[2];
int x, y, layer;
int nodata = 0;               /* count of nets which cannot be probed */

/*
 * the following get initialized the first time through
 */
static Layerdata layerdata;  /* probe layers */
static int lineindex;         /* file descriptor */
static int netcnt;            /* max net tid */
```

```
  ads_errno = 0;
  cof = NULL;

if(!fn_window_initialized) {
    ads_errno = ADS_WINDOW_NOT_SET;
    goto FINDNETS_ERROR;
  }
  if(!fn_initialized) {
    if(ads_get_layer_data(NULL, &layerdata) == -1) {
      ads_errno = ADS_CANNOT_GET_LAYER_DATA;
    }
    if(ads_open_index(&lineindex, "LINEINDEX") == -1) {
      ads_errno = ADS_CANNOT_OPEN_LINEINDEX;
      goto FINDNETS_ERROR;
    }
    if(read(lineindex, &netcnt, sizeof(int)) != sizeof(int)) {
      ads_errno = ADS_CANNOT_READ_LINEINDEX;
      close(lineindex);
      goto FINDNETS_ERROR;
    }
    fn_initialized = 1;
  }
  total = list_length(inputs);
  if(total == 0) {
    ads_errno = ADS_NULL_INPUT_LIST;
    goto FINDNETS_ERROR;
  } gnd = (int)search_list(inputs, (char*)GND_TID);
  vcc = (int)search_list(inputs, (char*)VCC_TID);

if(flags & IDS_STABLE) {
    if(!gnd) {
      /* append TID for GND to the end of 'inputs' */
      append_list(inputs, long_list(GND_TID));
      total++;
    }
    if(!vcc) {
      /* append TID for VCC to the end of 'inputs' */
      append_list(inputs, long_list(VCC_TID));
      total++;
    }
  } tids = (long *)malloc(total * sizeof(long));
  inside = (int *)malloc(total * sizeof(int));
  lines_array = (Netline **)calloc(total, sizeof(Netline));
  segments_array = (Netsegment **)calloc(total, sizeof(Netsegment*));
  if((tids == NULL) || (inside == NULL) ||
     (lines_array == NULL) || (segments_array == NULL)) {
    ads_errno = ADS_OUT_OF_MEMORY;
    goto FINDNETS_ERROR;
  }
  /*
   * read all lines into memory
   */
  for(i = 0, p = inputs; i < total; i++, p = p->next) {
    tids[i] = (long)(p->data);
    if((line = (Netline *)malloc(sizeof(Netline))) == NULL) {
      ads_errno = ADS_OUT_OF_MEMORY;
      goto FINDNETS_ERROR;
    }
    if(read_netline(lineindex, netcnt, tids[i], line)) {
      goto FINDNETS_ERROR;
    }
    lines_array[i] = line;
  }

/* initialize lists */
  *found = copy_list(inputs);
```

```c
      *missed = *positions = NULL;

/*
       * remove nets which have no data from further consideration
       */
      for(i = 0 ; i < total; i++) {
        if(lines_array[i]->segments == 0) {
          nodata++;
          *found = remove_list(*found, (char*)tids[i]);
          *missed = append_list(*missed, long_list(tids[i]));
          inside[i] = FALSE;
#ifdef FN_DEBUG
          printf("Net %d not probeable\n", tids[i]);
#endif
        } else {
          inside[i] = TRUE;
        }
      } if(nodata == total) {
        /*
         * none of the nets have data!
         */
        ads_errno = ADS_NO_FINDNETS_DATA;
        goto FINDNETS_ERROR;
      } if(total == 1) {
        /* special case--no need to find best window, since there is only 1 net */ i = lines_array[0]->probe.x;
        j = lines_array[0]->probe.y;

if((i == MININT) || (j == MININT)) { /* means invalid data */
          *found = free_list(*found);
          *hits = 0;
          ads_errno = ADS_NO_FINDNETS_DATA;
          goto FINDNETS_ERROR;
        }
        *positions = append_list(*positions, long_list(i));
        *positions = append_list(*positions, long_list(j));
        *positions = append_list(*positions, long_list(-1));
        *winx = i;
        *winy = j;
        *hits = 1;

} else {
        /*
         * Calculate the bounding box of the search area.
         * For PRIORITY ranking, the bounding box is the bounding box of the first
         * net in inputs, or a following net if this bounding box is too big.
         * For EQUAL ranking, the bounding box is the union of all of the
         * individual bounding boxes, excluding nets which would make the
         * bounding box too big.
         */
        if(flags & IDS_EQUAL) {
          /* merge bounding boxes, unless a net's bounding box is too big */
          cof_depth = maxbits = MAXEQUALBITS;

*hits = 0;
          LOWERX(fn_bbox) = MAXINT;
          LOWERY(fn_bbox) = MAXINT;
          UPPERX(fn_bbox) = MININT;
          UPPERY(fn_bbox) = MININT;

for(i = 0 ; i < total; i++) { if(!inside[i])
              continue;

if(LOWERX(lines_array[i]->bbox) < LOWERX(fn_bbox))
```

```c
      temp[0].x = LOWERX(lines_array[i]->bbox);
   if(LOWERY(lines_array[i]->bbox) < LOWERY(fn_bbox) )
      temp[0].y = LOWERY(lines_array[i]->bbox);
   if(UPPERX(lines_array[i]->bbox) > UPPERX(fn_bbox) )
      temp[1].x = UPPERX(lines_array[i]->bbox);
   if(UPPERY(lines_array[i]->bbox) > UPPERY(fn_bbox) )
      temp[1].y = UPPERY(lines_array[i]->bbox);

if( C_CEILING(temp[1].x-temp[0].x) * C_CEILING(temp[1].y-temp[0].y)
       <= COF_SIZE_LIMIT ) {
      LOWERX(fn_bbox) = temp[0].x;
      LOWERY(fn_bbox) = temp[0].y;
      UPPERX(fn_bbox) = temp[1].x;
      UPPERY(fn_bbox) = temp[1].y;

} else if((UPPERX(lines_array[i]->bbox) < LOWERX(fn_bbox)) ||
             (LOWERX(lines_array[i]->bbox) > UPPERX(fn_bbox)) ||
             (UPPERY(lines_array[i]->bbox) < LOWERY(fn_bbox)) ||
             (LOWERY(lines_array[i]->bbox) > UPPERY(fn_bbox))) {
      /* This net not inside bounding box */
      *found = remove_list(*found, (char*)tids[i]);
      *missed = append_list(*missed, long_list(tids[i]));
      inside[i] = FALSE;
#ifdef FN_DEBUG
      printf("Net %d bbox missed\n", tids[i]);
#endif
      continue;
   }
   /* save segments for this line */
   size = lines_array[i]->segments * sizeof(Netsegment);
   if((segments = (Netsegment*)malloc(size)) == NULL) {
      ads_errno = ADS_OUT_OF_MEMORY;
      goto FINDNETS_ERROR;
   }
   if(lseek(lineindex,lines_array[i]->offset,L_SET) == -1) {
      ads_errno = ADS_CANNOT_SEEK_LINEINDEX;
      goto FINDNETS_ERROR;
   }
   if(read(lineindex, segments, size) != size) {
      ads_errno = ADS_CANNOT_READ_LINEINDEX;
      goto FINDNETS_ERROR;
   }
   segments_array[i] = segments;
   (*hits)++;
   inside[i] = TRUE;   /* bounding box overlaps so net *might* be inside */
   }

} else { /* priority */ cof_depth = sizeof(int) * BYTESIZE;
   maxbits = MAXPRIORITYBITS;

/*
    * use the bounding box of the first net which is small enough
    * to be tractable
    */
   for(k = 0; k < total; k++) {
      if(!inside[k])
         continue;
      LOWERX(fn_bbox) = LOWERX(lines_array[k]->bbox);
      LOWERY(fn_bbox) = LOWERY(lines_array[k]->bbox);
      UPPERX(fn_bbox) = UPPERX(lines_array[k]->bbox);
      UPPERY(fn_bbox) = UPPERY(lines_array[k]->bbox);
      if(C_CEILING(UPPERX(fn_bbox)-LOWERX(fn_bbox)) *
         C_CEILING(UPPERY(fn_bbox)-LOWERY(fn_bbox)) <= COF_SIZE_LIMIT ) {
         break;
      }
   }
   if(k == total) {
      ads_errno = ADS_NET_BBOXES_TOO_BIG;
      goto FINDNETS_ERROR;
```

```
      }
       /* save segments for first net */
        size = lines_array[k]->segments * sizeof(Netsegment);
        if((segments = (Netsegment*)malloc(size)) == NULL) {
      ads_errno = ADS_OUT_OF_MEMORY;
      goto FINDNETS_ERROR;
       }
        if(lseek(lineindex, lines_array[k]->offset, L_SET) == -1) {
      ads_errno = ADS_CANNOT_SEEK_LINEINDEX;
      goto FINDNETS_ERROR;
       }
        if(read(lineindex, segments, size) != size) {
      ads_errno = ADS_CANNOT_READ_LINEINDEX;
      goto FINDNETS_ERROR;
       }
        segments_array[k] = segments;
        inside[k] = TRUE;  /* by definition */
        *hits = 1;

/*
        * now discard all nets which do not fall inside bounding box
        */
        for(i = 0; i < total; i++) { if(!inside[i] || (i == k))
         continue;

if((UPPERX(lines_array[i]->bbox) < LOWERX(fn_bbox)) ||
          (LOWERX(lines_array[i]->bbox) > UPPERX(fn_bbox)) ||
          (UPPERY(lines_array[i]->bbox) < LOWERY(fn_bbox)) ||
          (LOWERY(lines_array[i]->bbox) > UPPERY(fn_bbox))) {
         /*
         * This net cannot possibly intersect its bounding box does not overla
p
         * Remove this net from the list of `found` and add it to
         * the list of *missed.
         */
         *found = remove_list(*found,(char*)tids[i]);
         *missed = append_list(*missed,long_list(tids[i]));
         inside[i] = FALSE;
#ifdef FN_DEBUG
         printf("Net %d bbox outside\n", tids[i]);
#endif
       } else {
         /* save segments for this line */
         size = lines_array[i]->segments * sizeof(Netsegment);
         if((segments = (Netsegment*)malloc(size)) == NULL {
       ads_errno = ADS_OUT_OF_MEMORY;
       goto FINDNETS_ERROR;
         }
       if(lseek(lineindex, lines_array[i]->offset, L_SET) == -1) {
         ads_errno = ADS_CANNOT_SEEK_LINEINDEX;
         goto FINDNETS_ERROR;
       }
       if(read(lineindex,segments,size) != size) {
         ads_errno = ADS_CANNOT_READ_LINEINDEX;
         goto FINDNETS_ERROR;
       }
       segments_array[i] = segments;
       inside[i] = TRUE;  /* bounding boxes overlap */
       (*hits)++;
      }
     }
    } if(*hits > maxbits) {
   /*
    * can only have one net per bit plane so ignore excessive nets
    */
   for(i = maxbits; i < (*hits); i++) {
  *found = remove_list(*found, (char*)tids[i]);
```

```
    *missed = append_list(*missed, long_list(tids[i]));
    inside[i] = FALSE;
   }
   i = (*hits) - maxbits;
   fprintf(stderr, "ads_findnets: ignored %d nets\n", i);
   (*hits) -= i;
 }

/* expand bbox to even grid units */
 LOWERX(cof_bbox) = C_FLOOR(LOWERX(fn_bbox));
 LOWERY(cof_bbox) = C_FLOOR(LOWERY(fn_bbox));
 UPPERX(cof_bbox) = C_CEILING(UPPERX(fn_bbox));
 UPPERY(cof_bbox) = C_CEILING(UPPERY(fn_bbox));
 cof_width = UPPERX(cof_bbox) - LOWERX(cof_bbox);
 /*
  * round width to multiple of sizeof(int) for integer alignment
  */
 cof_width = ((cof_width + sizeof(int) - 1) / sizeof(int) ) * sizeof(int);
 UPPERX(cof_bbox) = LOWERX(cof_bbox) + cof_width;
 cof_height = UPPERY(cof_bbox) - LOWERY(cof_bbox);
 if((cof_width <= 0) || (cof_height <= 0)) {   /* sanity check */
   ads_errno = ADS_BAD_COF_DIMENSIONS;
   goto FINDNETS_ERROR;
 }

/* allocate COF */
    size = cof_width * cof_height * cof_depth / BYTESIZE;
    if((cof = (unsigned int *)calloc(size, 1)) == NULL) {
       ads_errno = ADS_OUT_OF_MEMORY;
       goto FINDNETS_ERROR;
    }
ifdef FN_DEBUG
    printf("Search area = %d x %d CAD units (%d x %d grid)\n",
        (UPPERX(fn_bbox) - LOWERX(fn_bbox)),
        (UPPERY(fn_bbox) - LOWERY(fn_bbox)),
        cof_width, cof_height);
    printf("COF size = %d bytes\n", size);
endif /*
     * Build pixrect structure which points to cof and
     * perform the C-obstacle transformation
     *    i counts total nets
     *    j counts nets inside fn_bbox
     */
    cof_pr = mem_point(cof_width, cof_height, cof_depth, cof);

for(i=0, j=0; i<total; i++) {
      if(inside[i]) {
      if(general_transform(fn_bbox, flags, lines_array[i]->max_layer,
                 lines_array[i]->segments, segments_array[i],
                 (1 << (maxbits - 1 - j)), &actually_inside)) {
        goto FINDNETS_ERROR;
      }
      if(actually_inside) {
        j++;
      } else {
        *found = remove_list(*found,(char*)tids[i]);
        *missed = append_list(*missed,long_list(tids[i]));
        inside[i] = FALSE;
        (*hits)--;
#ifdef FN_DEBUG
      printf("Net %d outside\n", tids[i]);
#endif
      }
     }
    } /* next net */

/*
     * Search the COF to find the point of maximum overlap
     */
    best = 0;
```

```
    max_mask = (1 << (maxbits - 1));
    for(i=0, j=0; i < total; i++) {
      if(inside[i]) {
       best += (max_mask >> j);
       j++;
      }
    }
    find_maximum(flags, best, &value, winx, winy);

/*
     * Remove the nets that are not inside the window centered on (winx, winy)
     */
    for(i=0, j=0; i<total; i++) {
      if(inside[i]) {
        if(!(value & (max_mask >> j))) {
#ifdef FN_DEBUG
          printf("Net %ld outside window\n", tids[i]);
#endif
          *found = remove_list(*found,(char*)tids[i]);
          *missed = append_list(*missed,long_list(tids[i]));
          inside[i] = FALSE;
          (*hits)--;
        }
        j++;
      }
    } if(flags & IDS_STABLE) {
      /* remove GND and VCC from further consideration */
      if(!gnd) {
       if(search_list(*found, (char*)GND_TID)) {
          *found = remove_list(*found, (char*)GND_TID);
          remove_list(inputs, (char*)GND_TID);
          (*hits)--;
          total--;
        } else {
          *missed = remove_list(*missed,(char*)GND_TID);
        }
      } if(!vcc) {
        if(search_list(*found, (char*)VCC_TID)) {
          *found = remove_list (*found,(char*)VCC_TID);
          remove_list(inputs, (char*)VCC_TID);
          (*hits)--;
          total--;
        } else {
          *missed = remove_list(*missed,(char*)VCC_TID);
        }
       }
    }

/*
     * Now make the bounding box the bounding box of the layout window,
     * allowing for rounding inaccuracies
     */
    LOWERX(fn_bbox) = *winx - fn_half_width - cof_grid;
    LOWERY(fn_bbox) = *winy - fn_half_height - cof_grid;
    UPPERX(fn_bbox) = *winx + fn_half_width + cof_grid;
    UPPERY(fn_bbox) = *winy + fn_half_height + cof_grid;

/*
     * Find the best place to probe each net within the window
     * check that the nets actually are inside the window
     */
    for(i=0, j = 0; i < total; i++) {
      if(inside[i]) {
        if(ads_locate(segments_array[i], lines_array[i]->segments, fn_bbox,
                  &layerdata, flags, &actually_inside, &x, &y, &layer)) {
          goto FINDNETS_ERROR;
        }
```

```c
      if(actually_inside) {
        *positions = append_list(*positions, long_list(x));
        *positions = append_list(*positions, long_list(y));
        *positions = append_list(*positions, long_list(layer));
      } else {
        fprintf(stderr, "ads_findnets: TID %ld bogus\n", tids[i]);
        *found = remove_list(*found, (char*)tids[i]);
        *missed = append_list(*missed, long_list(tids[i]));
        (*hits)--;
      }
    }
   }
  }

*misses = total - *hits;  /* unless what I learnt in school is all wrong */
  free(tids);
  free(inside);
  for(i = 0; i < total; i++) {
    free(lines_array[i]);
    if(segments_array[i] != NULL)
      free(segments_array[i]);
  }
  free(lines_array);
  free(segments_array);
    free(cof);
    return 0;

FINDNETS_ERROR:
  /*
   * tidy up
   */
   if(tids != NULL)
     free(tids);
   if(inside != NULL)
     free(inside);
   if(lines_array != NULL) {
     for(i = 0; i < total; i++) {
       free(lines_array[i]);
     }
     free(lines_array);
   }
   if(segments_array != NULL) {
     for(i = 0; i < total; i++) {
       free(segments_array[i]);
     }
     free(segments_array);
   }
   if(cof != NULL)
     free(cof);
   return -1;
} ifdef FN_DEBUG static print_cof(total, bytes)
int total;
int bytes;
{
  register int i,j;
  register unsigned char *p;
  char ctrl[8];

printf("cof bbox: (%d,%d)-(%d,%d) [(0,0)-(%d,%d)]\n",
      LOWERX(fn_bbox), LOWERY(fn_bbox), UPPERX(fn_bbox), UPPERY(fn_bbox),
      cof_width, cof_height );
  sprintf(ctrl,"%%%dd", total);

printf("    ");
  for(j=0; j<cof_width; j++) {
    printf(ctrl, j);
    printf("|");
  }
```

```c
    printf("\n");
    for(i=0; i< cof_height; i++ ) {
      printf("%2d ",i);
      p = (unsigned char *)cof + (cof_width * i * bytes);
      for(j=0; j<cof_width; j++) {
        print_bits(p,total,cof_depth);
        printf("|");
        p += bytes;
      }
      printf("\n");
    }
    printf("     ");
    for(j=0; j<cof_width; j++) {
      printf(ctrl, j);
      printf("|");
    }
    printf("\n");
    return 0;
}

/* open a window and display the results of the c-obstacle */ static repaint_cof_canvas(canvas,pixwin,repaint_area)
Canvas canvas;
Pixwin *pixwin;
Rectlist *repaint_area;
{
  /* write cof_pr to pw */
  pw_rop(pixwin,0,0,cof_width,cof_height, PIX_SRC | PIX_DST,
      cof_pr,cof_width,cof_height);
  return 0;
} static display_cof()
{
  Frame base_frame;
  Panel panel;
  Canvas canvas;
  struct pixfont *bold;

bold = pf_open("/usr/lib/fonts/fixedwidthfots/screen.b.12");
  if (bold==NULL)
    exit(1);
  base_frame= window_create(NULL, FRAME,
/*      FRAME_ICON, &hello_icon, */
    FRAME_LABEL, "C-Obstacle Frame",
    WIN_FONT, bold,
    WIN_ERROR_MSG, "Can't create window.",
    WIN_WIDTH, 256,
    WIN_HEIGHT, 256,
    0);

canvas=window_create(base_frame, CANVAS,
            CANVAS_AUTO_SHRINK, FALSE,
            CANVAS_WIDTH, 1024,
            CANVAS_HEIGHT, 1024,
            CANVAS_REPAINT_PROC, repaint_cof_canvas,
            WIN_VERTICAL_SCROLLBAR, scrollbar_create(0),
            WIN_HORIZONTAL_SCROLLBAR, scrollbar_create(0), 0);
  window_main_loop(base_frame);
  return 0;
}

/* use rectangle-specific c-obstacle routine */
/*
  {
    int bit;

for(i = 0, j = 0; i < total; i++) {
      bit = 7 - (j % BYTESIZE);
```

```
      if(inside[i]) {
        ASSERT(rectangular_c_obstacle_transform(fn_bbox, bytes, flags,
                              lines_array[i]->max_layer,
                              lines_array[i]->segments,
                              segments_array[i],
                              j / BYTESIZE, bit,
                              &actually_inside));
        if(actually_inside) {
          j++;
        } else {
          *found = remove_list(*found, (char*)tids[i]);
          *missed = append_list(*missed, long_list(tids[i]));
          inside[i] = FALSE;
          (*hits)--;
#ifdef FN_DEBUG
          printf("Net %d outside\n", tids[i]);
#endif
        }
      }
    }
*/ endif

/***********************************************************************\
 *                                                                       *
 *   Copyright (c) Schlumberger Technologies, 1989.  All rights reserved. *
 *   No  part of  this program may be photocopied, reproduced, or        *
 *   translated to another programming language without the  prior       *
 *   written consent of Schlumberger Technologies.                       *
 *                                                                       *
\***********************************************************************/

/*
 * $Id: c_obstacle.c,v 1.3                  noble Exp $
 * $Log:   c_obstacle.c,v $
 * Revision 1.3              21:32:02  noble
 *
 *
 * Revision 1.2              07:50:32  noble
 * Minor mods due to new include files.
 *
 * Revision 1.1.1.1          12:31:07  noble
 *
 * Revision 1.1              12:31:04  noble
 * Initial revision
 *
 */

/* Author: Alan C. Noble */
/* Date:   17sep89 */ include <stdio.h>
include <sys/file.h>
#include <sys/param.h>
#include <pixrect/pixrect_hs.h>
#include <list.h>
#include <lineindex.h>
include <findnets.h> extern struct pixrect *cof_pr; /* pointer to cof pixrect */

/************************************************************************/
/*                       C-OBSTACLE FUNCTIONS                           */
/************************************************************************/

/*
 *
```

```
 * The bbox is the search area.  Segments not at least partially within this
 * area are ignored and their angle is set to -1 to remember this fact.
 *
 * WARNING: this is architecture dependent!
 */
int general_transform(bbox, flags, highest, nseg, seg, bit, inside)
POINT *bbox;
int flags;
char highest;
int nseg;              /* total number of segments */
Netsegment *seg;
int bit;
int *inside;
{
  register int i, x0, y0, x1, y1, dx, dy;

struct pr_pos c_obstacle[6];
  int npts[1];
  *inside = 0;

/* smash 'angle' field to value of -1 if the segment is outside the cof */
  for(i = 0; i < nseg; i++) {
    if((flags & IDS_HIGHEST) && (seg[i].layer != highest))
      continue;
    if(seg[i].angle == -1)
      continue;
    if((seg[i].end.y < LOWERY(bbox) ) ||
       (seg[i].start.y > UPPERY(bbox)) ||
       (seg[i].end.x < LOWERX(bbox)) ||
       (seg[i].start.x > UPPERX(bbox))) {
      /* outside! */
      seg[i].angle = -1;
      continue;
    }
    (*inside)++;

switch(seg[i].angle) {
    case 0:
    case 2:
      {
      /* horizontal or vertical segment */
      /* paint the c-obstacle box for this segment   */
      x0 = C_CEILING(seg[i].start.x - fn_half_width - LOWERX(bbox));
      if(x0 < 0)
         x0 = 0;
      y0 = C_CEILING(seg[i].start.y - fn_half_height - LOWERY(bbox));
      if(y0 < 0)
         y0 = 0;
      x1 = C_FLOOR(seg[i].end.x + fn_half_width - LOWERX(bbox));
      if(x1 > cof_width)
         x1 = cof_width;
      dx = x1 - x0;
      y1 = C_FLOOR(seg[i].end.y + fn_half_height - LOWERY(bbox));
      if(y1 > cof_height)
         y1 = cof_height;
      dy = y1-y0;
      pr_rop(cof_pr, x0, y0, dx, dy,
             PIX_COLOR(bit) | PIX_DST | PIX_SRC | PIX_DONTCLIP, 0, 0, 0);
      }
      break;
    case 1:
      {
      /* The the c-obstacle for a 45 degree segment has the */
      /* following shape */
      /*
```

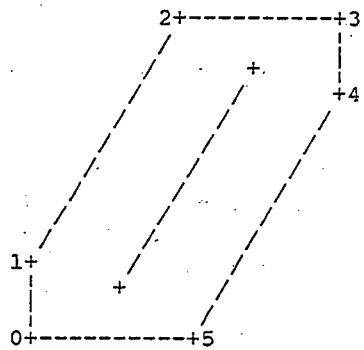

```
         */
  c_obstacle[0].x = C_CEILING(seg[i].start.x - fn_half_width - LOWERX(bbox
));
  c_obstacle[0].y = C_CEILING(seg[i].start.y - fn_half_height - LOWERY(bbo
x));
  c_obstacle[1].x = c_obstacle[0].x;
  c_obstacle[1].y = c_obstacle[0].y + fn_scaled_height;
  c_obstacle[2].x = C_CEILING(seg[i].end.x - fn_half_width - LOWERX(bbox))
;
  c_obstacle[2].y = C_FLOOR(seg[i].end.y + fn_half_height - LOWERY(bbox));
  c_obstacle[3].x = c_obstacle[2].x + C_FLOOR(seg[i].width + fn_width);
  c_obstacle[3].y = c_obstacle[2].y;
  c_obstacle[4].x = c_obstacle[3].x;
  c_obstacle[4].y = c_obstacle[3].y - fn_scaled_height;
  c_obstacle[5].x = c_obstacle[0].x + C_FLOOR(seg[i].width + fn_width);
  c_obstacle[5].y = c_obstacle[0].y;
  npts[0] = 6; /* number of points */
       /* paint with clipping */
  pr_polygon_2(cof_pr, 0, 0, 1, npts, c_obstacle,
          PIX_COLOR(bit) | PIX_SRC | PIX_DST, 0, 0, 0);
     }
     break;
   case 3:
     {
     /* 135 degrees */
     c_obstacle[3].x =
       C_FLOOR(seg[i].end.x + fn_half_width - LOWERX(bbox));
     c_obstacle[3].y =
       C_FLOOR(seg[i].end.y + fn_half_height - LOWERY(bbox));
     c_obstacle[4].x =
       C_FLOOR(seg[i].start.x + fn_half_width - LOWERX(bbox));
     c_obstacle[4].y =
       C_FLOOR(seg[i].start.y + fn_half_height - LOWERY(bbox));
     c_obstacle[5].x = c_obstacle[4].x;
     c_obstacle[5].y = c_obstacle[4].y - fn_scaled_height;
     c_obstacle[0].x = c_obstacle[5].x - C_FLOOR(seg[i].width + fn_half_width
);
     c_obstacle[0].y = c_obstacle[5].y;
     c_obstacle[2].x = c_obstacle[3].x - C_FLOOR(seg[i].width + fn_half_width
);
     c_obstacle[2].y = c_obstacle[3].y;
     c_obstacle[1].x = c_obstacle[2].x;
     c_obstacle[1].y = c_obstacle[2].y - fn_scaled_height;
     npts[0] = 6; /* number of points */
       /* paint with clipping */
     pr_polygon_2(cof_pr, 0, 0, 1, npts, c_obstacle,
           PIX_COLOR(bit) | PIX_SRC , 0, 0, 0);
     }
     break;
   default:
      ads_errno = ADS_ILLEGAL_ANGLE;
      return -1;
     }
   }
   return 0;
}
```

```c
rectangular_transform(bbox, bytes, flags, highest, nseg, seg, byte, bit,
inside)
 POINT *bbox;
int bytes;
int flags;
char highest;
int nseg; /* total number of segments */
Netsegment *seg;
int byte,bit;
int *inside;
{
  register int i, x, y, x0, y0, x1, y1, dp;
  register unsigned char mask = 1 << bit;
  register unsigned char *p;
  *inside = 0;

/* smash 'angle' field to value of -1 if the segment is outside the cof */
  for(i = 0; i < nseg; i++) {
    if((flags & IDS_HIGHEST) && (seg[i].layer != highest))
      continue;
    switch(seg[i].angle) {
    case 0:
    case 2:
      {
      /* horizontal or vertical segment */
      if(((seg[i].end.y) < LOWERY(bbox) ) ||
         ((seg[i].start.y) > UPPERY(bbox)) ||
         (seg[i].end.x < LOWERX(bbox)) ||
         (seg[i].start.x > UPPERX(bbox))) {
        /* outside! */
        seg[i].angle = -1;
        continue;
      }
      (*inside)++;

/* "paint" the c-obstacle for this segment */ x0 = C_CEILING(seg[i].start.x - fn_half_width - LOWERX(bbox));
      if(x0 < 0)
        x0 = 0;
      y0 = C_CEILING(seg[i].start.y - fn_half_height - LOWERY(bbox));
      if(y0 < 0)
        y0 = 0;
      x1 = C_FLOOR(seg[i].end.x + fn_half_width - LOWERX(bbox));
      if(x1 > cof_width)
        x1 = cof_width;
      y1 = C_FLOOR(seg[i].end.y + fn_half_height - LOWERY(bbox));
      if(y1 > cof_height)
        y1 = cof_height;

/* ugly but efficient.  Yere, yere--life sucks to read this */
      p = (unsigned char*)cof+(((y0 * cof_width) + x0) * bytes)+byte;
      dp = (cof_width - x1 + x0) * bytes;
      for(y=y1-y0; --y >= 0 ; p += dp) { for(x=x1-x0; --x >= 0 ;p += bytes) {
          (*p) |= mask;
        }
      }
      }
      break;
    case 1:
    case 3:
      fprintf(stderr,"c_obstacle_transform: 45-degree line\n");
      break;
    default:
      ads_errno = ADS_ILLEGAL_ANGLE;
      return -1;
    }
  }
  return 0;
}
```

I claim:

1. In a system comprising means for supporting an IC device having multiple physical layers and multiple internal nets, and controllable positioning means for positioning a field of view relative to the device, a method of positioning the field of view relative to the device such that multiple, selected nets of the device are within the field of view, comprising the steps of:
   a. preparing a processed data set which (1) describes each physical layer of the device as a plurality of reduced polygons, each reduced polygon having dimensions at least as great as a predetermined minimum feature dimension, and (2) associates each of the reduced polygons with a physical layer of the device and with at least one net of the device;
   b. for each selected net, preparing a transformed data set which describes a plurality of dilated polygons associated with the selected net, each dilated polygon defining the periphery of a region encompassed by the field of view when a point within the field of view is traced around the periphery of a reduced polygon;
   c. mapping a bit plane for each selected net, each mapped bit plane defining the two-dimensional extent of dilated polygons associated with the selected net;
   d. identifying any two-dimensional overlap regions over which a plurality of the dilated polygons defined by the bit planes overlap one another; and
   e. if at least one said overlap region is identified, controlling said controllable positioning means to position the field of view relative to said device at a location which corresponds to at least one said overlap region.

2. The method of claim 1, wherein said step of preparing a processed data set comprises the steps of: retrieving a stored data set which describes each physical layer of the device as a plurality of layout polygons, at least one of said layout polygons being a concave polygon; and dividing each concave layout polygon into a plurality of convex reduced polygons.

3. The method of claim 1, wherein said step of preparing a processed data set comprises the steps of: retrieving a stored data set which describes each physical layer of the device as a plurality of layout polygons, at least one of said layout polygons being a complex polygon; and reducing each complex layout polygon to a plurality of trapezoids to thereby produce said reduced polygons.

4. The method of claim 1, wherein said step of preparing a processed data set comprises the steps of: retrieving a stored data set which describes each physical layer of the device as a plurality of layout polygons, at least one of said layout polygons being a complex polygons; and approximating each complex layout polygon as a plurality of rectangles to thereby produce said reduced polygons.

5. The method of claim 1, wherein said step of preparing a processed data set further comprises the steps of: retrieving a stored data set which describes each physical layer of the device as a plurality of layout polygons; identifying portions of the layout polygons describing one physical layer of the device which are not occluded by layout polygons describing another physical layer of the device; and modifying the description of said layout polygons to include only said identified portions to thereby produce said reduced polygons.

6. The method of claim 1, wherein said step of preparing a processed data set further comprises the steps of:
   i. retrieving a stored data set which describes each physical layer of the device as a plurality of layout polygons;
   ii. reducing said layout polygons by approximating the layout polygons as a plurality of simple trapezoids, each simple trapezoid being associated with a physical layer of the device;
   iii. expanding each simple trapezoid associated with a first physical layer of the device by a predetermined minimum separation distance to thereby produce an expanded trapezoid;
   iv. identifying portions of the trapezoids associated with a second physical layer of the device which are not occluded by the expanded trapezoids of said first physical layer; and
   v. modifying the description of said trapezoids associated with the second physical layer of the device to include only said identified portions to thereby define a plurality of said reduced polygons.

7. The method of claim 6, wherein said step of preparing a processed data set further comprises the steps of:
   vi. expanding each simple trapezoid associated with the second physical layer of the device by a predetermined minimum separation distance to thereby produce an expanded trapezoid;
   vii. identifying portions of the trapezoids associated with a third physical layer of the device which are not occluded by the expanded trapezoids of the second physical layer; and
   v. modifying the description of said trapezoids associated with the third physical layer of the device to include only said identified portions to thereby define a plurality of said reduced polygons.

8. The method of claim 1, wherein said step of preparing a processed data set further comprises the steps of: retrieving a stored data set which describes each physical layer of the device as a plurality of layout polygons; and approximating each complex layout polygon as a plurality of fixed-width lines representing said reduced polygons.

9. The method of claim 1, wherein said step of preparing a processed data set comprises the steps of:
   i. retrieving a stored data set which describes each physical layer of the device as a plurality of layout polygons;
   ii. approximating the layout polygons as trapezoids; and
   iii. associating each of the trapezoids with a physical layer of the device and with a net of the device.

10. The method of claim 9, wherein said step of preparing a processed data set further comprises the step of calculating at least one bounding box for each net.

11. The method of claim 9, wherein said step of preparing a processed data set further comprises the step of, for at least one net having associated trapezoids which are also associated with multiple layers of the device, deleting at least one trapezoid associated with a lower layer of the device and retaining at least one trapezoid associated with an upper layer of the device, whereby the trapezoids which are retained comprise said plurality of reduced polygons.

12. The method of claim 1, wherein said step of preparing a transformed data set comprises the steps of:
   i. identifying a bounding box for each selected net;
   ii. defining a bounding region corresponding to the union of the bounding boxes of the selected nets; and iii. for each selected net, dilating the reduced polygons which are located within the bounding region and which are associated with the net, to thereby produce a plurality of dilated polygons.

13. The method of claim 1, wherein said step of mapping a bit plane for each selected net comprises the steps of:

i. setting a bit of the bit plane to a first value for each coordinate position of the bit plane which lies with the extent of a dilated polygon associated with the net; and ii. setting a bit of the bit plane to a second value for each coordinate position of the bit plane which lies outside the extent of the dilated polygon associated with the net.

14. The method of claim 13, wherein said step of identifying at least one two-dimensional overlap region comprises the steps of:

i. preparing a binary word for each coordinate position of the bit planes, the binary word comprising one bit from each bit plane; and ii. examining said binary words to identify said at least one two-dimensional overlap region.

15. The method of claim 13, wherein said step of identifying at least one two-dimensional overlap region comprises the steps of:

i. assigning to each bit plane a respective bit position of a binary word, the assigned bit position being determined by an ordered priority of the selected nets;

ii. preparing a binary word for each coordinate position of the bit planes, the binary word comprising one bit from each bit plane and the bits of the binary word being ordered in accordance with the assigned bit positions; and iii. evaluating said binary words to identify said at least one two-dimensional overlap region.

16. The method of claim 1, wherein said system further includes second controllable means for positioning a focus point within the field of view, the method further comprising the step of:

f. controlling said second controllable means to position the focus point at a plurality of said selected nets of the device within the positioned field of view.

17. The method of claim 1, wherein said system further includes second controllable means for positioning a focus point within the field of view, the method further comprising the steps of:

f. identifying a portion of a selected net at which the focus point is to be positioned, such that said portion is spaced apart from neighboring nets of the device by a minimum separation distance; and g. controlling said second controllable means to position the focus point at said identified portion of a net.

18. The method of claim 17, wherein said step of identifying a portion of a net at which the focus point is to be positioned comprises the steps of:

i. expanding each polygon lying within the field of view to produce a respective expanded polygon;

ii. identifying regions of overlap of the expanded polygons;

iii. identifying portions of a net at which the focus point is to be positioned, such that said portions are furthest separated from said regions of overlap.

19. The method of claim 1, further comprising the step of repetitively performing steps b.–d. for varying field of view dimensions to determine a minimum field of view dimension for which the field of view can be positioned such that the selected nets are within the field of view.

20. The method of claim 1, wherein the field of view of said system is of adjustable dimension, the method further comprising the steps of:

i. calculating a bounding box for each selected net;

ii. determining whether bounding boxes for the selected nets contain any zones of mutual overlap;

iii. if the bounding boxes for the selected nets contain at least one zone of mutual overlap, selecting an initial field of view dimension prior to commencing step b.;

iv. performing steps b.–d. to identify any of said overlap regions;

v. if at least one said overlap region is identified in step iv., iteratively decreasing the field of view dimension and repeating steps b.–d. to determine a minimum field of view dimension for which the field of view can be positioned such that the selected nets are within the field of view; and vi. if no said overlap region is identified in step iv., iteratively increasing the field of view dimension and repeating steps b.–d. to determine a minimum field of view dimension for which the field of view can be positioned such that the selected nets are within the field of view.

21. Apparatus, comprising:

a. means for supporting an IC device having multiple physical layers and multiple internal nets;

b. means defining a field of view;

c. controllable positioning means for positioning the field of view relative to the device; and d. means for controlling said controllable positioning means to position the field of view relative to the device such that selected nets of the device are within the field of view, comprising:

i. means for preparing a processed data set which (1) describes each physical layer of the device as a plurality of reduced polygons, each reduced polygon having dimensions at least as great as a predetermined minimum feature dimension, and (2) associates each of the reduced polygons with a physical layer of the device and with at least one net of the device;

ii. means for preparing a transformed data set which describes a plurality of dilated polygons associated with each selected net, each dilated polygon defining the periphery of a region lying within the field of view when a point within the field of view is traced around the periphery of a reduced polygon;

iii. means for mapping a bit plane for each selected net, each mapped bit plane defining the two-dimensional extent of dilated polygons associated with the net;

iv. means for identifying at least one two-dimensional overlap region over which a plurality of the dilated polygons defined by the bit planes overlap one another; and v. means for controlling said controllable positioning means to position the field of view relative to said device at a location which corresponds to at least one said overlap region.

22. The apparatus of claim 21, wherein said means for preparing a processed data set comprises: means for retrieving a stored data set which describes each physical layer of the device as a plurality of layout polygons, at least one of said layout polygons being a concave polygon; and means for dividing each concave layout polygon into a plurality of convex reduced polygons.

23. The apparatus of claim 21, wherein said means for preparing a processed data set comprises: means for retrieving a stored data set which describes each physical layer of the device as a plurality of layout polygons, at least one of said layout polygons being a complex polygon; and means for reducing each complex layout polygon to a plurality of trapezoids to thereby produce said reduced polygons.

24. The apparatus of claim 21, wherein said means for preparing a processed data set comprises: means for retrieving a stored data set which describes each physical layer of the device as a plurality of layout polygons, at least one of said layout polygons being a complex polygon; and means for approximating each complex layout polygon as a plurality of rectangles to thereby produce said reduced polygons.

25. The apparatus of claim 21, wherein said means for preparing a processed data set further comprises: means for retrieving a stored data set which describes each physical layer of the device as a plurality of layout polygons; means for identifying portions of the layout polygons describing one physical layer of the device which are not occluded by layout polygons describing another physical layer of the device; and means for modifying the description of said layout polygons to include only said identified portions to thereby produce said reduced polygons.

26. The apparatus of claim 21, wherein said means for preparing a processed data set further comprises:
i. means for retrieving a stored data set which describes each physical layer of the device as a plurality of layout polygons;
ii. means for reducing said layout polygons by approximating the layout polygons as a plurality of simple trapezoids, each simple trapezoid being associated with a physical layer of the device;
iii. means for expanding each simple trapezoid associated with a first physical layer of the device by a predetermined minimum separation distance to thereby produce an expanded trapezoid;
iv. means for identifying portions of the trapezoids associated with a second physical layer of the device which are not occluded by the expanded trapezoids of said first physical layer; and
v. means for modifying the description of said trapezoids associated with the second physical layer of the device to include only said identified portions to thereby define a plurality of said reduced polygons.

27. The apparatus of claim 26, wherein said means for preparing a processed data set further comprises:
vi. means for expanding each simple trapezoid associated with the second physical layer of the device by a predetermined minimum separation distance to thereby produce an expanded trapezoid;
vii. means for identifying portions of the trapezoids associated with a third physical layer of the device which are not occluded by the expanded trapezoids of the second physical layer; and
v. means for modifying the description of said trapezoids associated with the third physical layer of the device to include only said identified portions to thereby define a plurality of said reduced polygons.

28. The apparatus of claim 21, wherein said means for preparing a processed data set further comprises: means for retrieving a stored data set which describes each physical layer of the device as a plurality of layout polygons; and means for approximating each complex layout polygon as a plurality of fixed-width lines representing said reduced polygons.

29. The apparatus of claim 21, wherein said means for preparing a processed data set further comprises:
i. means for retrieving a stored data set which describes each physical layer of the device as a plurality of layout polygons;
ii. means for approximating the layout polygons as trapezoids; and
iii. means for associating each of the trapezoids with a physical layer of the device and with a net of the device.

30. The apparatus of claim 29, wherein said means for preparing a processed data set further comprises means for calculating a bounding box for each net.

31. The apparatus of claim 29, wherein said means for preparing a processed data set further comprises means, for at least one net having associated trapezoids which are also associated with multiple layers of the device, for deleting at least one trapezoid associated with a lower layer of the device and retaining at least one trapezoid associated with an upper layer of the device, whereby the trapezoids which are retained comprise said plurality of reduced polygons.

32. The apparatus of claim 21, wherein said means for preparing a transformed data set comprises:
i. means for defining a bounding box for each selected net;
ii. means for defining a bounding region corresponding to the union of the bounding boxes of the selected nets; and
iii. means for dilating, for each selected net, the reduced polygons which are located within the bounding region and which are associated with the net, to thereby produce a plurality of dilated polygons.

33. The apparatus of claim 21, wherein said means for mapping a bit plane for each selected net comprises:
i. means for setting a bit of the bit plane to a first value for each coordinate position of the bit plane which lies with the extent of a dilated polygon associated with the net; and
ii. means for setting a bit of the bit plane to a second value for each coordinate position of the bit plane which lies outside the extent of the dilated polygon associated with the net.

34. The apparatus of claim 33, wherein said means for identifying at least one two-dimensional overlap region comprises:
i. means for preparing a binary word for each coordinate position of the bit planes, the binary word comprising one bit from each bit plane; and
iii. means for examining said binary words to identify said at least one two-dimensional overlap region.

35. The apparatus of claim 34, wherein said means for identifying at least one two-dimensional overlap region comprises:

i. means for assigning to each bit plane a respective bit position of a binary word, the assigned bit position being determined by an ordered priority of the selected nets;
ii. means for preparing a binary word for each coordinate position of the bit planes, the binary word comprising one bit from each bit plane and the bits of the binary word being ordered in accordance with the assigned bit positions; and
iii. means for evaluating said binary words to identify said at least one two-dimensional overlap region.

36. The apparatus of claim 21, further comprising:
e. second controllable positioning means for positioning a focus point within the field of view; and
f. means for controlling said second controllable positioning means to successively position the focus point at a plurality of said selected nets of the device within the positioned field of view.

37. The apparatus of claim 21, further comprising:
e. second controllable positioning means for positioning a focus point within the field of view;
f. means for identifying a portion of a selected net at which the focus point is to be positioned, such that said portion is spaced apart from neighboring nets of the device by a minimum separation distance; and
g. means for controlling said second controllable positioning means to position the focus point at said identified portion of a selected net.

38. The apparatus of claim 37, wherein said means for identifying a portion of a selected net comprises:
i. means for expanding each polygon lying within the field of view to produce a respective expanded polygon;
ii. means for identifying regions of overlap of the expanded polygons;
iii. means for identifying portions of a selected net which are separated from said regions of overlap of the expanded polygons by a minimum separation distance.

39. The apparatus of claim 21, wherein said field of view is adjustable to define a field of view of variable dimension, and further comprising means for determining a minimum field of view dimension for which the field of view can be positioned such that the selected nets are within the field of view.

* * * * *